United States Patent
Ouellet et al.

(10) Patent No.: US 7,291,513 B2
(45) Date of Patent: Nov. 6, 2007

(54) HERMETIC WAFER-LEVEL PACKAGING FOR MEMS DEVICES WITH LOW-TEMPERATURE METALLURGY

(75) Inventors: Luc Ouellet, Granby (CA); Karine Turcotte, Montreal (CA)

(73) Assignee: DALSA Semiconductor Inc., Waterloo, ON (CA)

( * ) Notice: Subject to any disclaimer, the term of this patent is extended or adjusted under 35 U.S.C. 154(b) by 0 days.

(21) Appl. No.: 11/004,973

(22) Filed: Dec. 7, 2004

(65) Prior Publication Data

US 2005/0142685 A1    Jun. 30, 2005

Related U.S. Application Data

(60) Provisional application No. 60/529,081, filed on Dec. 15, 2003.

(51) Int. Cl.
*H01L 21/00* (2006.01)
(52) U.S. Cl. .................. 438/64; 438/119; 438/124; 438/127; 438/456; 257/E23.128
(58) Field of Classification Search .............. 438/51, 438/118, 119, 455; 216/33; 148/DIG. 12
See application file for complete search history.

(56) References Cited

U.S. PATENT DOCUMENTS

| | | | | |
|---|---|---|---|---|
| 6,046,074 A | * | 4/2000 | McHerron et al. | 438/119 |
| 6,303,977 B1 | * | 10/2001 | Schroen et al. | 257/635 |
| 6,479,320 B1 | * | 11/2002 | Gooch | 438/109 |
| 6,846,725 B2 | * | 1/2005 | Nagarajan et al. | 438/456 |
| 2002/0113296 A1 | | 8/2002 | Cho et al. | |
| 2003/0132493 A1 | | 7/2003 | Kang et al. | |
| 2003/0151479 A1 | * | 8/2003 | Stafford et al. | 335/78 |
| 2003/0183920 A1 | * | 10/2003 | Goodrich et al. | 257/701 |
| 2004/0219764 A1 | * | 11/2004 | Syllaios et al. | 438/456 |
| 2005/0009246 A1 | * | 1/2005 | Enquist et al. | 438/127 |
| 2005/0042839 A1 | * | 2/2005 | Syllaios et al. | 438/456 |

FOREIGN PATENT DOCUMENTS

EP    0 886 144    12/1998

(Continued)

OTHER PUBLICATIONS

Schjolberg-Henriksen K et al "Sodium Contamination in integrated MEMS packaged by anodic bonding" Proceedings of the IEEE 16th Annual International Conference on Microelectro Mechanical Systems MEMS 2003 Kyoto, Japan Jan. 19-23, 2003 vol. CONF, 16.

(Continued)

*Primary Examiner*—George R. Fourson
*Assistant Examiner*—John M. Parker
(74) *Attorney, Agent, or Firm*—Marks & Clerk; Richard J. Mitchell

(57) ABSTRACT

A method is disclosed for making a wafer-level package for a plurality of MEMS devices. The method involves preparing a MEMS wafer and a lid wafer, each having respective bonding structures. The lid and MEMS wafers are then bonded together through the bonding structures. The wafers are substantially free of alkali metals and/or chlorine. IN a preferred embodiment, each wafer has a seed layer, a structural underlayer and an anti-oxidation layer. A solder layer, normally formed on the lid wafer, bonds the two wafers together.

22 Claims, 37 Drawing Sheets

FOREIGN PATENT DOCUMENTS

| | | |
|---|---|---|
| EP | 0 962 275 | 12/1999 |
| EP | 1 405 821 | 4/2004 |
| WO | WO 02/42716 A2 * | 5/2002 |

OTHER PUBLICATIONS

Rogge, B et al "Solder-bonded Micromachined Capacitive Pressure sensors" Proceedings of the SPIE, Micromachined Devices and Components IV, Sep. 21-22, 1998 Santa Clara, CA USA vol. 3514, 1998.

Lugscheider E et al "Deposition of solder for micro-joining on MEMS components by means of magnetron sputtering" Surface & Coatints Technology, Elsevier, vol. 142-144, Jul. 2001.

Goyal A et al "Solder bonding for microelectromechanical systems (MEMS) applications" Proceedings of the SPIE, reliability, testing and characterization of MEMS/MOEMS II, Jan. 27-29, 2003 San Jose, CA, USA.

Seong-A Kim et al "Closed loop solder-lines on heated substrates" Proceedings of the 52nd Electronic Components and Technology Conference, ECTC 2002 San Diego, CA May 28-31, 2002.

* cited by examiner

Figure 3

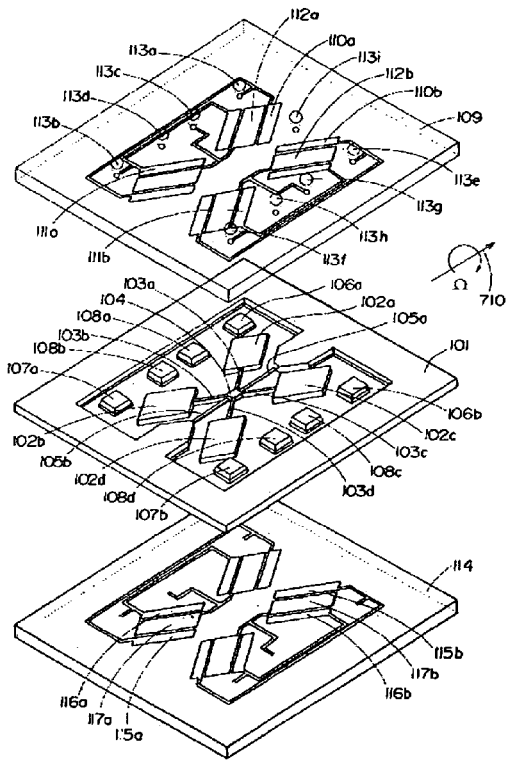

| Description of the Reference Numerals | |
|---|---|
| 101, 301, 602, 1101, 1201 | Silicon substrate |
| 109, 401, 601 | Upper glass |
| 114, 501, 604 | Lower glass |
| 102a, 102b, 102c, 102d, 316, 701, 901, 1001, 1004, 1213 | Mass |
| 702, 103a, 103b, 103c, 103d, 317, 902, 1005, 1212 | Cantilever beam |
| 104 | Coupling portion |
| 105a, 105b, 318b, 1002, 1211 | Bridge |
| 1104c, 106a, 106b, 107a, 107b, 108a, 108b, 108c, 108d, 1104a, 1104b, 1104d, 1104e, 1104f | Feedthrough island |
| 110a, 110b, 115a, 115b, 703, 903 | Driving electrode |
| 111a, 111b, 116a, 116b, 705, 905 | Monitoring electrode |
| 112a, 112b, 117a, 117b, 704, 904 | Detection/control electrode |
| 113f, 113a, 113b, 113c, 113d, 113e, 113g, 113h, 113i, 402 | Glass through hole |
| 1103d, 1007, 1103a, 1103b, 1103c, 1103e, 1103f | Silicon through hole |
| 1003, 1006, 1102a, 1102b, 1214 | diffused resistor layer |
| 607 | Wiring |
| 1401, 1402 | Detecting element |
| 1403, 1404 | Oscillating element |

200 Optical switch
204 Actuating electrode
208 Suspended membrane
206 Spacers
226 Electrodes
210 Mirror surface
216 Pull down electrodes
224 Fiber cladding
228 Trench 40: First substrate
41: Released layer
46: Hinge pattern
47: Mirror pattern
50: Second substrate
52: Wiring pattern
53: Insulation layer
54: Electrodes
65: Support structure
68: Pb-Sn solder
69: Pb-Sn solder

Tin Whiskers

Figure 15
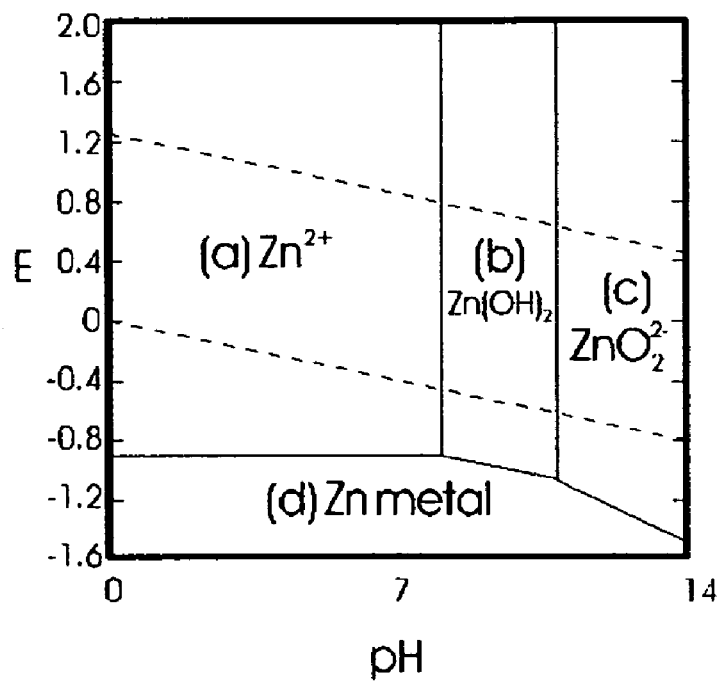
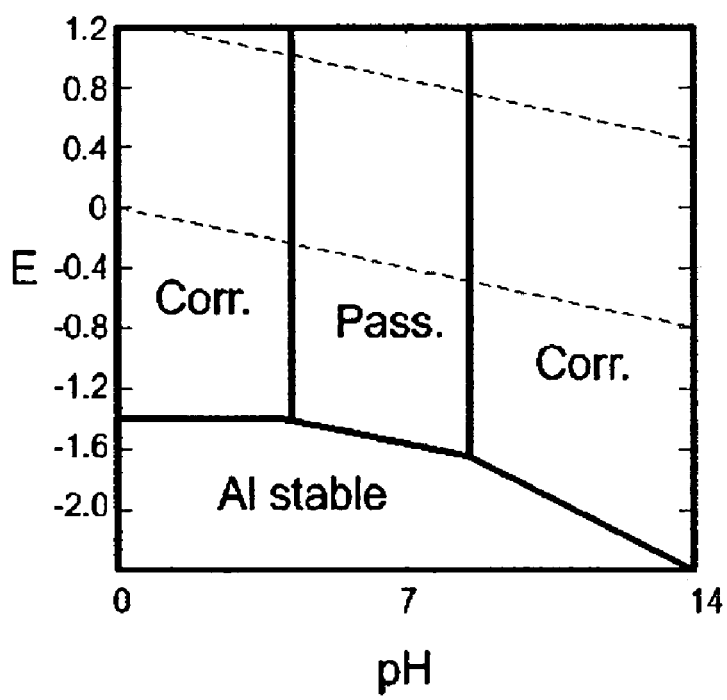

US 7,291,513 B2

HERMETIC WAFER-LEVEL PACKAGING FOR MEMS DEVICES WITH LOW-TEMPERATURE METALLURGY

CROSS REFERENCE TO RELATED APPLICATION

This application claims the benefit under 35 USC 119(e) of U.S. provisional application No. 60/529,081 filed on Dec. 15, 2003.

FIELD OF THE INVENTION

This invention relates to the field of Micro-Electro-Mechanical-Systems (MEMS), and in particular to a novel method of making wafer-level package for MEMS devices forming a sealed and hermetic micro-cavity over each individual MEMS device.

BACKGROUND OF THE INVENTION

The manufacture of Micro-Electro-Mechanical-Systems (MEMS), such as micro-gyroscopes, micro-accelerometers, resonant accelerometers, micro-mirrors, micro-motors, micro-actuators and other such micro-devices integrating at least one moving and/or particular component creates a very serious challenge for packaging for several reasons. The vast majority of MEMS-based devices require the encapsulation to be done before dicing, for protection against micro-contamination from particles and dicing slurry while being processed like a standard semiconductor chip, without the need for dedicated equipment or processes for dicing, mounting and molding procedures. Most MEMS-based resonant accelerometers, most MEMS-based RF switching devices and other such MEMS devices have Q-factors influenced by the operating pressure and then require a sealed package to ensure repeatable operating pressure. Changes in atmospheric conditions can also change the capacitance readout of micro-gyroscopes and micro-accelerometers without any rotation or acceleration. Increased relative humidity can increase the "stiction" and block the operation of moving mechanical parts.

A sealed package for encapsulating the moving and/or particular components in vacuum or in a controlled atmosphere in a sealed protection micro-cavity is thus necessary to ensure reliable operation. This micro-cavity is typically fabricated using microelectronic fabrication technologies so as to produce, on the wafer itself, a hermetic wafer-level package over each one of the various MEMS devices present on the wafer. Various approaches have been proposed to generate such a sealed wafer-level package, of which only a few allow a hermetic package. All references discussed below are incorporated herein by reference.

Wafer-level packaging of MEMS devices require the bonding of a so called "Lid wafer" to a so called "MEMS wafer" to form a sealed micro-cavity over each individual MEMS device of the "MEMS wafer". Since the vacuum level or pre-set pressure in each micro-cavity must be maintained in the field for about 10 years, it is necessary to use sealing techniques and materials capable of preventing gas permeation from the external world to the interior of these micro-cavities. These requirements are similar to the ones required for sealing ultra-high vacuum systems.

FIG. 1 shows the permeability rates of classes of materials, going from the very poor materials (silicones and epoxies) to the ultra-high vacuum materials (metals). These generic curves show that glasses typically have about 1000 times the permeation rate of metals. This means that: the gaseous permeation through a 1 square meter of sheet metal of a given thickness is equivalent to the permeation rate of about 1 square millimeter of sheet glass of the same thickness. A given surface of sealing metal can be about 30 times thinner than the same surface of sealing glass and provide the same sealing performance against gaseous permeation (permeation is a diffusion mechanism following the square root function of the diffusion equation). A given thickness of sealing metal will provide 30 times longer life than the same thickness of sealing glass. For this reason, metal sealing techniques are generally preferred over glass sealing techniques.

The hermetic wafer-level packages should use the very low permeability characteristics of metal sealing materials for the wafer-level package to have a minimum gaseous permeation.

A first example of protective packaging is provided in FIG. 2 taken from the following cited Prior Art references: U.S. Pat. No. 5,323,051 titled 'Semiconductor wafer level package'; U.S. Pat. No. 6,465,281 titled 'Method of manufacturing a semiconductor wafer level package'; and Gary Li, Ampere A. Tseng, 'Low stress packaging of a micromachined accelerometer', IEEE Transactions on electronics packaging manufacturing, Vol. 24, No. 1, January 2001.

This wafer-level packaging technique involves the use of a frit glass, such as: EG9251 manufactured by Ferro Corporation; CF-8 manufactured by Nippon Electric Glass Co. Ltd; VIOX Glass No. 24925 manufactured by VIOX Corporation; and VIOX Glass No. 24927 manufactured by VIOX Corporation.

These flit glasses are typically deposited on the "Lid wafer" using a slurry comprising a mixture of organic binder, solvent, and a frit glass containing filler, deposited through a silk screen. Following printing and heating to a high enough temperature to volatilize the organic and organic materials of this slurry, the "Lid wafer" and the "MEMS wafer" are contacted and pressed together and exposed to high enough temperature (less than 550° C., preferably about 300° C.-475° C.) to exceed the softening point of the frit glass material and allow the thermo-compression bonding of the two wafers.

The two main challenges associated with this wafer-level packaging are, first, the induced mechanical stress in the MEMS devices of the "MEMS wafer" due to the mismatch of the thermal expansion coefficients of the materials of this wafer-level package which are exposed to the high temperatures used to reach the softening point of the frit glass and, second, the slow gas permeation and micro-porosity of the obtained frit material which result in a slow contamination of the sealed micro-cavity with hydrogen and water vapor. A wafer-level packaging process capable of producing a hermetic seal at temperatures lower than about 300° C. is preferred to minimize these induced mechanical stresses in the MEMS devices of the "MEMS wafer" and to ensure a stable gas composition in the sealed micro-cavity.

A second example of protective packaging is shown in FIG. 3 taken from the following cited Prior Art reference: U.S. Pat. No. 5,952,572 titled 'Angular rate sensor and acceleration sensor' (Matsushita Electric Industrial Co., Ltd.).

This technique requires the sodium atoms of a sodium-based silica glass (such as Corning Glass' Pyrex™ 7740) to be diffused at a temperature of about 300-450° C. and under a high electrical field created by a negative voltage of about 1000-2000V applied between the silicon substrate and the Pyrex™ substrate as to allow sodium displacement of the silicon atoms of the substrate and the anodic bonding of the Pyrex™ substrate to the silicon wafer. The anodic bonding temperature is not that lower than the one used for glass frit bonding and does not prevent the induced mechanical stresses in the MEMS devices of the "MEMS wafer". Moreover, the sodium is an undesirable mobile ion inducing undesirable threshold voltage shifts of CMOS and high-voltage CMOS devices as well as dark-current issues in CCD devices.

The seed layer of "MEMS wafers" is typically the last electrically conductive layer deposited on the "MEMS wafer" and may either be a doped silicon layer or a metal layer.

The nickel under-layer structure of a wafer-level package can be made using electrolytic plating technologies to create the nickel under-layer structures of sealing rings on the "MEMS wafer" (around each individual die) and a symmetrical sealing rings on the "Lid wafer". These two symmetrical nickel-based sealing rings allow the soldering of the "MEMS wafer" to the "Lid wafer" using a whisker-free solder (following proper alignment and physical contact of the symmetrical structures of the two wafers).

The main advantages of electrolytic plating of nickel under-layer structures are: accurate, low-cost, easy, and quick process; low-temperature process, compatible with the thermal budgets required to produce MEMS structures over CMOS and HV-CMOS devices; high aspect ratio under-layer structures when electroplated through very thick (10 μm to 1 mm) and narrow (one micron to a few microns) openings created using high-sensitivity photo-sensitive polymer exposed and developed with standard UV lithography and used as mold (a technique also called electroforming).

The following Prior Art references describe an example of electrolytic plating of nickel structures used in MEMS applications: Hsin-chih Tim Yeh, "Fabrication and cooling test of high-aspect ratio electroplated micro-channels", Master of Science in mechanical engineering, University of California Los Angeles, 1998; U.S. Pat. No. 6,411,754 titled 'Micromechanical optical switch and method of manufacture'.

FIG. 4 is taken from U.S. Pat. No. 6,411,754 to Corning Incorporated and shows a MEMS-based photonics mirror obtained from electrolytic plating of nickel over a 0.5 μm thick evaporated copper seed layer and into a mold as to form an integral electrode structure. This 6 μm thick nickel layer is plated from a nickel sulfate solution at about 45° C.

In order to understand the limitations of nickel electrolytic plating for the formation of nickel under-structures, it is necessary to explain the basic principles of electrolytic plating. FIG. 5 is a sketch of a typical electrolytic plating set-up, called an electrolytic cell, where the MEMS wafer (or Lid wafer) is immersed in an electroplating solution to plate the electrolytic nickel under-structures. The anode provides the source of nickel and the chemical solution provides the cathode. The $Ni^{2+}$ ions are neutralized by the electrons at the surface of the wafer.

This MEMS wafer (or Lid wafer) is connected to a negative potential relative to a positive electrode typically consisted of the electroplating nickel metal anode that is also immersed in the plating solution. If sufficient bias is imposed between the two electrodes, electrons will flow through the power supply from the anode (the nickel electrode) to the cathode (the surface of exposed conductor of the wafer in contact with the plating solution). Near the cathode, a reduction reaction (gain of electron) occurs, resulting in the plating of a nickel under-structure onto the exposed surface:

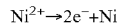
$$Ni^{2+} \rightarrow 2e^- + Ni$$

This reduction mechanism requires an electrical current to be continuously supplied to the growing nickel under-structure so as to neutralize, at the surface, the incoming $Ni^{2+}$ ions supplied by the plating solution.

On the other hand, inside the electroplating solution, the current is conducted by the flow of positive ions and an oxidation reaction (loss of electrons) occurs near the nickel anode:

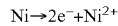
$$Ni \rightarrow 2e^- + Ni^{2+}$$

where the nickel atoms of the anode are dissolved into the plating solution. This reaction supplied the two electrons flowing into the power supply and the nickel ion migrating into the solution toward the wafer cathode. The supplied current controls the neutralization rate and then the flow of migrating nickel ions, i.e. the electrolytic plating rate.

Some hydrogen reduction also occurS near the wafer (cathode) surface:

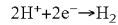
$$2H^+ + 2e^- \rightarrow H_2$$

This hydrogen reduction reaction competes with the nickel deposition and should be avoided. An excess amount of hydrogen also deteriorates the quality of plated nickel.

Since the electrolytic plating of nickel under-structures requires the neutralization surfaces to be electrically connected to the power supply, an electrically isolated surface will not be plated. This simple mechanism allows the selective electrolytic plating of nickel under-structures over electrically conductive surfaces exposed through openings in dielectrics, such as photoresists.

FIG. 6 shows an example of electroplating process resulting in the selective formation of nickel under-structures through a polymer pattern on a flat surface wafer. The process consists of the following steps:
1: Provision of a MEMS device
2: Sacrificial layer deposition
3: Structural layer deposition
4: Continuous unbroken seed layer deposition
5: Polymer deposition, exposure, development
6: Selective nickel electrolytic plating over the continuous and unbroken seed layer in exposed regions of the polymer pattern,
7: Removal of patterned polymer in an oxygen-containing ambient (resulting in undesirable nickel oxidation)
8: Removal of the continuous and unbroken seed layer in the regions previously coated by the polymer (resulting in undesirable undercut due to the need to ensure complete elimination of the electrically conductive seed layer between the nickel patterns)

In order to selectively plate the nickel under-structures in all exposed openings of the polymer, it is necessary to electrically shunt these exposed surfaces using a "continuous and unbroken seed layer" which allows the continuous neutralization of the impinging $Ni^{2+}$ ions on these exposed surfaces. Following electrolytic plating and polymer removal in an oxygen-containing ambient (resulting in undesirable surface oxidation of the nickel under-structures and uncontrolled soldering, a situation to be addressed later in the disclosure of this invention) this electrical shunt "continuous and unbroken seed layer" has to be removed; otherwise it would result in electrically shorted nickel under-structures. This removal is relatively simple if a selective etch can remove this "continuous and unbroken seed layer"

from the areas previously coated with the polymer without attacking the plated nickel under-structures. The complete removal of this "unbroken and continuous seed layer" from the areas previously coated with the polymer is not obvious on the non-flat surface of an advanced MEMS wafer already presenting high aspect ratio structures and topography.

FIG. 7 shows an example of an electroplating process over the non-flat surface of an advanced MEMS wafer presenting high aspect-ratio structures and topography. This process consists of the following steps:
1: Provision of MEMS substrate
2: Sacrificial layer deposition and patterning to open structural layer anchors to substrate
3: Structural layer deposition and patterning
4: Continuous and unbroken seed layer deposition (difficult seed layer coverage on the sidewalls of topography: More topography means worse coverage and poorer local electrical conductivity)
5: Polymer deposition, exposure, develop (difficult to fill high aspect ratio regions with polymer where a minimum gap is present between two adjacent surfaces of the continuous and unbroken seed layer, thus resulting in potential undesirable loss of adhesion of polymer and undesirable plating)
6: Selective nickel electrolytic plating over the continuous and unbroken seed layer in exposed regions of the polymer pattern
7: Removal of patterned polymer in an oxygen-containing ambient (thus resulting in undesirable nickel oxidation)
8: Removal of exposed continuous and unbroken seed layer in the region previously coated by the polymer (thus resulting in undesirable undercut due to the need to ensure complete elimination of this electrically conductive seed layer between the nickel patterns)
9: Mechanical release of the suspended structures by removal of the sacrificial layer (Very little remaining seed layer in the anchors region combined with the need to have this remaining seed layer resisting the chemicals used for this mechanical release)

In this case, the sacrificial layer is patterned such as to create openings or anchors of the nickel under-structures to the substrate (or to any other non-sacrificial layer) and as to later allow the mechanical release of non-anchored structures. Advanced MEMS use thicker and narrower suspended structures and multi-level structures with smaller spacings as to enhance electrostatic sensing and actuation. This means that the "continuous and unbroken seed layer" is to be deposited as thin as possible (as to minimize the undercut resulting from its local removal later in the process) on increasingly complex high aspect ratio structures. The need to maintain good coverage of the "continuous and unbroken seed layer" on the sidewall of these increasing aspect ratio structures (as to provide the electrical conductivity needed to sustain the electrolytic plating of the nickel under-structures) while minimizing the thickness of the "continuous and unbroken seed layer" under the anchored structures (as to prevent excessive undercut) and while ensuring an absolute elimination of the "continuous and unbroken seed layer" in the deeper-and-narrower trenches located between electrically isolated nickel under-structures following polymer removal, dictates that the electrolytic nickel plating technique using a seed layer has limited applications in the manufacturing of advanced MEMS devices.

It is clear that the electrolytic plating of nickel under-structures is undesirable for advanced MEMS devices and for their wafer-level packages because the use of a seed layer is undesirable for these advances MEMS devices.

SUMMARY OF THE INVENTION

The present invention relates to a new technique and metallurgy for producing hermetically sealed micro-cavities between the "Lid wafer" and the "MEMS wafer" so as to control the micro-environment around the MEMS devices. This new technique is compatible with the low-temperature requirements of all known wafer-level packages for MEMS devices and the recent lead-free requirements of the electronics industry. This new technique and new metallurgy also prevent the whisker problem typically associated with lead-free tin-based solders. Finally, this new technique and the new metallurgy are CMOS and CCD compatible so they allow advanced MEMS to be fabricated over integrated circuits in a single manufacturing line, without the contamination problems associated with gold or with the sodium atoms typically used in alternate wafer-level packaging techniques.

The new wafer-level package requires the bonding of the "Lid wafer" to the "MEMS wafer" to form a sealed micro-cavity over each individual MEMS devices of the "MEMS wafer". Since the vacuum level or pre-set pressure in each micro-cavity is to be maintained in the field for about 10 years, it is necessary to use metal-based sealing materials capable of preventing gas permeation from the external world to the inside of these micro-cavities.

According to the present invention there is provided a method of making a wafer-level package for a plurality of MEMS devices, wherein a sealed and hermetic micro-cavity is formed over each MEMS device, comprising preparing a MEMS wafer with a first bonding structure; preparing a lid wafer with a second bonding structure; bonding said lid wafer to said MEMS wafer through said first and second bonding structures to create said wafer level package, and wherein said lid wafer and said MEMS wafer are substantially free of at least one component selected from the group consisting of alkali metals and chlorine.

In one embodiment of the invention the first bonding structure of said MEMS wafer is formed by depositing a first seed layer on a MEMS device, depositing a first structural underlayer over the seed layer, and depositing a first anti-oxidation layer over the first structural underlayer, the anti-oxidation layer being bondable to second bonding structure. The second bonding structure comprises a second seed layer, a second structural underlayer over said second seed layer, a second anti-oxidation over said second structural underlayer, and a solder layer capable of bonding to said first anti-oxidation layer. It will be understood that the reference to one layer being "over" another layer does not imply any particular orientation of the device, nor does it exclude the possibility of their being intermediate layers.

The structural underlayer is preferably deposited using an electroless plating process.

DETAILED DESCRIPTION OF THE DRAWINGS

The invention will now be described in more detail, by way of example only, with reference to the accompanying drawings, in which.

Figure 1:
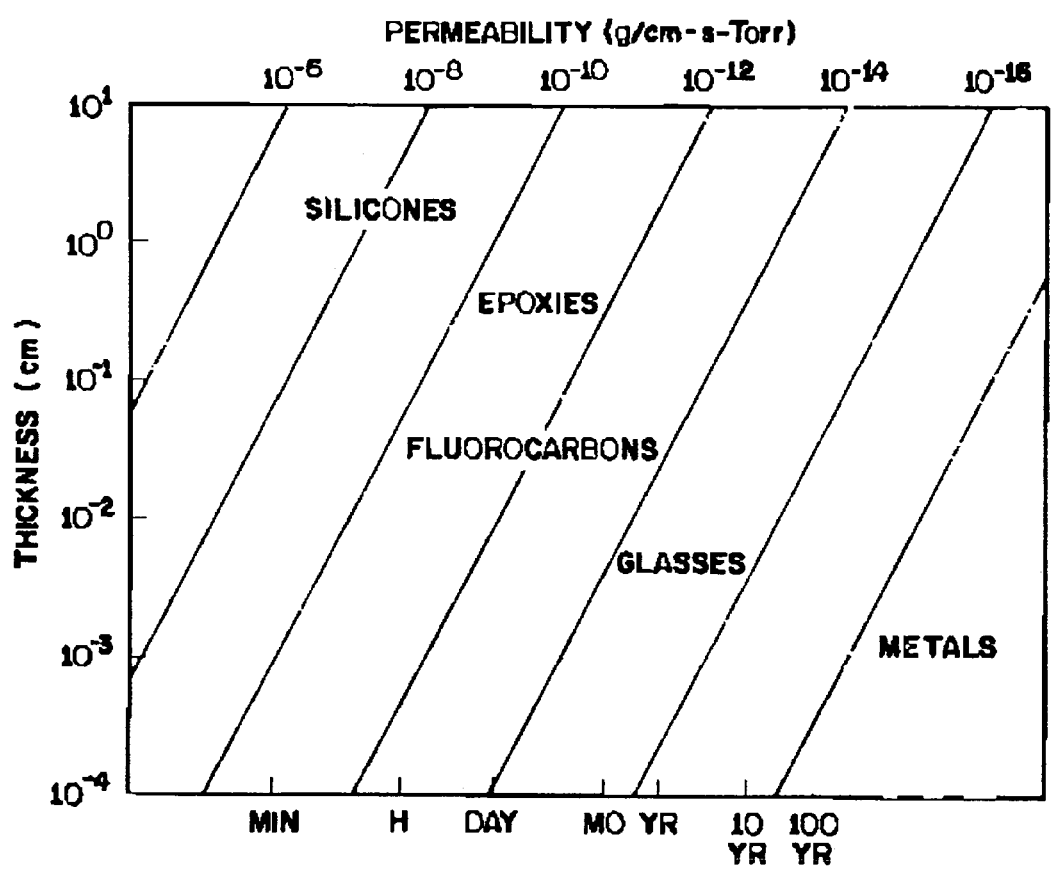
FIG. 1 shows the permeability of various classes of materials.
Figure 2:
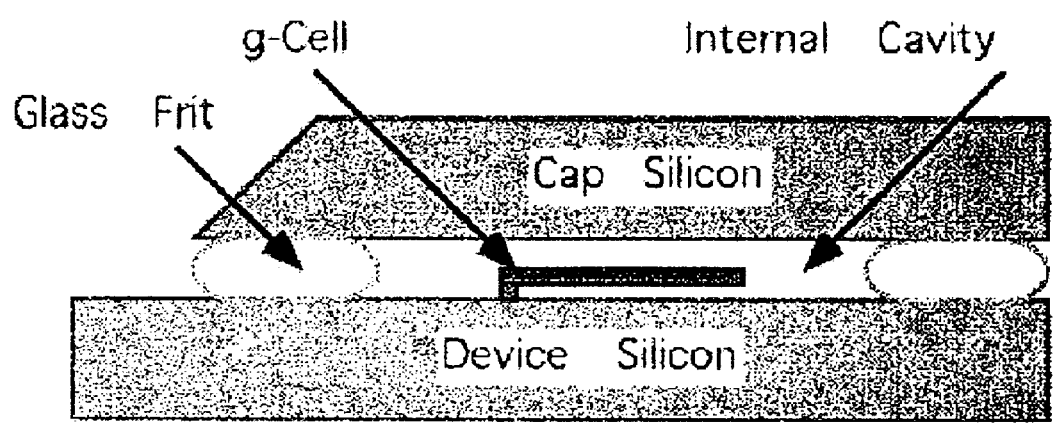
FIG. 2 illustrates the packaging of an micro-machined accelerometer using a glass frit (Motorola, Inc.)
Figure 4:
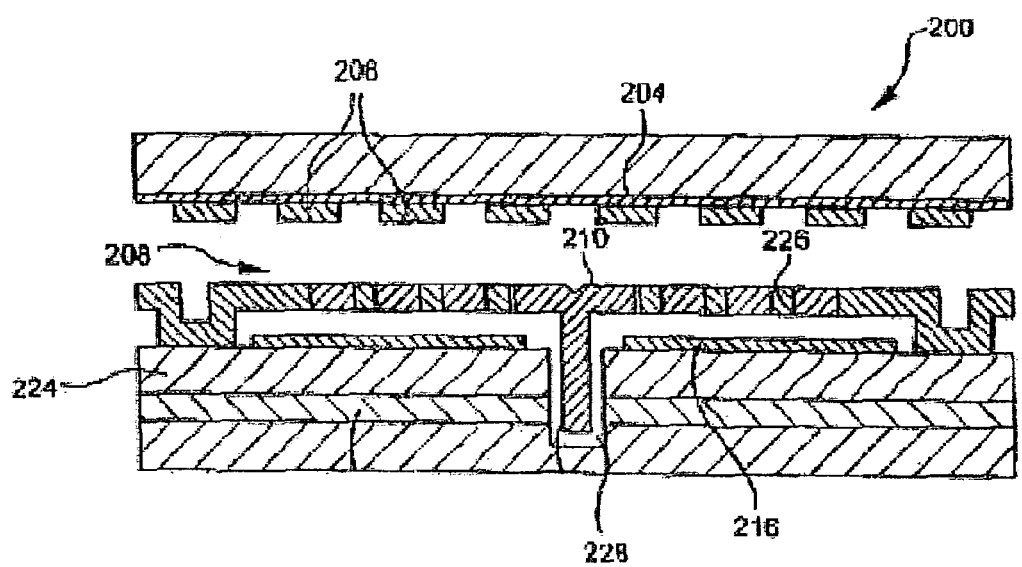
Figure 5:
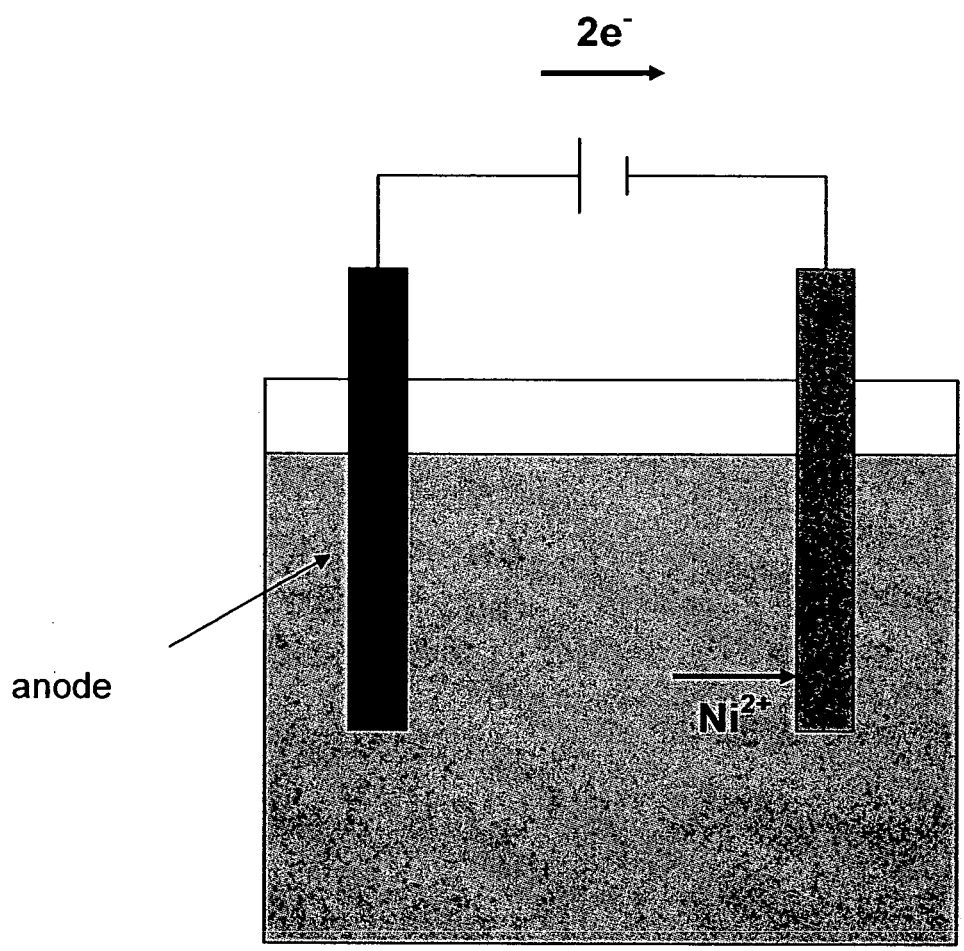
Figure 6:
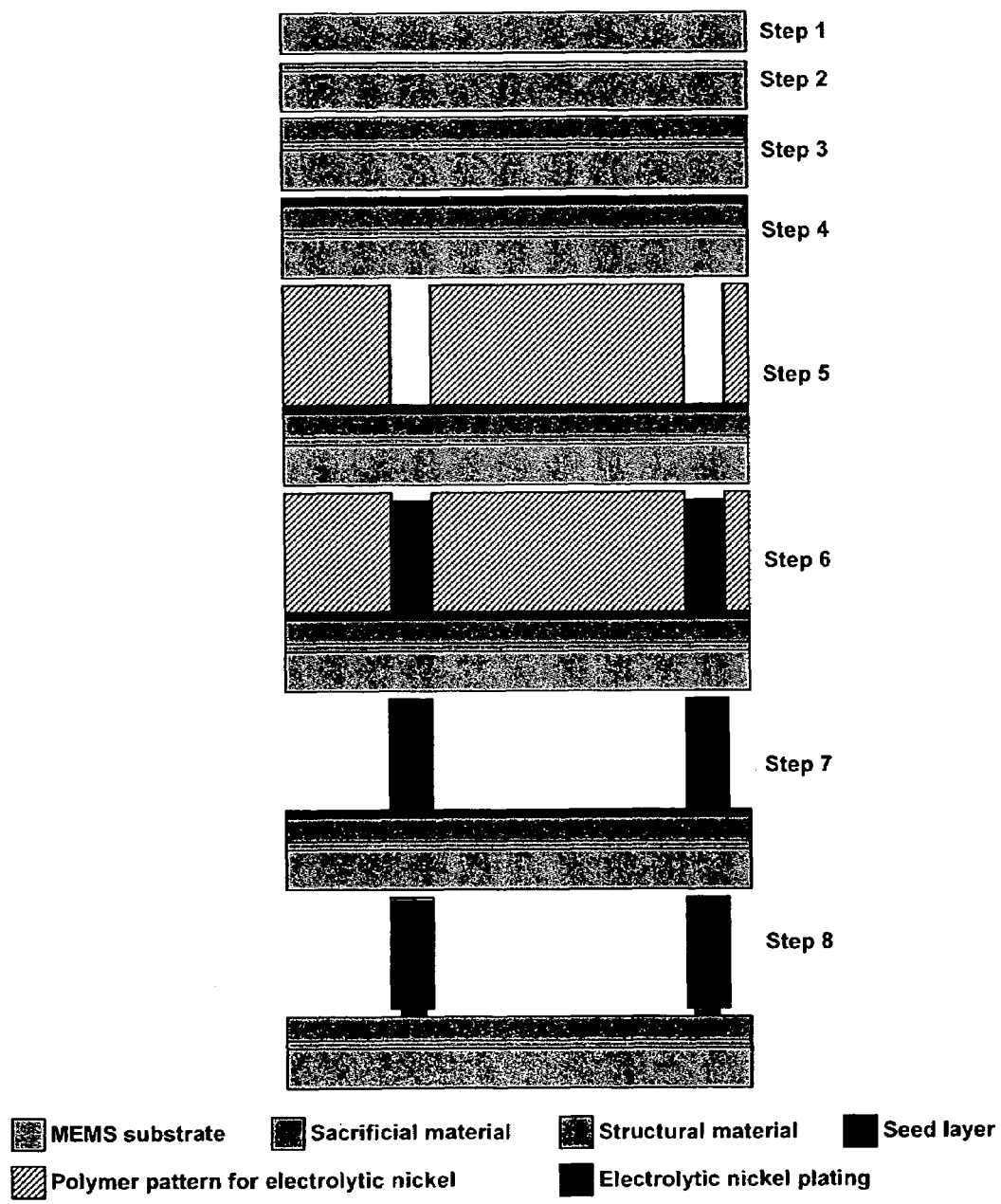
Figure 7:
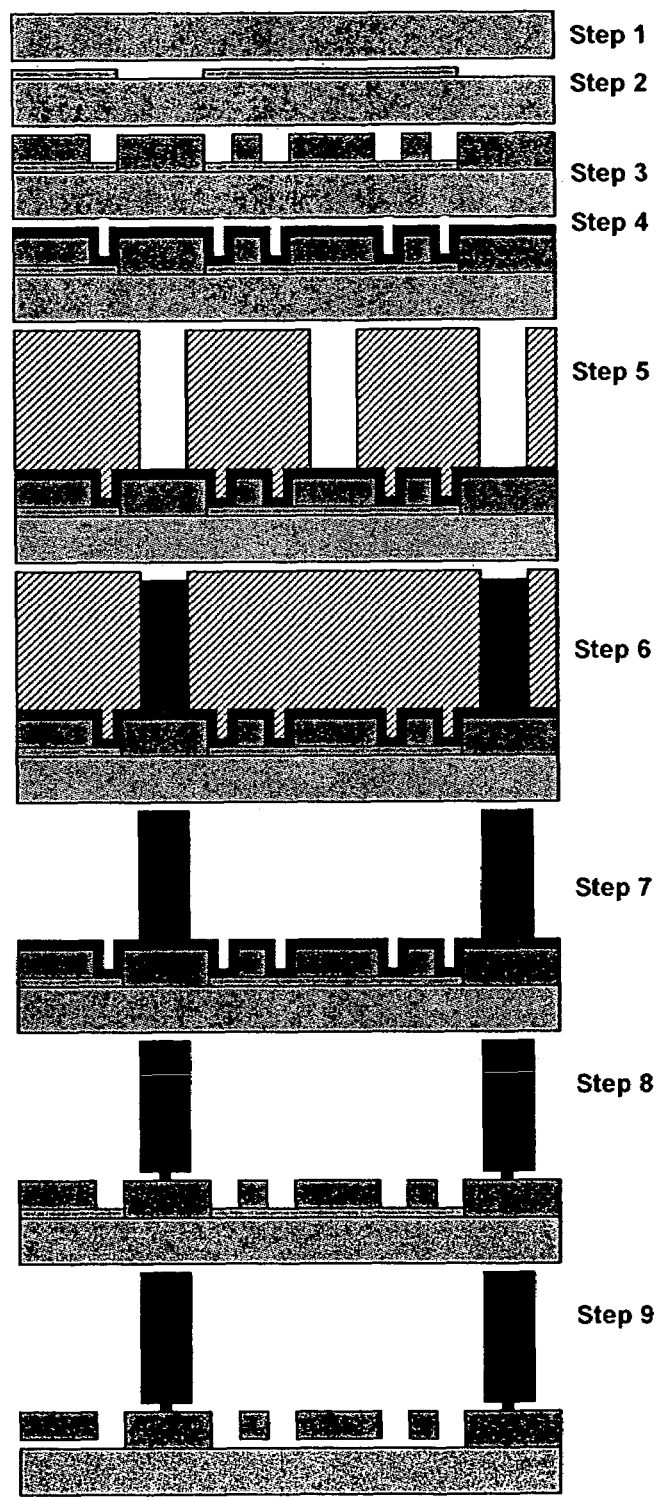
Figure 8:
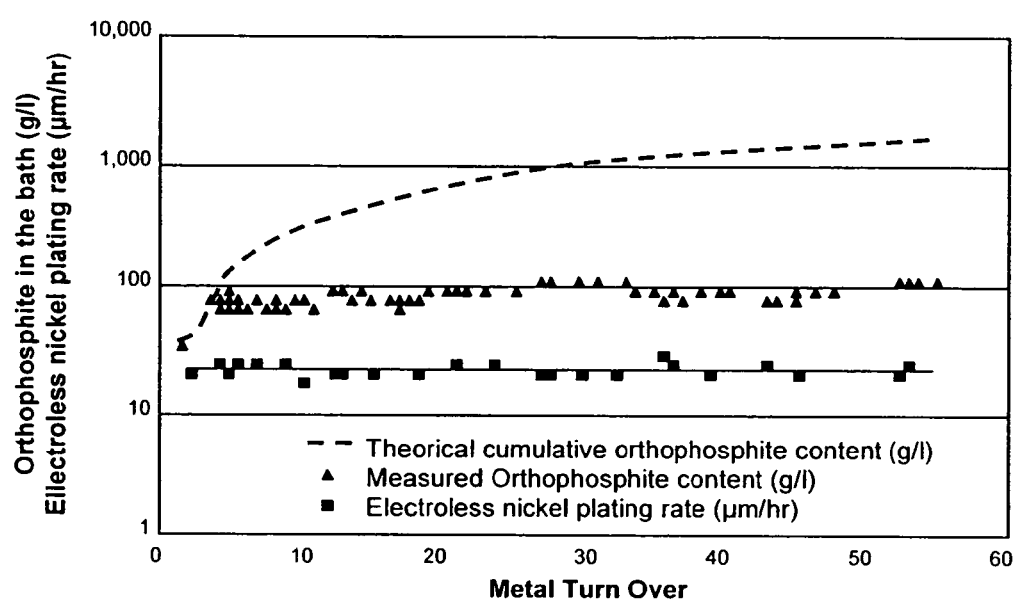
Figure 9:
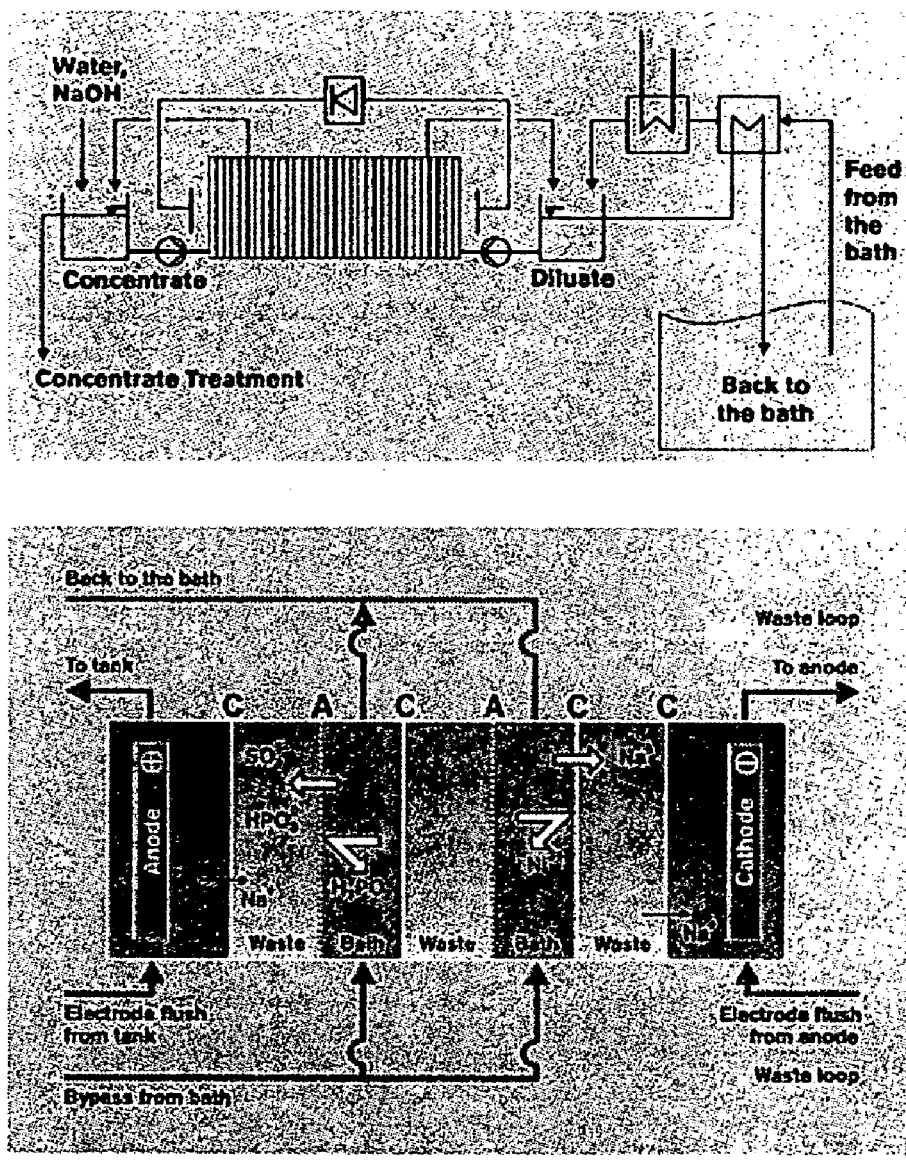
Figure 10:
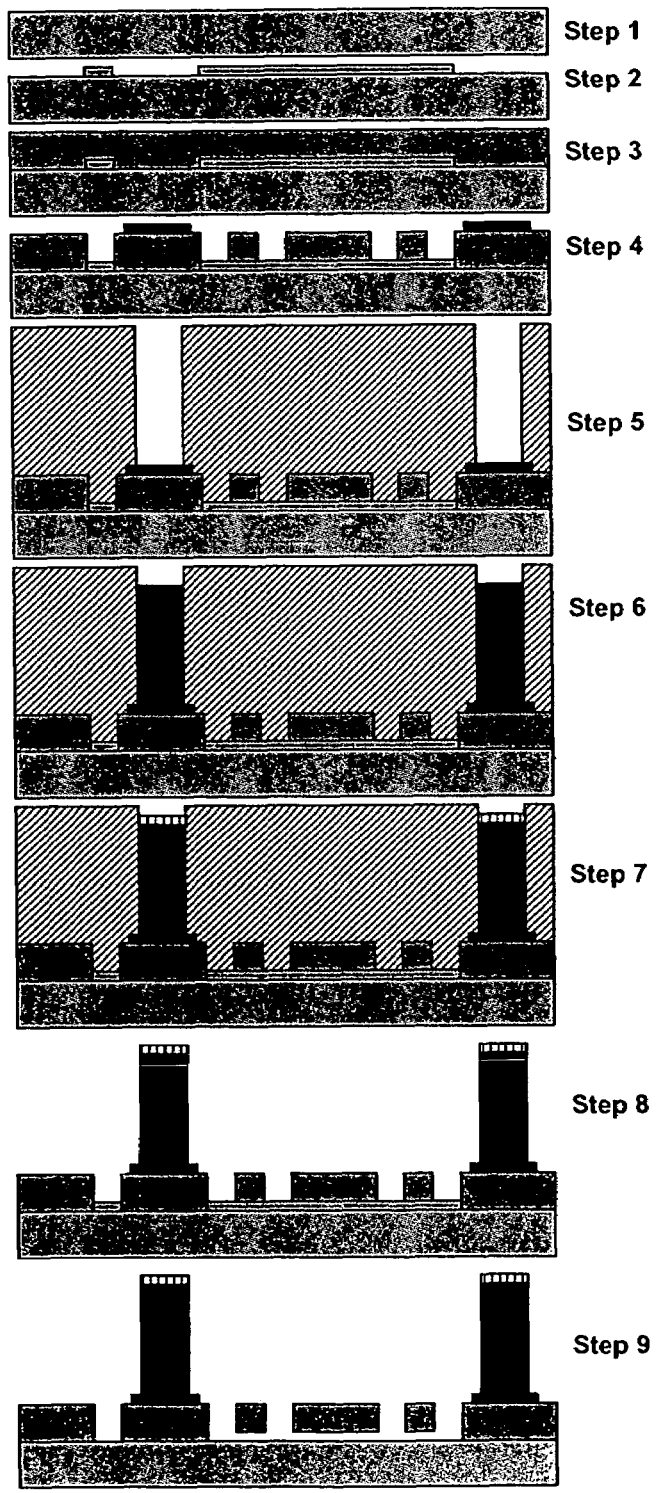
Figure 11:
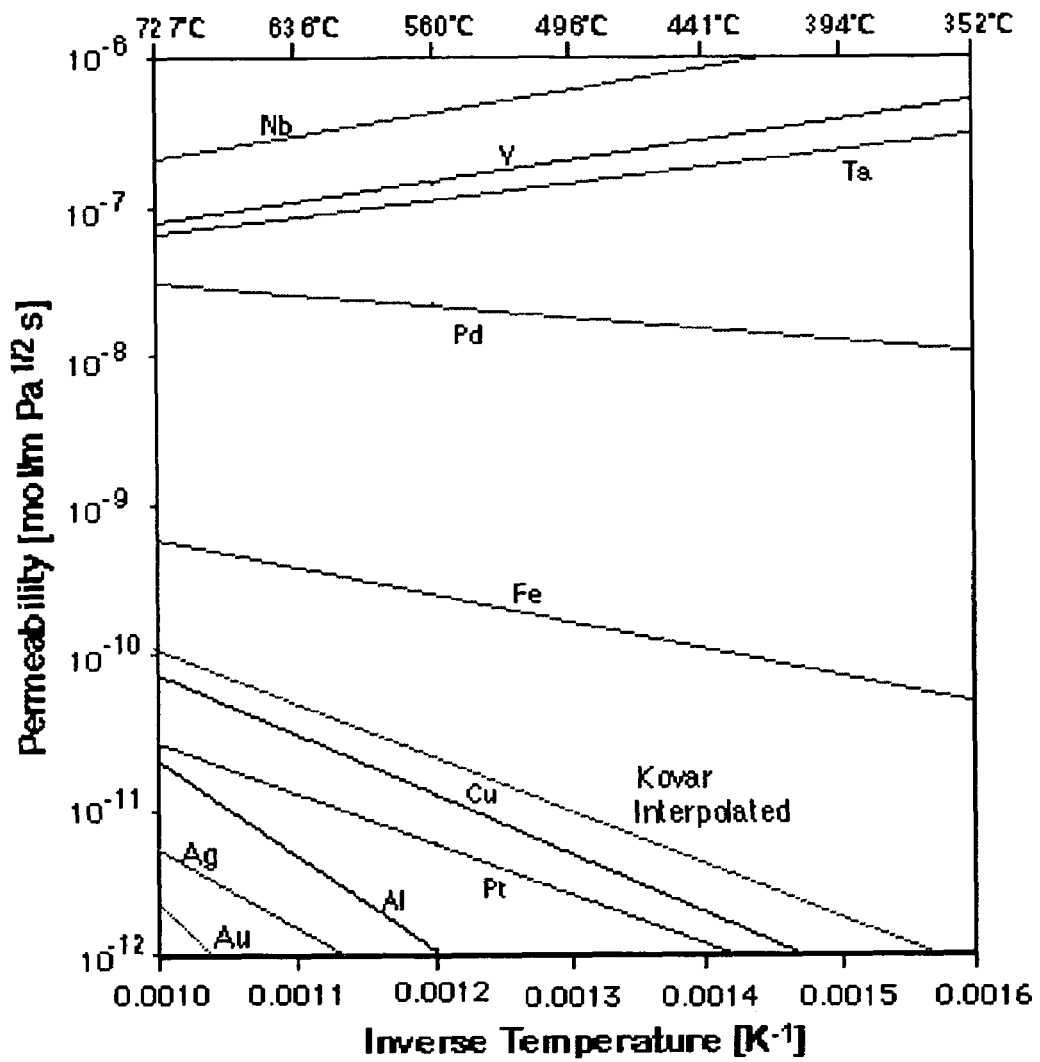
Figure 12:
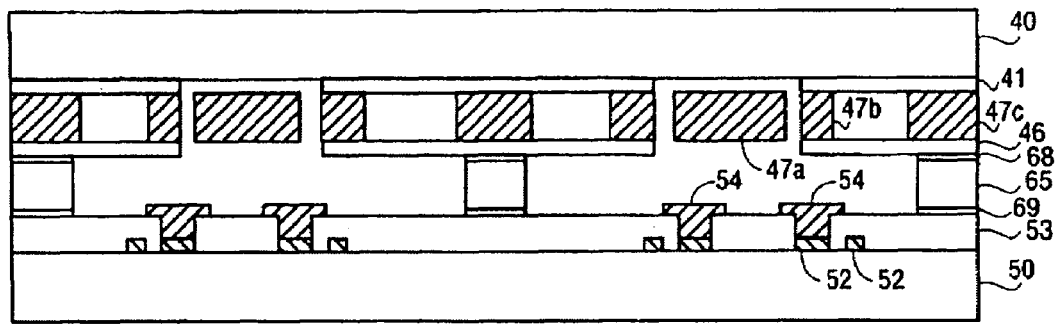
Figure 13:
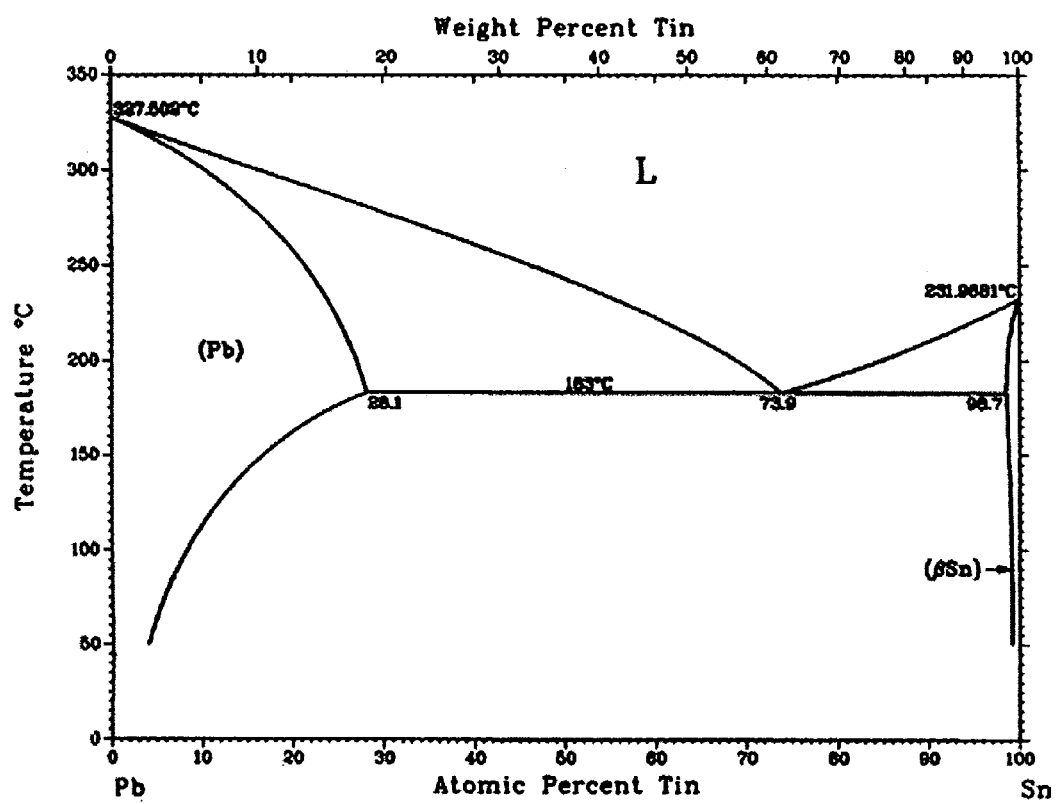
Figure 14:
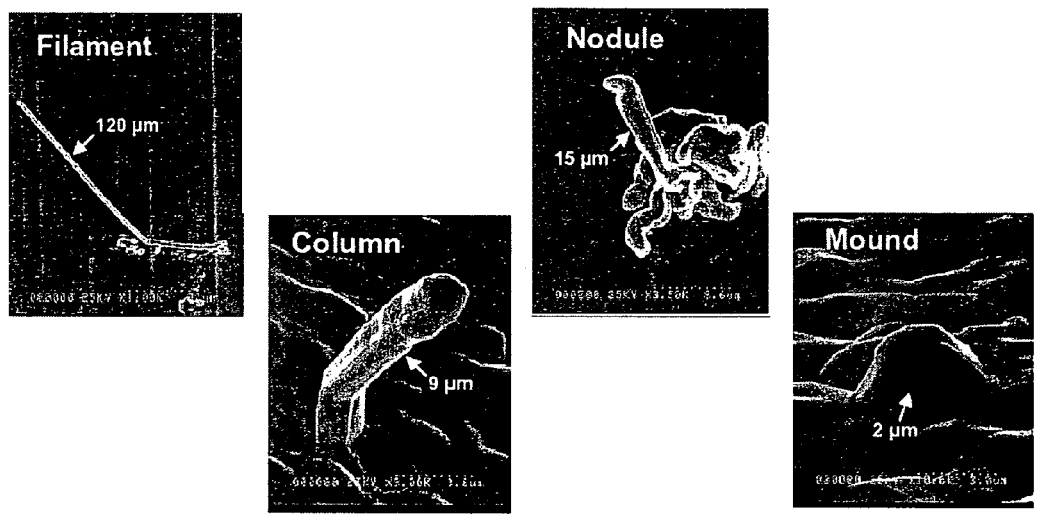
Figure 16:
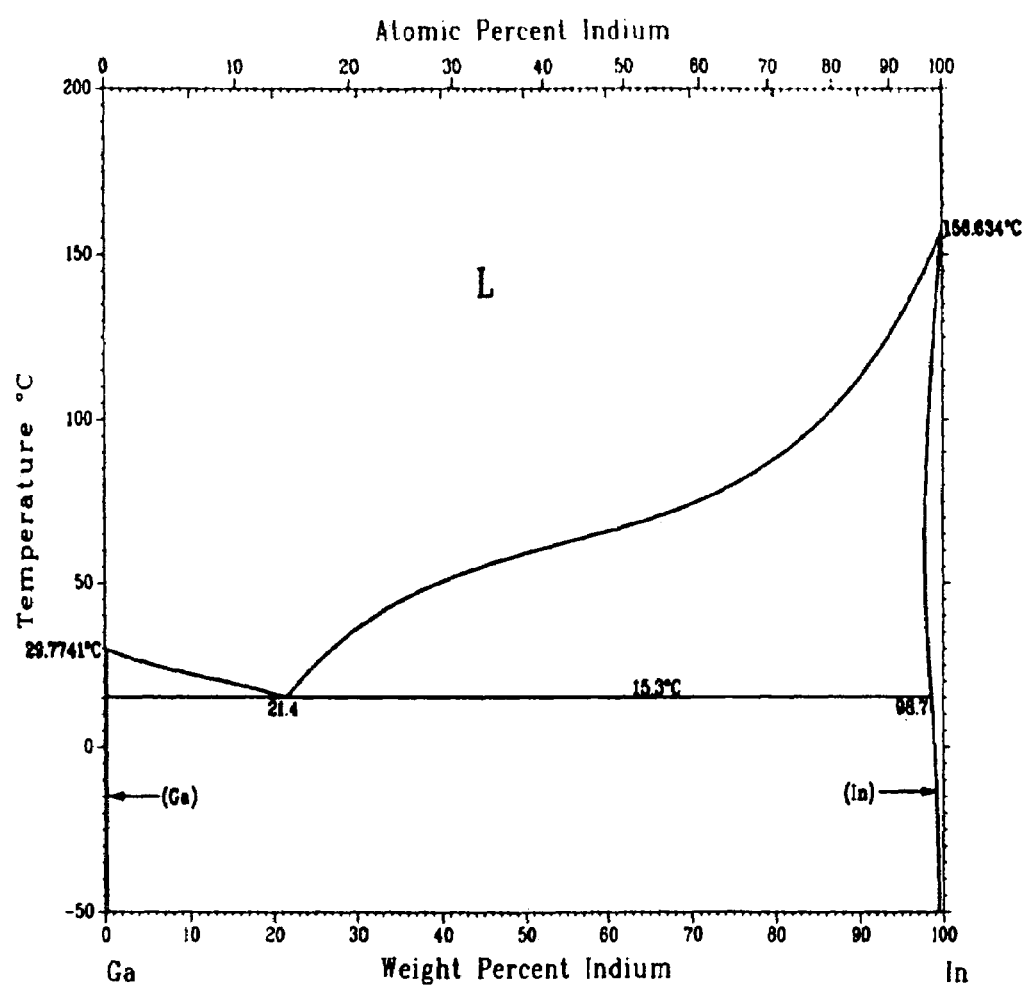
Figure 17:
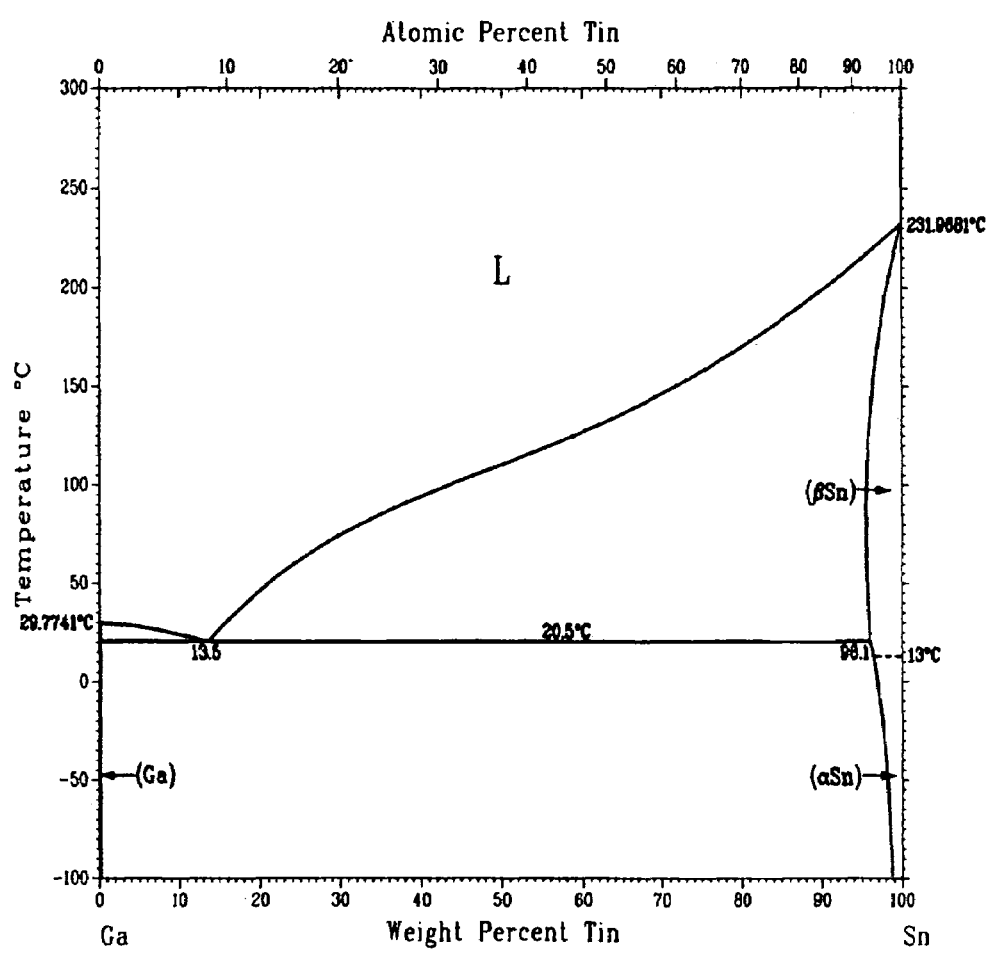
Figure 18:
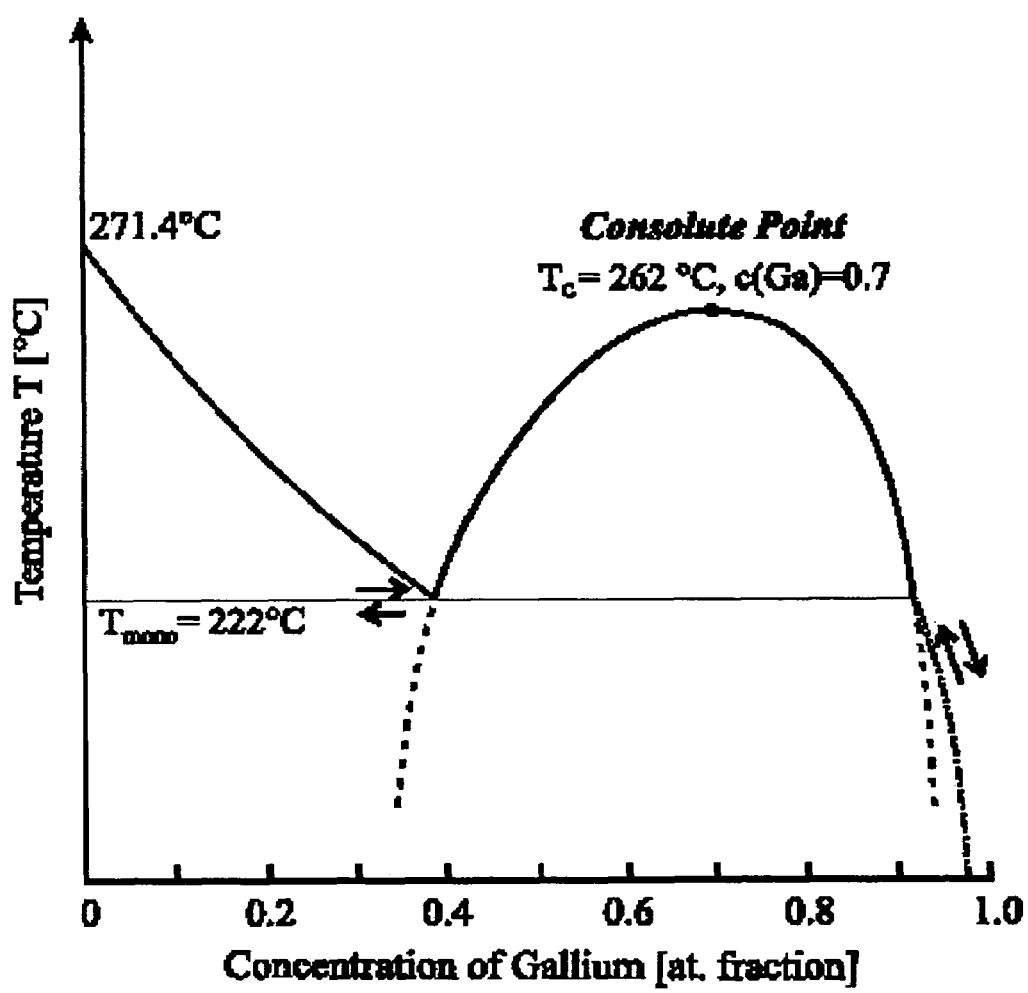
Figure 19:
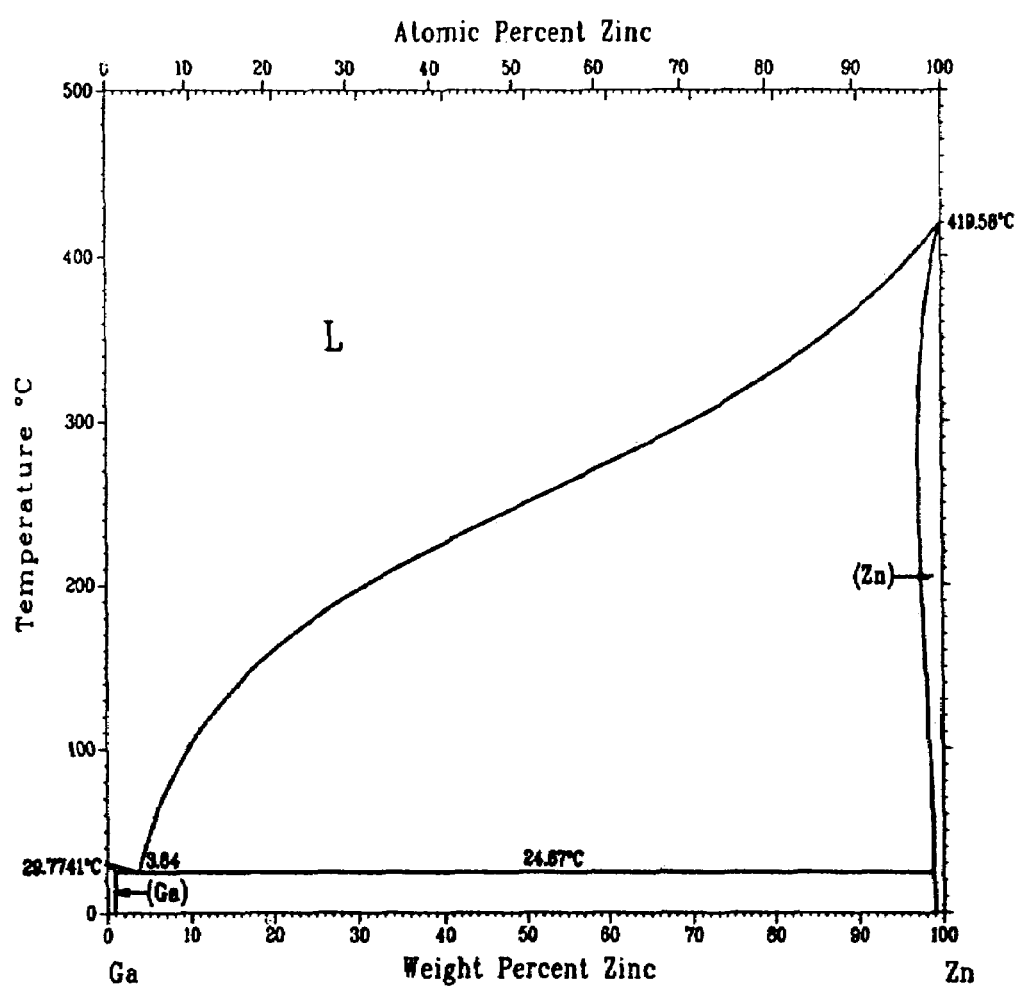
Figure 20:
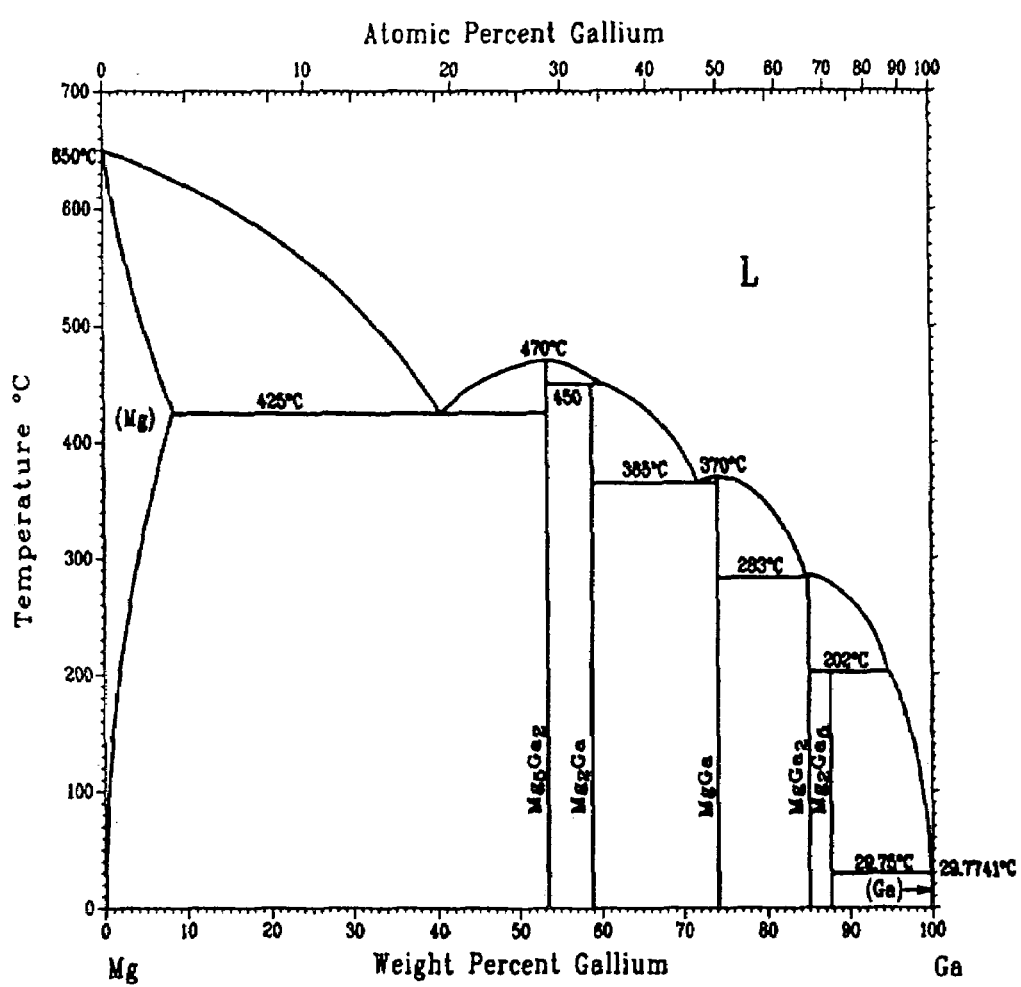
Figure 21:
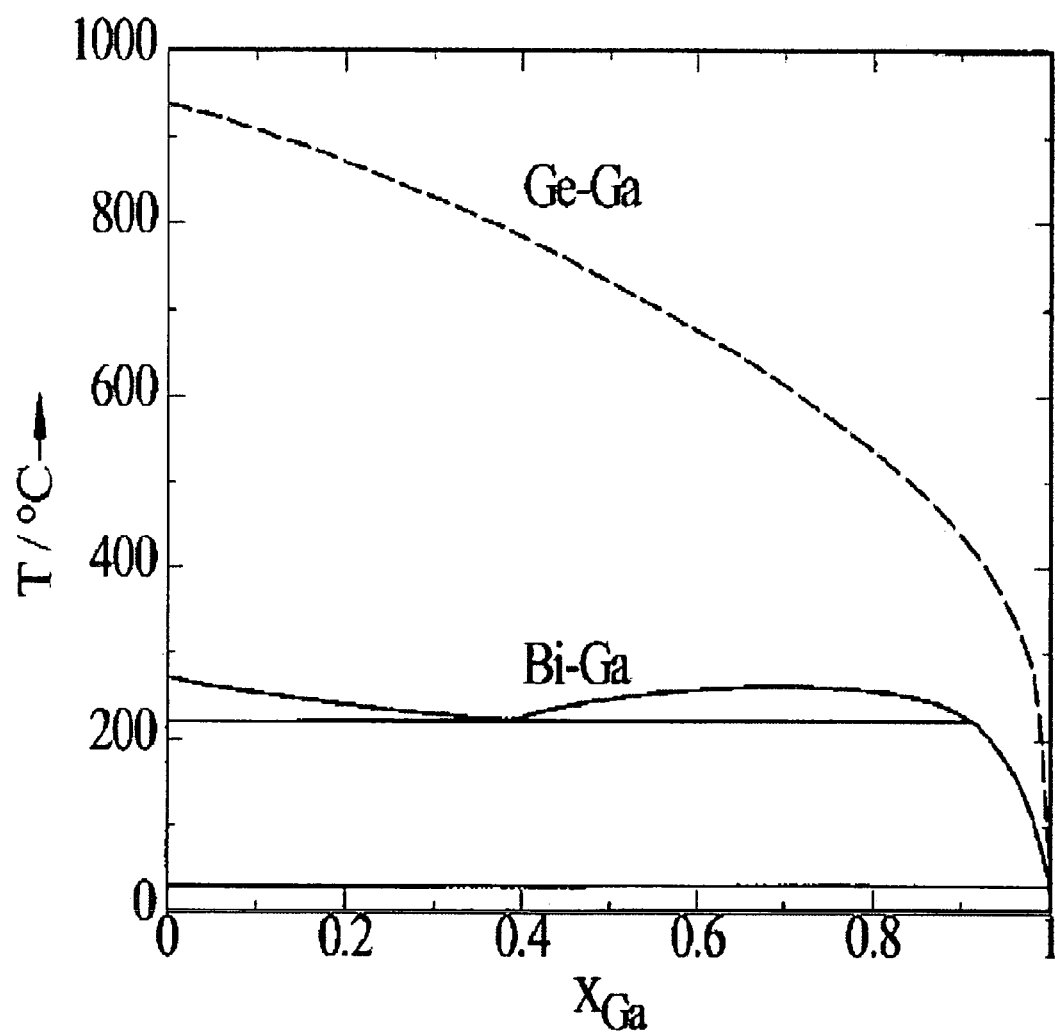
Figure 22:
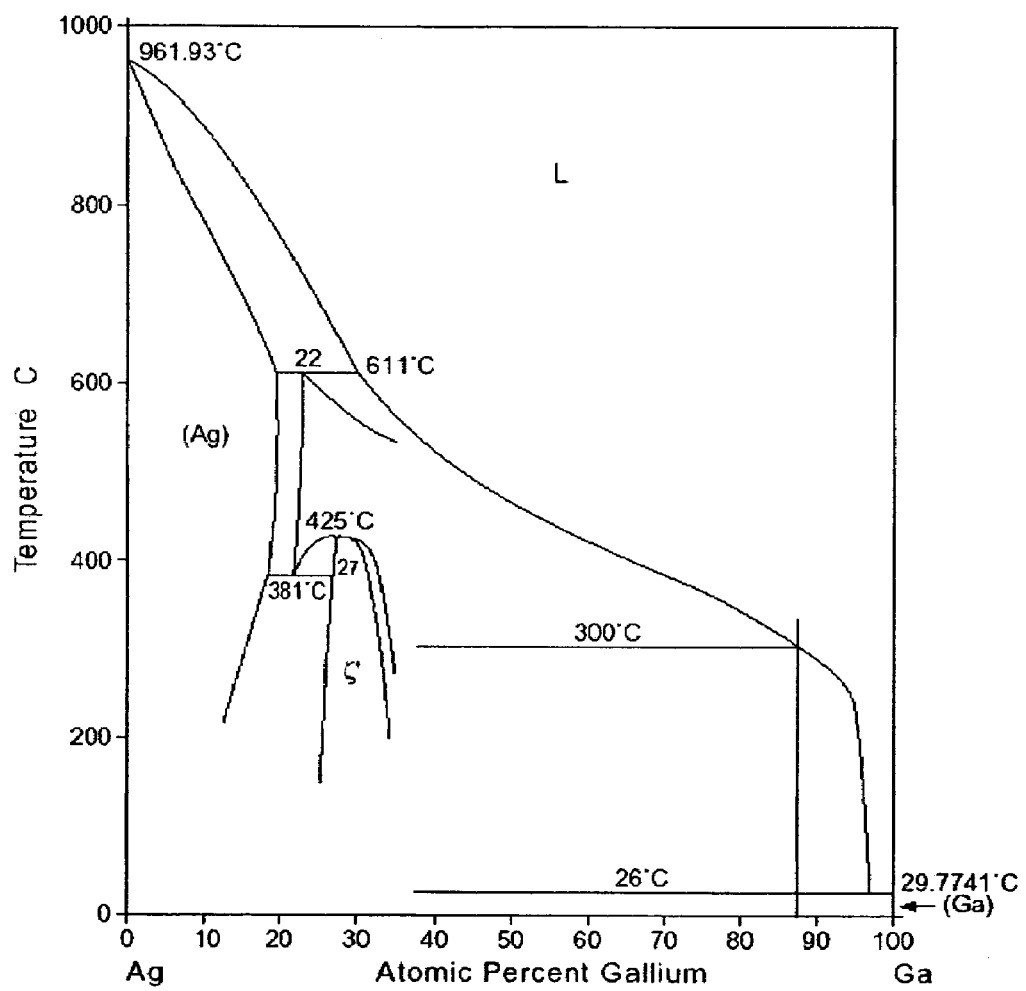
Figure 23:
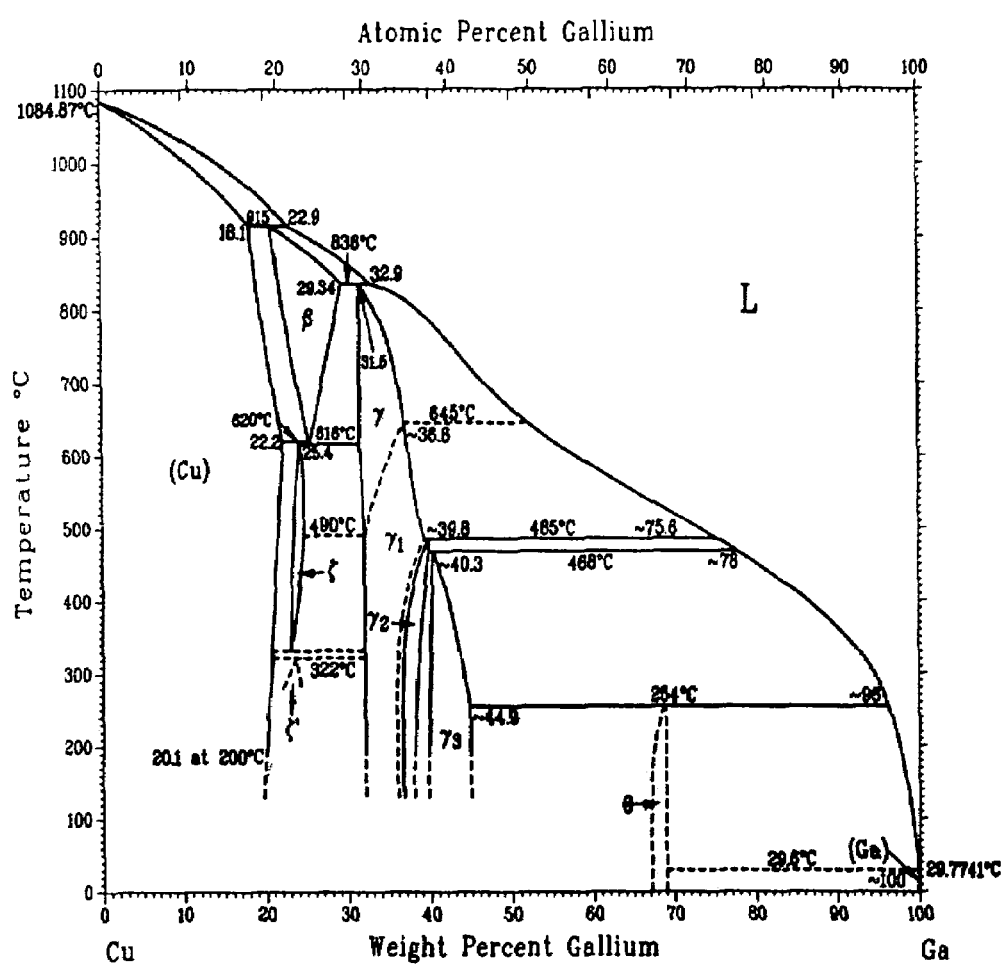
Figure 24:
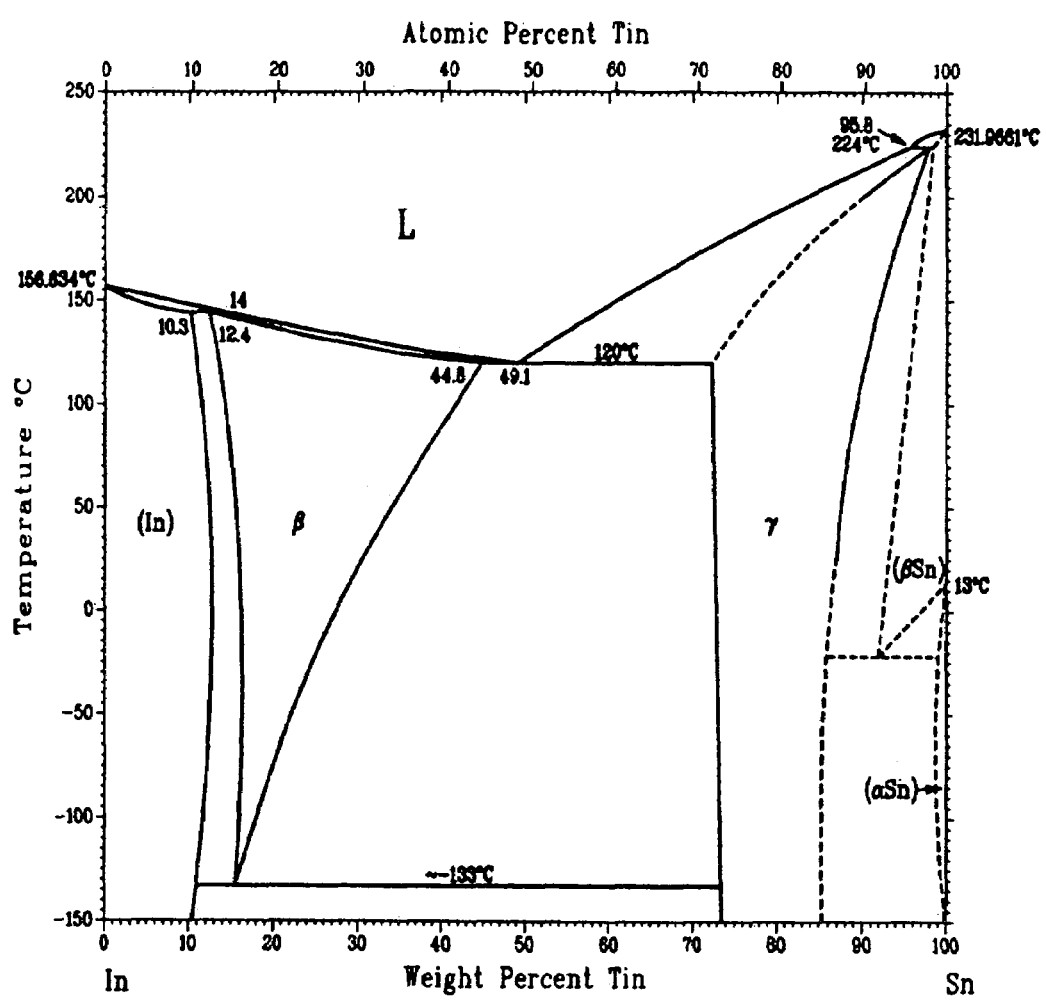
Figure 25:
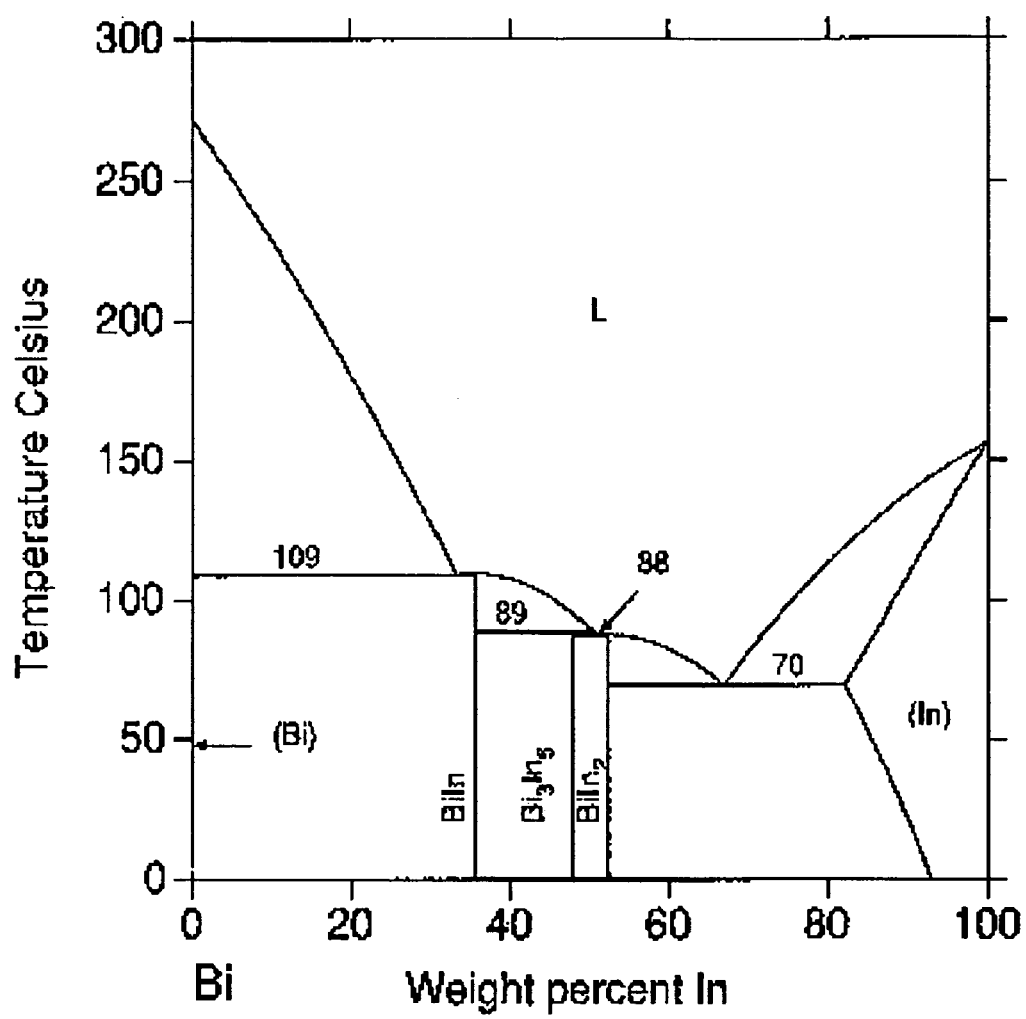
Figure 26:
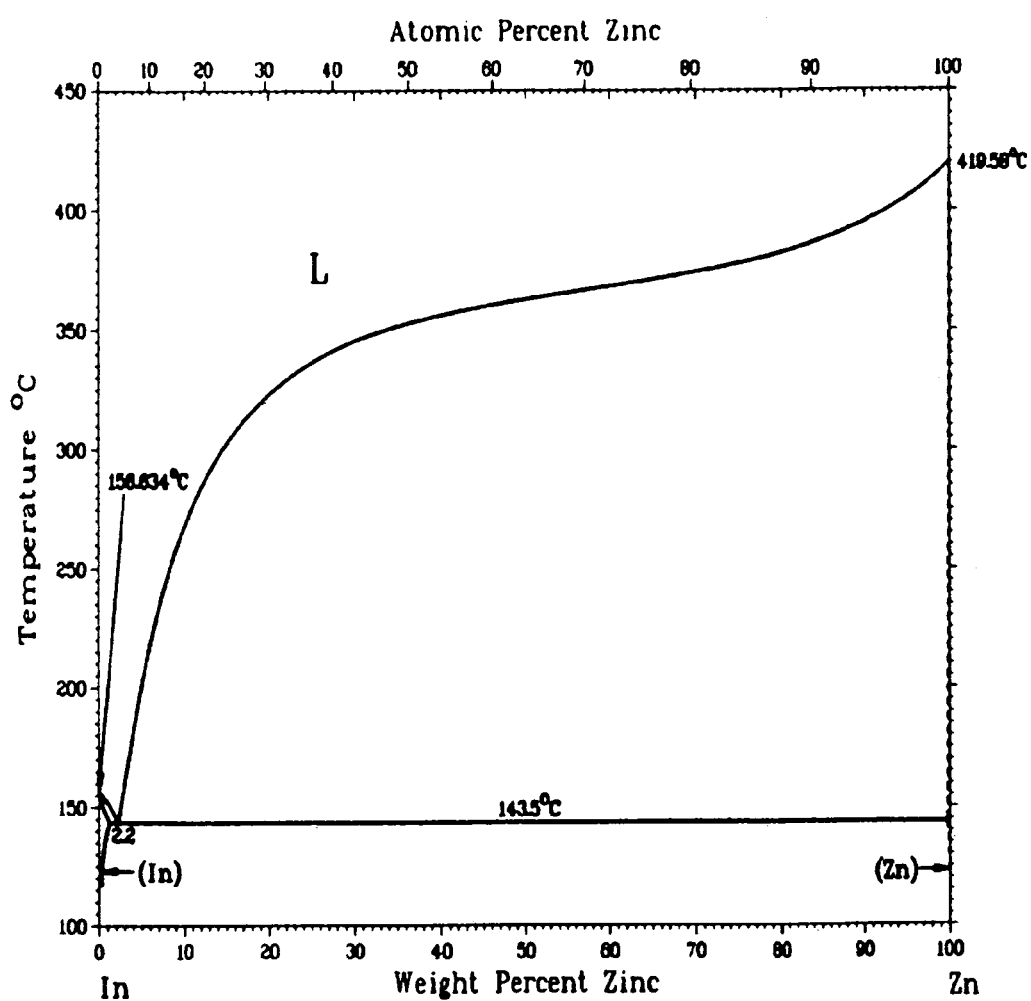
Figure 27:
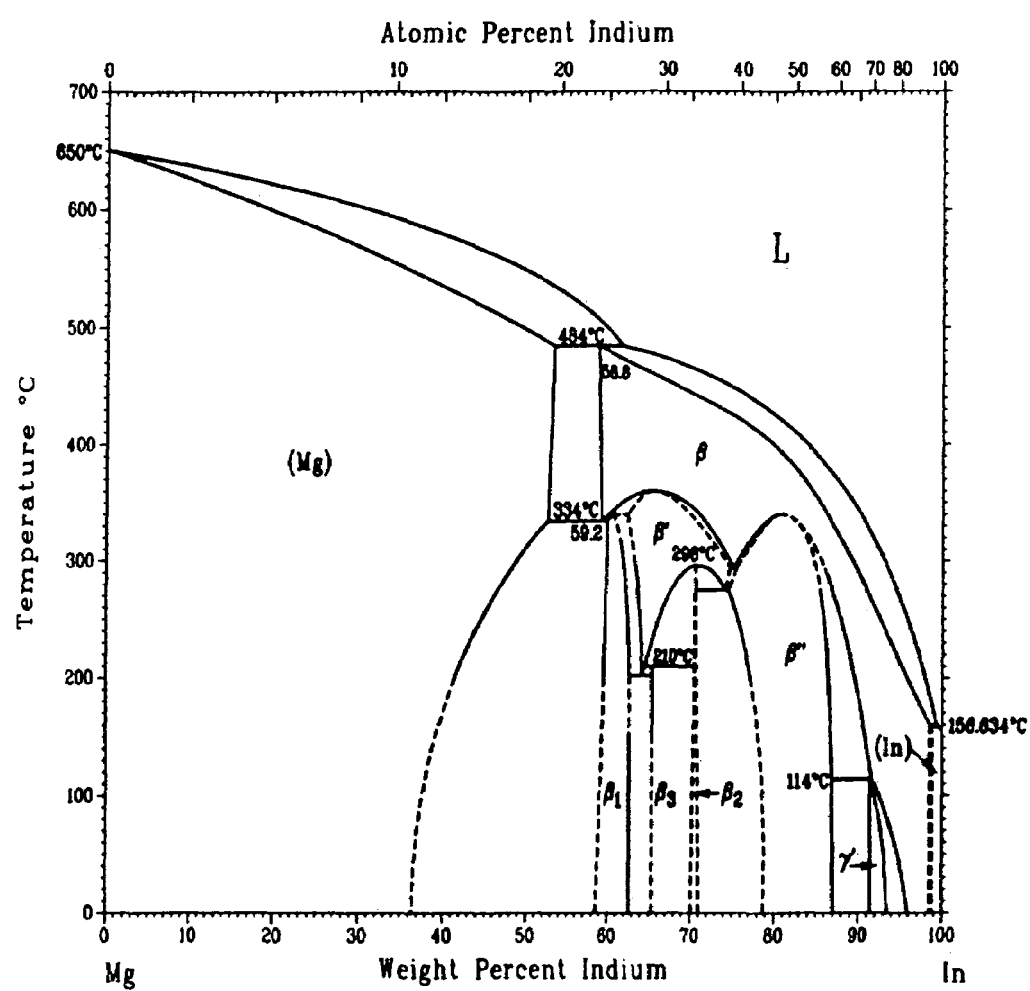
Figure 28:
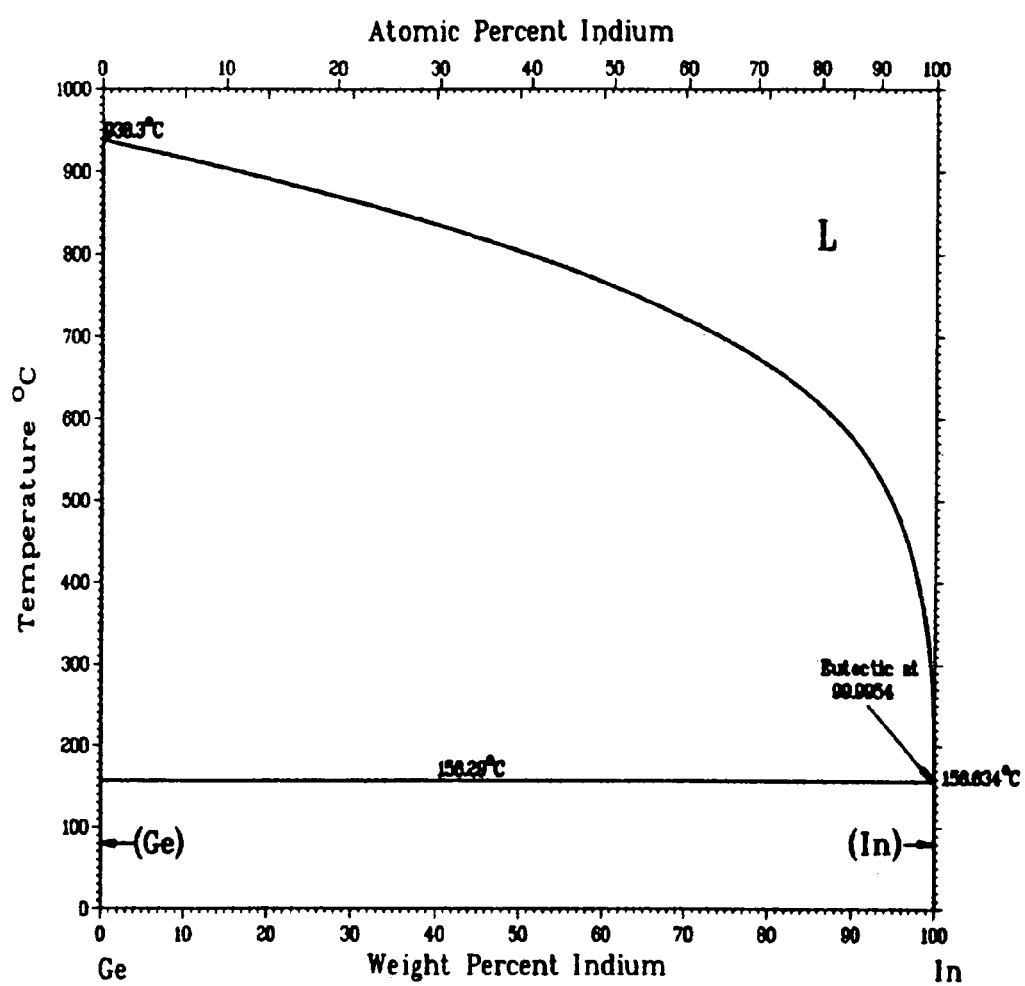
Figure 29:
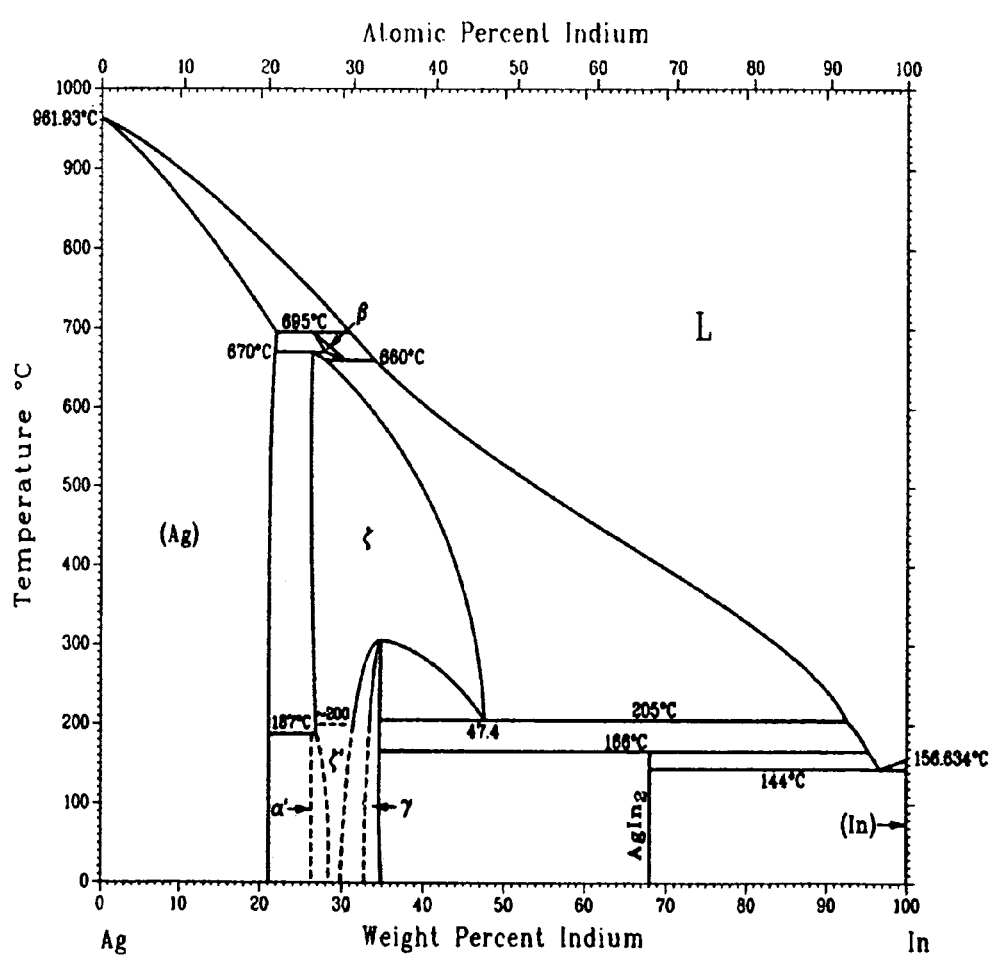
Figure 30:
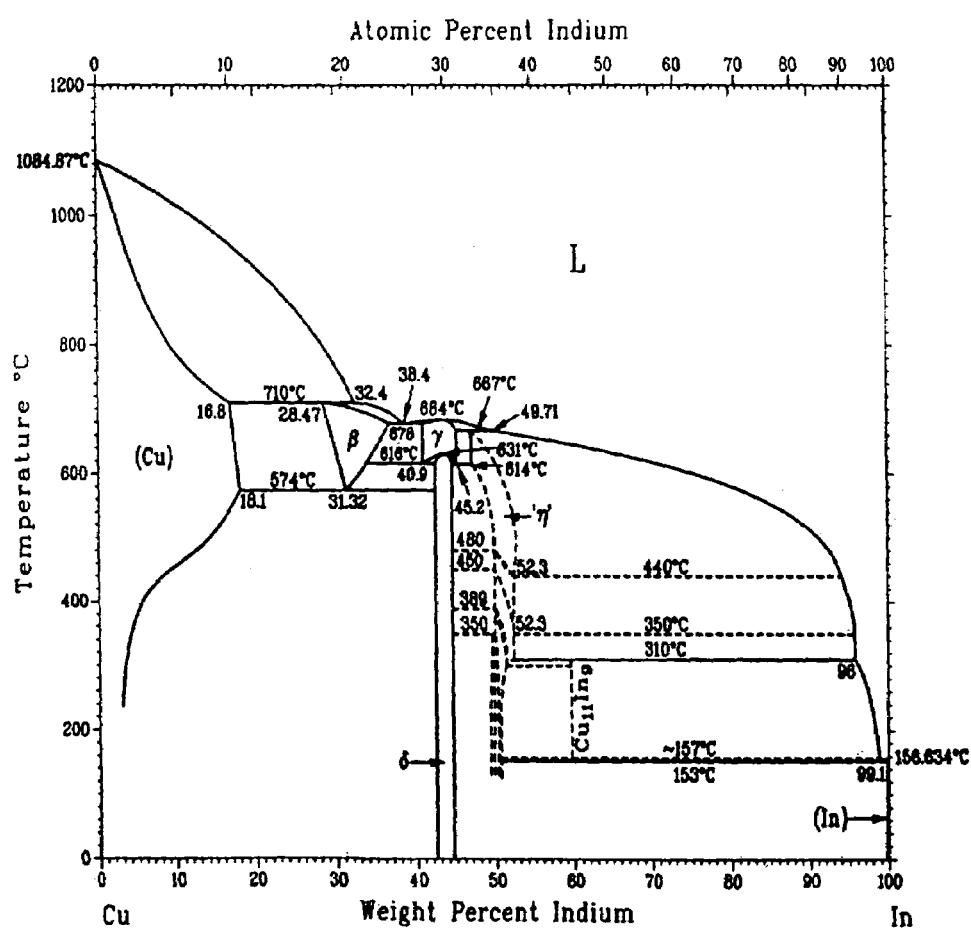
Figure 31:
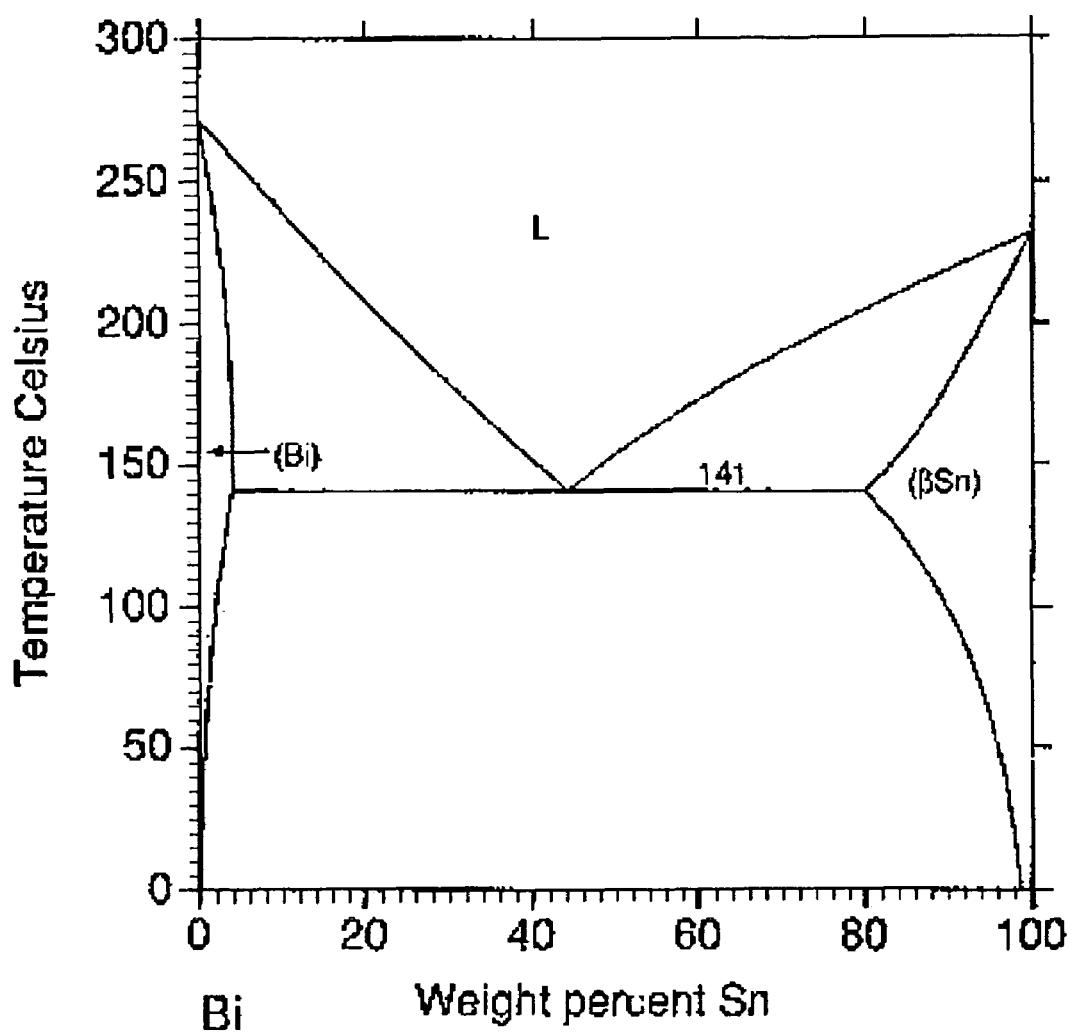
Figure 32:
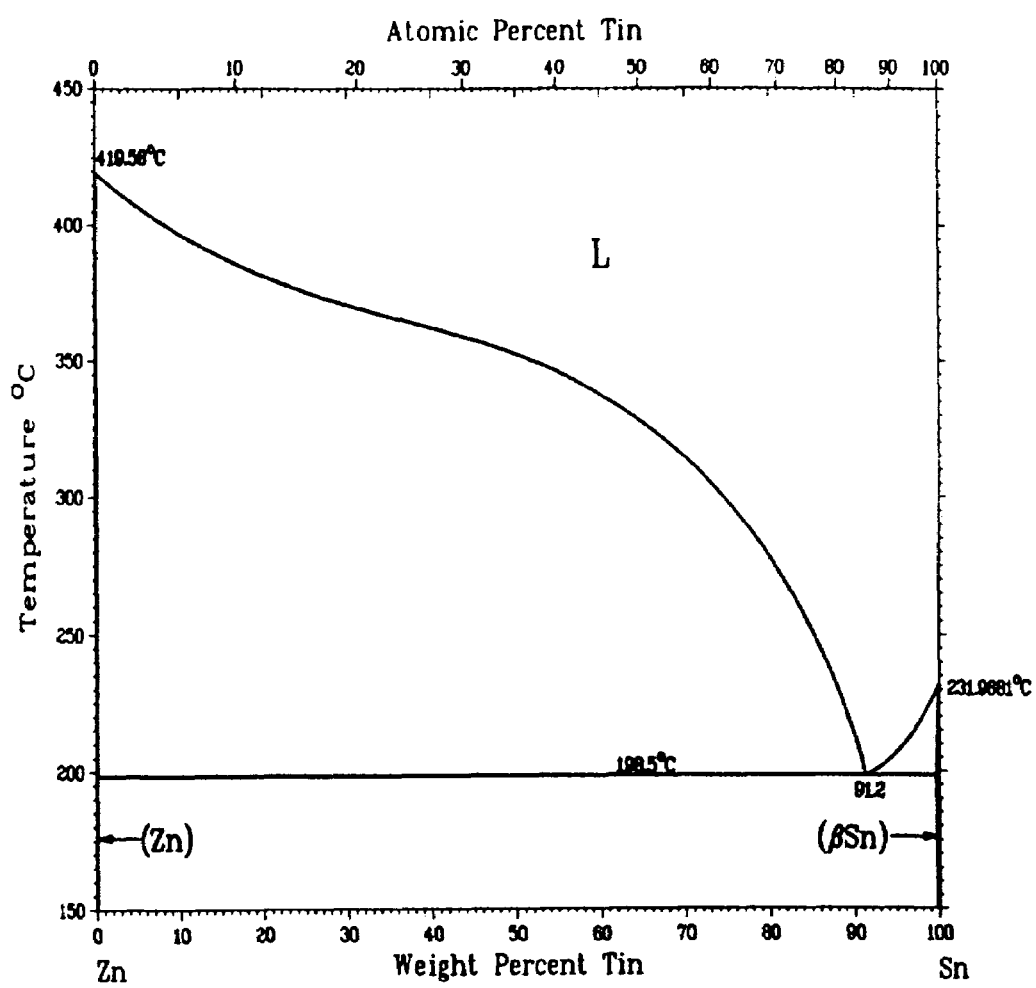
Figure 33:
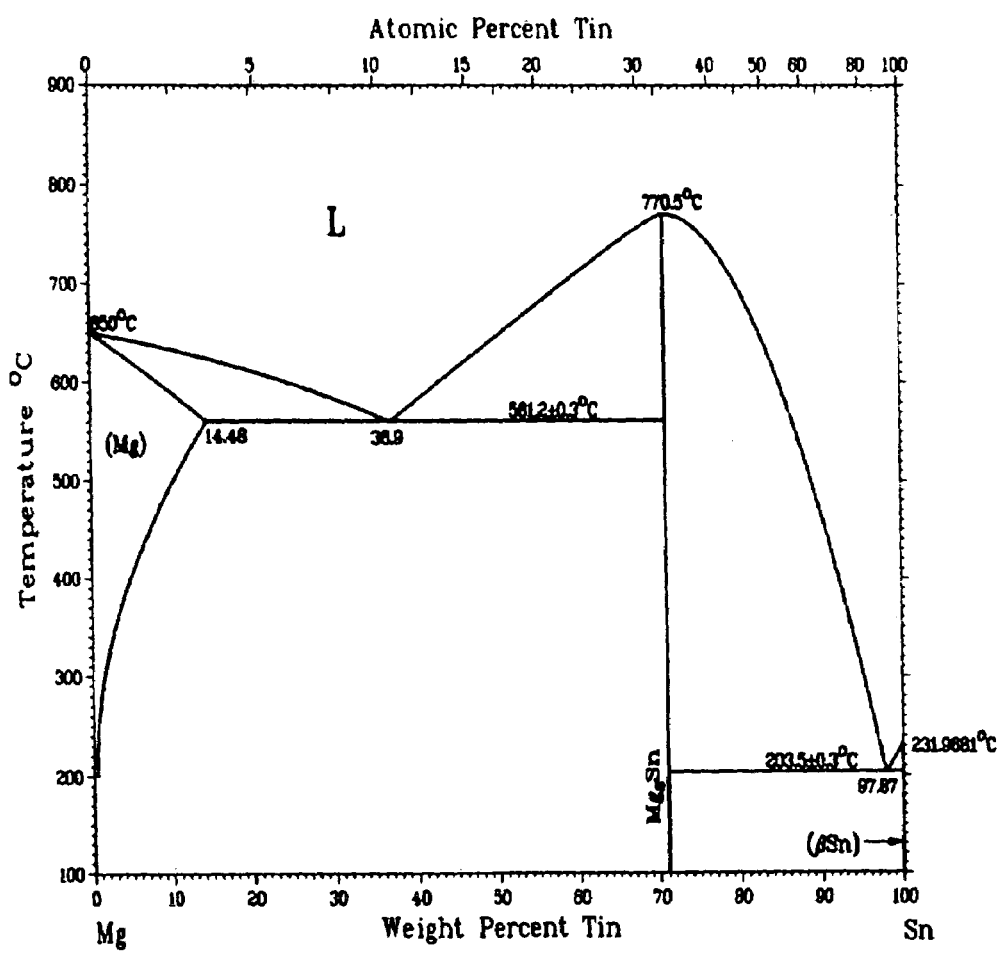
Figure 34:
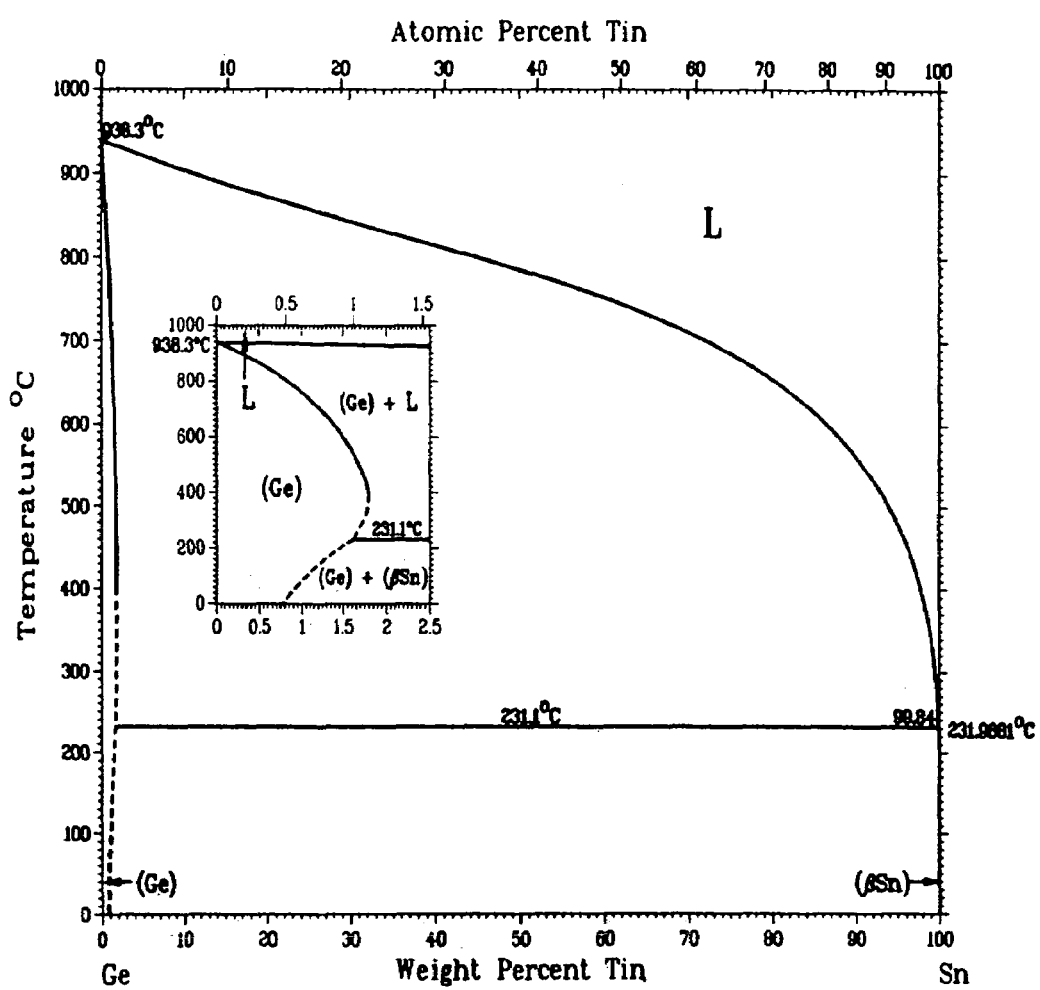
Figure 35:
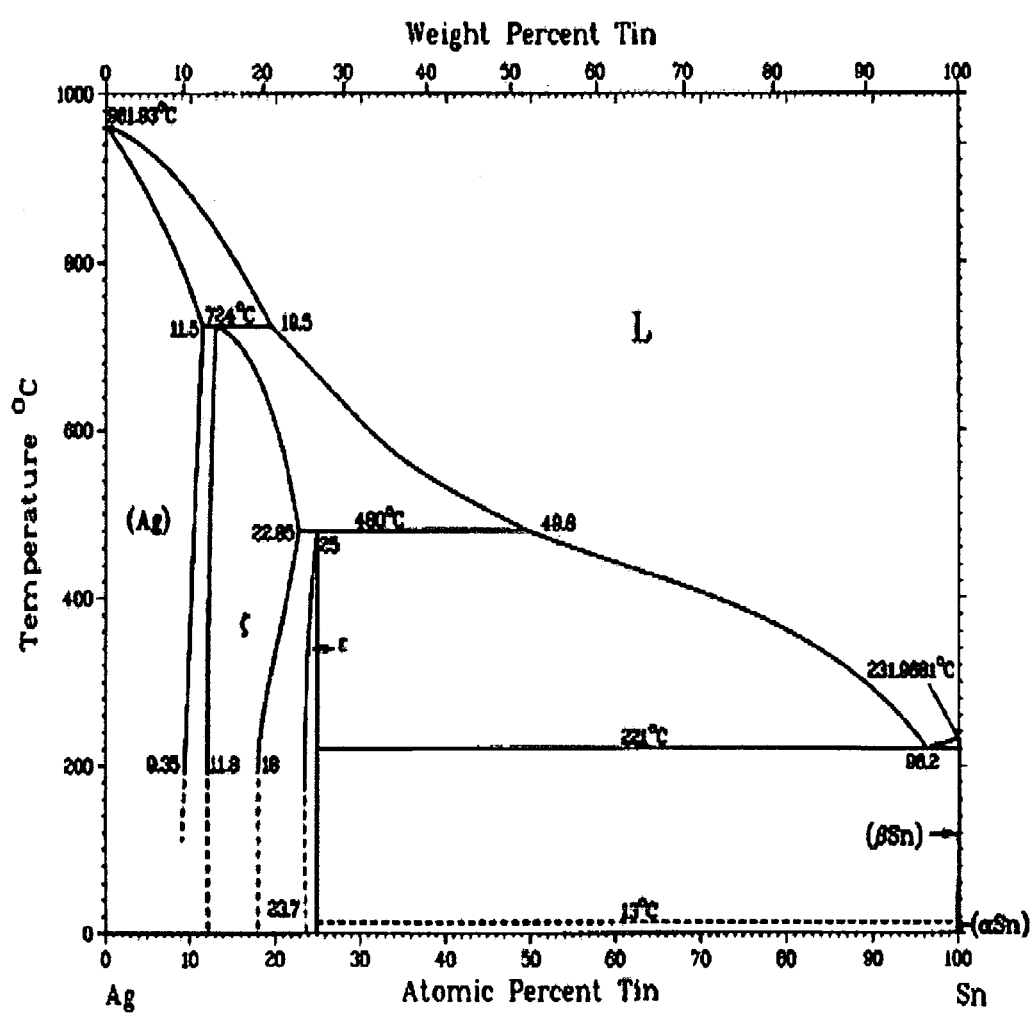
Figure 36:
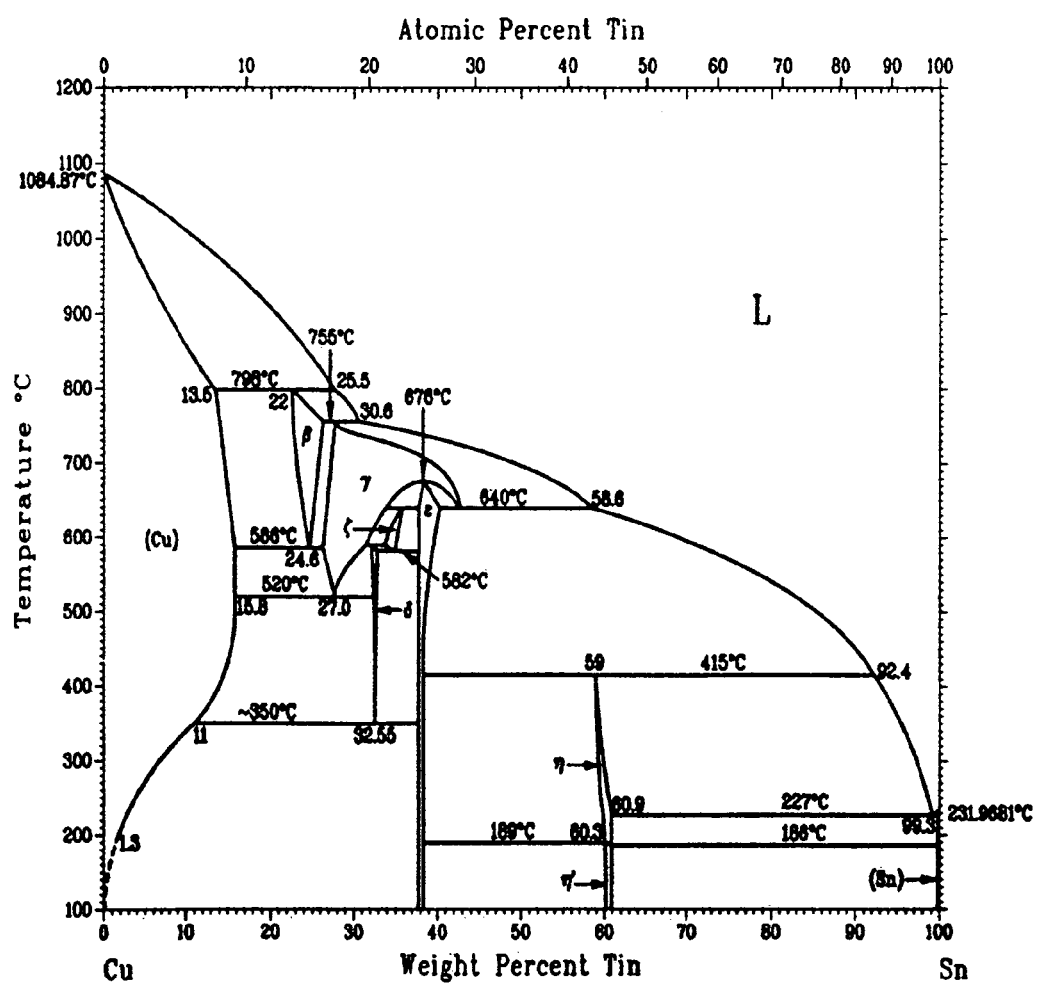

FIG. 3 illustrates the vacuum packaging of an angular rate sensor using anodic bonding U.S. Pat. No. 5,952,572) (Matsushita Electric Industrial Co., Ltd.);

FIG. 4 illustrates a MEMS-based photonics mirror obtained from electrolytic nickel plating (U.S. Pat. No. 6,411,754 from Corning Incorporated);

FIG. 5 shows the principle of electrolytic plating for the formation of nickel patterns on a MEMS wafer;

FIG. 6 shows an electrolytic plating process for the formation of nickel patterns through a polymer pattern on a flat substrate;

FIG. 7 shows an electrolytic plating process for the formation of nickel patterns through a polymer pattern on a patterned MEMS wafer;

FIG. 8 shows the Metal Turn Around number improvement by electroless nickel bath life extension techniques (From Dr. J. Cl. Puippe, Centre d'innovation technologique du groupe Estoppey Reber, Châtel-St-Denis, Switzertland;

FIG. 9 illustrates the operation of the ElectroDialysis of Electroless Nickel (EDEN) process, using unfriendly sodium hydroxide, NaOH, as purification chemical. (From Atotech Innovation);

FIG. 10 illustrates the immersion plating of an oxidation-resistant noble metal layer over electroless nickel so as to maintain a solderable surface;

FIG. 11 shows the high hydrogen permeability in palladium;

FIG. 12 shows a Micro-electro-mechanical-system (MEMS) mirror device (U.S. Pat. No. 6,563,106) (Calient Networks, Inc., San Jose, Calif.;

FIG. 13 is a Tin-Lead phase diagram showing eutectic temperatures of 183-232° C.;

FIG. 14 shows the whiskers growth at room temperature over time observed in lead-free tin-based solders;

FIG. 15 consists of Pourbaix diagrams of zinc and aluminum alloying metals;

FIG. 16 is a Gallium-Indium phase diagram;

FIG. 17 is a Gallium-Tin phase diagram;

FIG. 18 is a Gallium-Bismuth phase diagram;

FIG. 19 is a Gallium-Zinc phase diagram;

FIG. 20 is a Gallium-Magnesium phase diagram;

FIG. 21 is a Gallium-Germanium phase diagram;

FIG. 22 is a Gallium-Silver phase diagram;

FIG. 23 is a Gallium-Copper phase diagram;

FIG. 24 is an Indium-Tin phase diagram;

FIG. 25 is an Indium-Bismuth phase diagram;

FIG. 26 is an Indium-Zinc phase diagram;

FIG. 27 is an Indium-Magnesium phase diagram;

FIG. 28 is an Indium-Germanium phase diagram;

FIG. 29 is an Indium-Silver phase diagram;

FIG. 30 is an Indium-Copper phase diagram;,

FIG. 31 is a Tin-Bismuth phase diagram;

FIG. 32 is a Tin-Zinc phase diagram;

FIG. 33 is a Tin-Magnesium phase diagram;

FIG. 34 is a Tin-Germanium phase diagram;

FIG. 35 is a Tin-Silver phase diagram;

FIG. 36 is a Tin-Copper phase diagram; and

Figure 37A:
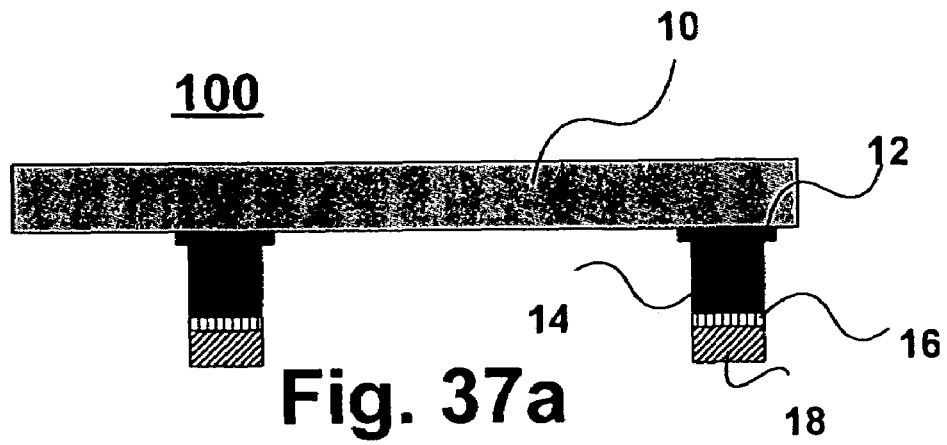
Figure 37B:
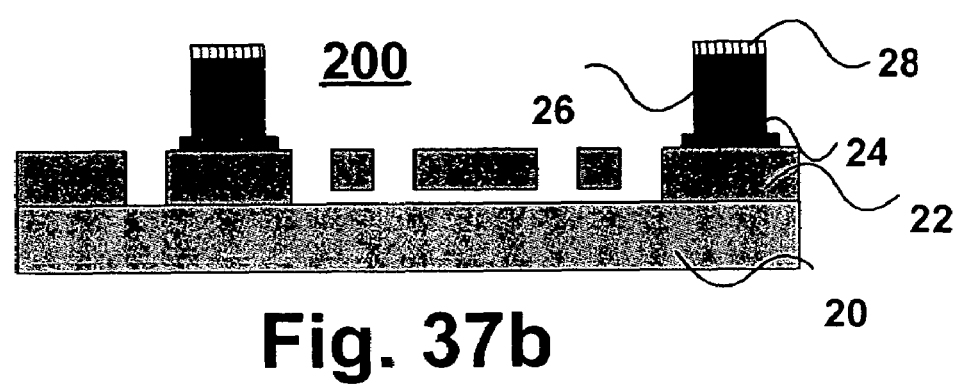
Figure 37C:
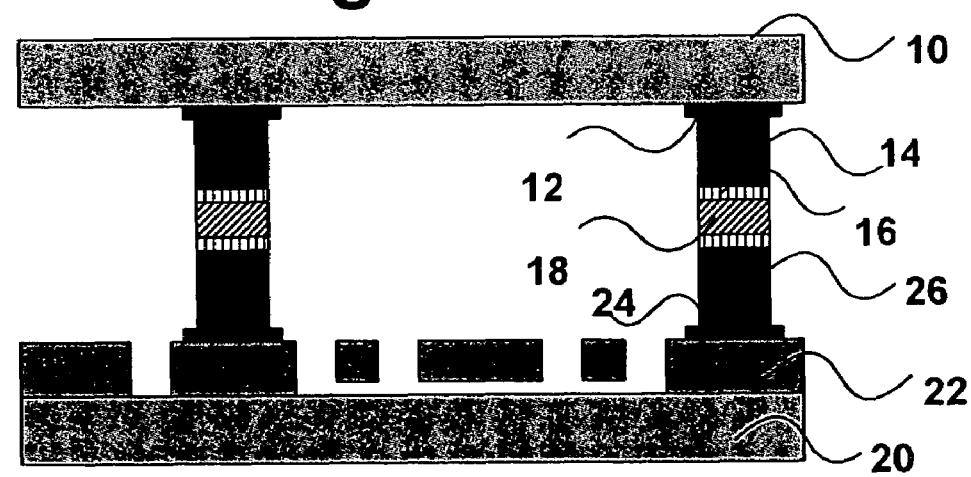

FIGS. 37a to 37c show the bonding of the "MEMS wafer" to the "LID wafer" to create the hermetic cavity around the mechanical part of the MEMS device in accordance with the principles of the invention.

DETAILED DESCRIPTION OF THE PREFERRED EMBODIMENTS

Electroless plating is a known technique allowing the plating of metals and/or alloys without the need for the continuous seed layer to be removed after plating. The simplest form of electroless plating is the so-called metal displacement oxidation/reduction reaction. An example of such metal displacement reaction is readily observed when a zinc metal is immersed in a copper sulfate solution: The zinc atoms (less noble) dissolve into the solution and are spontaneously replaced by copper atoms from the solution. This metal displacement reaction is the result of two simultaneous reactions: The zinc anodic oxidation reaction:

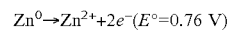

$$Zn^0 \rightarrow Zn^{2+}+2e^-(E°=0.76\ V)$$

and the copper cathodic reduction reaction:

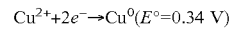

$$Cu^{2+}+2e^- \rightarrow Cu^0(E°=0.34\ V)$$

The resulting metal displacement autocatalytic reaction:

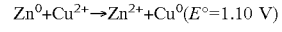

$$Zn^0+Cu^{2+} \rightarrow Zn^{2+}+Cu^0(E°=1.10\ V)$$

means that the exposed surface of zinc metal to the copper sulfate solution spontaneously results in the displacement of the zinc surface by a copper surface. Initially, this is observed as a mosaic of anodic (zinc) and cathodic (copper) sites until almost the entire substrate is covered with copper. At this point, the oxidation of the zinc anode virtually stops and the copper plating process ceases.

Like the plating of copper, the plating of nickel under-structures by metal displacement is limited to deposits of only about 0.2 μm thickness. In order to continuously build thicker deposits of electroless nickel under-structures to form the seal ring of wafer-level packages it is essential to sustain the anodic oxidation reaction ($Ni^{2+} \rightarrow 2e^- + Ni$).

As shown in the following references: S. M. Monir Vaghefi et Al, "The effect of agitation on electroless nickel-phosphorus-molybenum disulfide composite plating", Metal Finishing, Vol. 95, No. 6, June 1997; Suwanna Jittinorasett, "UBM Formation on Single Die/Dice for Flip Chip Applications", Master Thesis, Science in Electrical Engineering, Virginia Polytechnic Institute and State University, Aug. 25, 1999; George Di Bari, "Autocatalytic (Electroless) nickel—Solutions and properties", Nickel Currents, an international newsletter on nickel plating published occasionally by Inco, Vol. 6, No. 2, Fall 1999; Qi Guojun, "Wafer Bumping Technology Development", SIMTech technical report PT/00/002/ST published by the Singapore Institute of manufacturing technologies—Surface technology group—Process technology division, 2000; Fujio Matsui, Shogo Kawasaki, and Hiromu Inagawa, "Electroless Ni—P plating with continuously controlled constituents", 200th meeting, C. Uyemura & Co., Ltd. Central R & D Lab., 1-5-1, Deguchi, Hirakata, 573-0065 Japan; Soo-Jin Park, Yu-Sin Jang and Junjiro Kawasaki, "Studies on Nanoscaled Ni—P Plating of Carbon Fiber Surfaces in a Composite System", Carbon Science, Vol. 3, No. 2 June 2002 pp. 77-79; Ray Taheri, "Evaluation of electroless nickel-phosphorus coatings", Ph.D. Thesis, Mechanical Engineering, College of graduate studies and research, University of Saskatchewan, Saskatoon, Spring 2003; the sodium hypophosphite electroless nickel process uses an aqueous solution of two salts: Nickel sulfate hexahydrate ($NiSO_4 \cdot 6H_2O$); Sodium hypophosphate ($NaH_2PO_2 \cdot H_2O$); to eliminate the plated thickness limitation of the metal displacement reaction since this electroless reaction is capable of a sustained plating of nickel under-structures resulting from the replenishing effect of the dissolved nickel sulfate hexahydrate salt in the solution, a continuous source of nickel replacing the nickel that has been plated. This autocatalytic nickel plating process is the result of a series of electrochemical reactions involving the sustained catalyzed reduction of the $Ni^{+2}$ cations by the $H_2PO_2^-$ anions produced by the mixed aqueous solution of the two salts, namely The production of nickel cations, $Ni^{+2}$, from the nickel sulfite:

$$NiSO_4 \rightarrow Ni^{+2} + SO_4^{-2}$$

The production of hypophosphite anions, $H_2PO_2^-$, from the sodium hypophosphite:

$$2NaH_2PO_2 \rightarrow 2Na^+ + 2H_2PO_2^-$$

This process results in the electroless plating of nickel metal containing a small amount of phosphorus at interfaces with the plating solution which is capable of charge and ion exchanges:

$$2H_2PO_2^-\text{(at interface)} \rightarrow 2HPO_2^-\text{(at interface)} + H_2\uparrow \text{(from interface)}$$

$$2H_2O \rightarrow 2H^+\text{(from interface)} + 2OH^-\text{(from interface)}$$

$$2HPO_2^-\text{(at interface)} + 2OH^-\text{(at interface)} \rightarrow 2H_2PO_3^-\text{(from interface)} + 2e$$

$$Ni^{+2}\text{(at interface)} + 2e\text{(at interface)} \rightarrow Ni^0\text{(on interface)}$$

$$2H^+\text{(at interface)} + SO_4^{-2}\text{(at interface)} \rightarrow H_2SO_4\text{(from interface)}$$

$$2Na^+\text{(at interface)} + 2H_2PO_3^-\text{(at interface)} \rightarrow 2NaH_2PO_3\text{(from interface)}$$

resulting in the following autocatalytic nickel plating reaction:

$$NiSO_4 + 2NaH_2PO_2 + 2H_2O \rightarrow Ni^0 + H_2SO_4 + 2NaH_2PO_3 + 2H_2\uparrow$$

The heterogeneous reactions outlined above are autocatalytic on these interfaces capable of ion and electron exchanges with the plating solution. Hence, electroless plating of nickel under-structures occurs only on these specific surfaces. The catalyzed reduction of the $Ni^{+2}$ cations by the $H_2PO_2^-$ anions at these interfaces begins spontaneously on certain metals and on almost all metals of Group VIII of the periodic table (Fe, Co, Ni, Rh, Pd, Pt) which are well known as hydrogenation-dehydrogenation catalysts. Metals that are more electropositive than nickel, such as aluminium, will first displace nickel from a solution of its $Ni^{+2}$ ions, thus forming the nickel catalytic surface: i.e. when exposed aluminum surfaces are electroless plated with nickel under-structures, the initial phase of the deposition process is a displacement reaction similar to the upper-described copper-zinc displacement reaction.

The sustained reduction of the $Ni^{+2}$ cations by the $H_2PO_2^-$ anions at the exposed interfaces takes place in most cases at temperatures between 70° C. and 93° C. as well as pH conditions between 4.2 to 6.5. The electrolyte must be balanced regarding the content of nickel sulfite (consumed), of sodium hypophosphite (transformed into sodium orthophosphite, $NaH_2PO_3$) and of $OH^-$ ions (the consumption of nickel sulfite induces the formation of sulphuric acid, $H_2SO_4$, accumulating in the bath thus decreasing the pH, thus lowering the formation of the required $OH^-$ ions and slowing-down the plating rate). The addition of an alkaline medium, such as ammonium hydroxide, $NH_4OH$, allows the pH stabilization to its nominal value. An electroless nickel bath having initially 7 g/l of nickel sulfite produces approximately 28 g/l of sodium orthophosphite as by-product of the electroless plating reaction. In order to maintain the nickel content and the plating rate of the plating bath, it is necessary to continuously add nickel sulfate, $NiSO_4.6H_2O$, into the plating solution but the continuous formation of undesirable sodium orthophosphite and the need to add balancing ammonium hydroxide and other similar stabilizers gradually worsens the characteristics of the plating solution and of the plated nickel under-structures. Therefore electroless nickel plating solutions have a limited life measured by the number of "Metal Turn-Overs", MTOs; i.e. the number of complete bath replenishments made using nickel sulfate salts to recharge the bath to the 7 g/l nickel concentration. Electroless nickel baths made using nickel sulfate and sodium hypophosphate salts typically have a very short bath life of about 5-8 MTOs.

This autocatalytic electroless plating of nickel under-structures involving the use of hypophosphite anions, $H_2PO_2^-$, produced by a sodium hypophosphite, $2NaH_2PO_2$, in aqueous solution and capable of sustained reduction of the $Ni^{+2}$ cations prevents the use of the continuous seed layer but does not solve the problem associated with sodium, this undesirable mobile ion inducing threshold voltage shifts of CMOS and high-voltage CMOS devices as well as dark-current issues in CCD devices. The use of autocatalytic electroless nickel processes involving the use of sodium-, potassium- or lithium-based salts such as sodium hypophosphite must be avoided for the production of nickel under-structures of wafer-level packages for advanced MEMS fabricated in manufacturing facilities involved in such processes and for advanced MEMS integrating MEMS, CMOS, high-voltage CMOS and/or CCD components.

Since the sodium hypophosphite electroless plating of nickel under-structures is incompatible with the production of wafer-level packages for advanced MEMS integrating MEMS, CMOS, high-voltage CMOS and/or CCD components, it is necessary to eliminate the sodium ions from the plating solution.

One elegant alternative is the replacement of the sodium hypophosphate salt by the nickel hypophosphate salt to replace the sodium hypophosphite by nickel hypophosphite into the plating solution. The resulting autocatalytic nickel plating process is the result of a new series of electrochemical reactions involving the catalyzed reduction of the $Ni^{+2}$ cations by the $H_2PO_2^-$ anions produced by the nickel hypophosphite:

The production of nickel cations, $Ni^{+2}$, from the nickel sulfite:

$$NiSO_4 \rightarrow Ni^{+2} + SO_4^{-2}$$

The production of hypophosphite anions, $H_2PO_2^-$, from the nickel hypophosphite:

$$Ni(H_2PO_2)_2 \rightarrow Ni^{+2} + 2H_2PO_2^-$$

Metal nickel is again electroless plated at interfaces with the plating solution which are capable of charge and ion exchanges:

$$2H_2PO_2^-\text{(at interface)} \rightarrow 2HPO_2^-\text{(from interface)} + H_2\uparrow\text{(from interface)}$$

$$2H_2O \rightarrow 2H^+\text{(from interface)} + 2OH^-\text{(from interface)}$$

$$2HPO_2^-\text{(at interface)} + 2OH^-\text{(at interface)} \rightarrow 2H_2PO_3^-\text{(from interface)} + e$$

$$Ni^{+2}\text{(at interface)} + 2e\text{(at interface)} \rightarrow Ni^0\text{(on interface)}$$

$$2H^+\text{(at interface)} + SO_4^{-2}\text{(at interface)} \rightarrow H_2SO_4\text{(from interface)}$$

$$Ni^{+2}\text{(at interface)} + 2H_2PO_3^-\text{(at interface)} \rightarrow Ni(H_2PO_3)_2\text{(from interface)}$$

resulting in the following autocatalytic nickel plating reaction:

$$NiSO_4 + Ni(H_2PO_2)_2 + 2H_2O \rightarrow Ni^0 + H_2SO_4 + Ni(H_2PO_3)_2 + H_2\uparrow$$

Again, the heterogeneous reactions outlined above are autocatalytic on these interfaces capable of ion and electron exchanges with the plating solution and metals that are more electropositive than nickel, such as aluminum, will first displace nickel from a solution of its $Ni^{+2}$ ions, thus forming the nickel catalytic surface: i.e. when exposed aluminum surfaces are plated with electroless nickel under-structures, the initial phase of the deposition process is the a displacement reaction similar to the upper-described copper-zinc displacement reaction.

This autocatalytic electroless plating of nickel under-structures involving the use of hypophosphite anions, $H_2PO_2^-$, produced by a nickel hypophosphite, $Ni(H_2PO_2)_2$ in aqueous solution to reduce the $Ni^{+2}$ cations and deposit a metal nickel under-structure without the use of the continuous seed layer solves the problem associated with sodium, this undesirable mobile ion inducing threshold voltage shifts of CMOS and high-voltage CMOS devices as well as dark-current issues in CCD devices.

Unfortunately, as the plating of electroless nickel under-structures proceeds, the oxidation of nickel hypophosphite, $Ni(H_2PO_2)_2$, results in the gradual formation of a white slurry-like deposit into the plating solution, the nickel orthophosphite, $Ni(H_2PO_3)_2$. More, it also results in the transformation of nickel sulfite into sulfuric acid, $H_2SO_4$, and sulfates accumulating in the bath as contaminants decreasing the pH, thus lowering the formation of the required $OH^-$ ions and slowing-down the plating rate. The result of this accumulation of contaminants is an undesirable drift of the properties of the plating bath and of the mechanical properties of the plated nickel under-structures imposing a very frequent need to replace the plating bath; i.e. a short bath life of about 5-8 MTOs. The resulting situation is a massive production of hazardous waste water containing high concentrations (over 200,000 ppm) of residual nickel hypophosphites, of produced nickel orthophosphates, of sulphuric acid and of various sulfates.

An analysis of the upper electrochemical reactions shows that the sulfate does not in fact contribute anything in the reactions since the produced sulfite ions do not contribute anything to the plating of metal nickel:

$$NiSO_4 \rightarrow Ni^{+2} + SO_4^{-2}$$

$$2H^+(\text{at interface}) + SO_4^{-2}(\text{at interface}) \rightarrow H_2SO_4(\text{from interface})$$

In fact, the sulfite ions cause an instability of the electroless plating solution and a reduction of the bath life. It should therefore be eliminated.

The use of autocatalytic nickel electroless processes involving the use of nickel sulfate is undesirable for the production of reproducible mechanical properties of nickel under-structures involved in wafer-level packages of advanced MEMS.

Even if $Ni^{+2}$ cations could be obtained from the nickel sulfate salt in solution, nickel sulfite-based electroless nickel processes result in sulfuric acid and other undesirable sulfate by-products which cause unstable plating processes and short MTOs. It is then desirable to get rid of this nickel sulfate salt.

A replacement nickel salt, nickel chloride, could not be used to plate nickel under-structures over exposed aluminium surfaces and/or aluminium interconnects because the chloride anion will act deleteriously on these exposed aluminium surfaces and/or aluminium interconnects.

The ideal source of nickel ions is nickel hypophosphite, $Ni(H_2PO_2)_2$, which eliminates the formation of sulfuric acid, other undesirable sulfates and the need for the addition of sulfate anions. The use of nickel hypophosphite as a dual source (source of $Ni^0$ metal nickel as well as source of reducing $H_2PO_2^-$ anion) increases the stability and reduces the change-out frequency of the electroless nickel plating bath as well as increases the number of MTOs since there are no sulfates involved and much less undesirable by-products formation from the following chemical reactions:

The production of nickel cations, $Ni^{+2}$, from a nickel hypophosphite molecule:

$$Ni(H_2PO_2)_2 \rightarrow Ni^{+2} + 2H_2PO_2^-$$

The production of hypophosphite anions, $H_2PO_2^-$, from another nickel hypophosphite molecule (the italic characters are used here to track the constituting elements in the following electrochemical reactions):

$$Ni(H_2PO_2)_2 \rightarrow Ni^{+2} + 2H_2PO_2^-$$

Metal nickel is again electroless plated at interfaces with the plating solution which are capable of charge and ion exchanges:

$$2H_2PO_2^-(\text{at interface}) \rightarrow 2HPO_2^-(\text{from interface}) + H_2\uparrow(\text{from interface})$$

$$2H_2O \rightarrow 2H^+(\text{from interface}) + 2OH^-(\text{from interface})$$

$$2HPO_2^-(\text{at interface}) + 2OH^-(\text{at interface}) \rightarrow 2H_2PO_3^-(\text{from interface}) + 2e$$

$$Ni^{+2}(\text{at interface}) + 2e(\text{at interface}) \rightarrow Ni^0(\text{on interface})$$

$$2H^+(\text{at interface}) + 2H_2PO_2^-(\text{at interface}) \rightarrow 2H_3PO_2(\text{from interface})$$

$$Ni^{+2}(\text{at interface}) + 2H_2PO_3^-(\text{at interface}) \rightarrow Ni(H_2PO_3)_2(\text{from interface})$$

resulting in the following autocatalytic nickel plating reaction:

$$Ni(H_2PO_2)_2 + Ni(H_2PO_2)_2 + 2H_2O \rightarrow Ni^0 + 2H_3PO_2 + Ni(H_2PO_3)_2 + H_2\uparrow$$

Again, the heterogeneous reactions outlined above are autocatalytic on these interfaces capable of ion and electron exchanges with the plating solution and metals that are more electropositive than nickel, such as aluminium, will first displace nickel from a solution of its $Ni^{+2}$ ions, thus forming the nickel catalytic surface.

The above-described autocatalytic electroless plating of nickel under-structures involving the use of the hypophosphite anion, $H_2PO_2^-$, produced by a nickel hypophosphite, $Ni(H_2PO_2)_2$, molecule in aqueous solution to reduce the $Ni^{+2}$ cations produced by another nickel hypophosphite molecule in the same aqueous solution to electroless plate nickel under-structures without the use of the continuous seed layer of solve the problem associated with sulfates and sulphuric acid formation:

$$Ni(H_2PO_2)_2 + Ni(H_2PO_2)_2 + 2H_2O \rightarrow Ni^0 + 2H_3PO_2 + Ni(H_2PO_3)_2 + H_2\uparrow$$

As for the nickel sulfate process, the oxidation of nickel hypophosphite, $Ni(H_2PO_2)_2$, results in the formation of nickel orthophosphite, $Ni(H_2PO_3)_2$, this white slurry-like by-product precipitating into the plating solution. The consumption of nickel from the nickel hypophosphite also produces hypophosphite acid, $H_3PO_2$, which accumulates in the bath as a contaminant decreasing the pH, thus lowering the formation of the required OH⁻ ions and slowing-down the plating rate. The progressive adding of compensating chemicals to maintain the pH and to stabilize the plating rate changes the mechanical properties of the electroless plated nickel under-structures and reduces the bath life, i.e. the number of Metal Turn-Overs, MTOs.

The use of a purification system to eliminate the nickel orthophosphite from the plating solution is then required as to ensure stable processing and a long bath life. The use of autocatalytic nickel electroless processes involving the use of sulfate-free and sodium-free nickel hypophosphite process without hypophosphite bath life extension techniques is to be avoided for the production of reproducible mechanical properties of nickel under-structures involved in wafer-level packages of advanced MEMS.

The use of nickel hypophosphate salts as source of $Ni^0$ metal nickel as well as source of reducing $H_2PO_2^-$ anion increases the stability and reduces the change-out frequency of the electroless nickel plating bath as well as increases the number of MTOs because no sulfates are involved and much less undesirable by-products are formed as the result of the electroless plating.

The electroless plating of nickel under-structures from nickel hypophosphite nevertheless results in its oxidation and in the formation of this white slurry-like nickel orthophosphite by-product precipitating into the plating solution.

The consumption of nickel also produces hypophosphite acid, $H_3PO_2$, which accumulates in the bath as a contaminant decreasing the pH, thus lowering the formation of the required OH⁻ ions and slowing-down the plating rate:

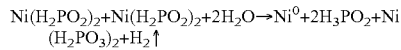

To maintain the pH and to stabilize the plating rate, compensating alkali chemicals, such as ammonium hydroxide, $NH_4OH$, are progressively added.

These gradually change the chemical composition of the electroless plating bath resulting in a progressive change of the mechanical properties of the electroless plated nickel under-structures. This reduces the bath life, i.e. the number of Metal Turn-Overs, MTOs, of the electroless plating bath The following prior art references show that the use of an hypophosphite bath life extension technique called "ElectroDialysis for Electroless Nickel" (EDEN), a regenerative electroless nickel technique, provides a way to prevent this undesirable accumulation of by-products in the plating bath and the associated drift of the mechanical properties of the electroless plated nickel under-structures. The result is a continuous regeneration of the electroless nickel bath observed as a stabilization of the electroless plating process and a spectacular increase of the Metal Turn-Over number, from about 8 to 100 or more: J. Cl. Puippe, "Les perspectives de la galvanotechnique en Suisse", Conf&ence : "L'avenir de la technique des traitements de surface en Suisse: chances et devoirs", Fondation Suisse pour les traitements de surfaces, Mittwoch, May 21st 2003—Kursaal Bern; "The ElectroDialysis for Electroless Nickel (EDEN) process", Atotech Innovation.

FIG. 8, which is a re-sketch taken from the above-cited J. Cl. Puippe reference, shows the improvement made by the EDEN bath life extension process on the life of electroless nickel bath: From about 200 g/l of cumulated orthophosphite, or about 7 MTOs (at 28 g/l of orthophosphite per MTO) without EDEN to an extended equivalent concentration of orthophosphite (removed by electrodialysis) of more than 2.5 kg/l, or more than 100 MTOs using EDEN life extension electrodialysis to remove the orthophosphite. This spectacular reduction of plating chemicals by more than 90% is also associated to a more stable electroless plating process, as evidenced by the very stable plating rate over these 100 MTOs.

Unfortunately, FIG. 9 shows that this particular EDEN life extension process cannot be used for the stable production of electroless nickel under-structures involved in wafer-level packages of advanced MEMS involving CMOS, high-voltage CMOS and/or CCD devices because its operation is based on the use of sodium hydroxide, NaOH: A generator of unfriendly sodium mobile ions.

The use of autocatalytic nickel electroless processes involving the use of sulfate-free and sodium-free nickel hypophosphite process with an electrodialysis-based hypophosphite bath life extension technique is to be avoided for the production of reproducible mechanical properties of nickel under-structures involved in wafer-level packages of advanced MEMS involving CMOS, high-voltage CMOS and/or CCD devices because the electrodialysis technique implies the use of sodium hydroxide, NaOH, generator of unfriendly sodium mobile ions.

The following references report the use of a sodium-free hypophosphite bath life extension technique called "Enfinity". This CMOS-friendly regenerative electroless nickel technique also prevents the undesirable accumulation of by-products in the plating bath and the associated drift of the mechanical properties of electroless plated nickel under-structures: Product Finishing Magazine, Proceedings, EN 93, Nov. 10-12, 1993; "Joint Service Pollution Prevention Opportunity Handbook", "Electroless Nickel Bath Life Extension" section (1-02-1), SP-2020-ENV Handbook prepared by Naval Facilities Engineering Service Center (NFESC), Pollution Prevention Opportunities, Code 423, 1100 23rd Avenue Bldg. 1500, Port Hueneme, Calif. 93043-4370. Handbook released in March 1997 under the direction of the Office of the Chief of Naval Operations (CNO-N45) and the Naval Facilities Engineering Command (NAVFAC), the Air Force Center for Environmental Excellence (AFCEE), the Army Environmental Center (AEC), Headquarters Marine Corps (HQMC), the Defence Logistics Agency (DLA), and the Coast Guard (USCG); "Electroless Nickel Plating Bath Rejuvenation", Tinker Air Force Base Public Website.

The "Enfinity" electroless nickel process uses nickel hypophosphite, $Ni(H_2PO_2)_2$, as source of metal and as reducing agent, ammonium hydroxide, $NH_4OH$, as pH adjuster and trace amount of hydroxy-2 ethylene diamine triacetic acid (HEEDTA), $C_{10}H_{18}O_7N_2$, a safe high-melting-point organic acid. This electroless nickel plating solution DOES NOT use any sodium hypophosphite, $NaH_2PO_2$, or nickel sulfate, $NiSO_4$, as reducer and source of metal and then eliminates two of the three ions by-products (sodium and sulfate). The third ion, orthophosphite, is removed using a simple chemical reaction with calcium hydroxide, CaOH, and the treated solution is returned to the process cell to adjust the pH. In order for the electroless nickel bath to be stable over 8000 MTOs, orthophosphite ions and trace contaminants (Na, Ca, Pb, Mo) must be removed and all other useful ions must be balanced using a reactor, an ion exchange ceramic filter, a centrifuge and four primary materials continuously added to the process that treats a small portion of the plating solution: Nickel hypophosphite, ammonium hydroxide, calcium hydroxide and carbon dioxide which treats the calcium hydroxide and maintains the calcium level to less than about 30 ppm. Periodically the purified solution is centrifuged removing the calcium orthophosphite as a solid which is discharged from the centrifuge as a slurry. This non-hazardous calcium orthophosphite slurry also contains trace amounts of nickel.

The process is controlled tightly via the monitoring of the process temperature, of the process pH at about 4.8 (via an automatic sampling), of the nickel and hypophosphite concentrations (using an automatic titration every 15 minutes), of the water level, of the process pressure and of the hydrogen evolution of the exhaust flow (for operator safety).

The calcium-hydroxide based "Enfinity" life extension process CAN be used for the stable production of electroless nickel under-structures involved in wafer-level packages of advanced MEMS involving CMOS, high-voltage CMOS and/or CCD devices.

The use of autocatalytic nickel electroless processes involving the use of sulfate-free and sodium-free nickel hypophosphite process with a sodium-free hypophosphite bath life extension technique is to be used for the production of reproducible mechanical properties of nickel under-structures involved in wafer-level packages of advanced MEMS involving CMOS, high-voltage CMOS and/or CCD devices.

Electroless nickel (and other electroless metals) is prone to oxidation upon exposure to air and forms a thin layer of a very stable oxide which prevents proper soldering to the solder of the "Lid wafer". Extremely corrosive fluxes, which would alleviate this problem, are unsuitable for wafer-level packages situations. This implies that electroless nickel cannot be used alone without a thin anti-oxidation layer as its oxide prevents proper solder wetting of the nickel surface.

A noble metal layer capable of metal displacement of the electroless nickel (or other electroless plated materials that are covered by the present patent application) would be efficient as anti-oxidation layer. Assuming for a moment that the noble metal is identified as Me, and that the selected under-layer material is nickel, then the metal displacement plating (also called immersion plating) reaction is the result of two simultaneous reactions: The anodic oxidation of "m" nickel atoms:

$$mNi^0 \rightarrow mNi^{2+} + 2me^- (E^\circ = m \text{ times the oxidation potential of nickel} = 0.79 \text{ m V})$$

and the cathodic reduction of "2" noble metal cations of "m" positive charges:

$$2Me^{m+} + 2me^- \rightarrow 2Me^0 (E^\circ = 2 \text{ times metal reduction potential})$$

resulting in the metal displacement autocatalytic reactions:

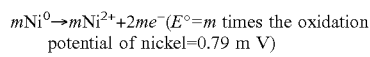

$$mNi^0 + 2Me^{m+} \rightarrow mNi^{2+} + 2Me^0 (E^\circ = 0.79 \, m+2 \text{ times metal reduction potential V})$$

This autocatalytic noble metal displacement reaction result in the displacement of the exposed surface of nickel metal atoms by the noble metal cations present in the electrolyte solution. Again, this immersion plating reaction is initially observed as a mosaic of anodic nickel and cathodic noble metal sites until almost the entire substrate of nickel is covered with the noble metal. At this point, the oxidation of the nickel anode virtually stops and the noble metal plating process ceases.

The state of immersion plating of noble metals, of various sustained electroless plating of noble metals and of their suitability for the present invention will now be considered for each one of five noble metals: gold, palladium, platinum, rhodium and ruthenium. The metal displacement autocatalytic reactions are directly extracted from the oxidation-reduction potentials of the periodic table of the elements:

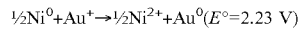

$$½Ni^0 + Au^+ \rightarrow ½Ni^{2+} + Au^0 (E^\circ = 2.23 \text{ V})$$

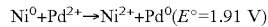

$$Ni^0 + Pd^{2+} \rightarrow Ni^{2+} + Pd^0 (E^\circ = 1.91 \text{ V})$$

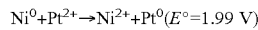

$$Ni^0 + Pt^{2+} \rightarrow Ni^{2+} + Pt^0 (E^\circ = 1.99 \text{ V})$$

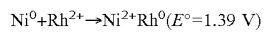

$$Ni^0 + Rh^{2+} \rightarrow Ni^{2+} + Rh^0 (E^\circ = 1.39 \text{ V})$$

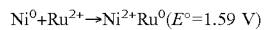

$$Ni^0 + Ru^{2+} \rightarrow Ni^{2+} + Ru^0 (E^\circ = 1.59 \text{ V})$$

A review of the immersion and electroless plating of these five noble metals identifies the limitations of these technologies and some of the incompatibilities with wafer-level packages of advanced MEMS involving CMOS, high-voltage CMOS and/or CCD devices.

FIG. 10 shows a prior art process using immersion and/or electroless gold as an anti-oxidation protective layer. This process consists of the following steps:

1: Provision of MEMS substrate
2: Sacrificial layer deposition and patterning to open structural layer anchors to substrate
3: Structural layer deposition and patterning
4: Continuous and unbroken seed layer deposition (difficult seed layer coverage on the sidewalls of topography: More topography means worse coverage and poorer local electrical conductivity)
5: Polymer deposition, exposure, develop (difficult to fill high aspect ratio regions with polymer where a minimum gap is present between two adjacent surfaces of the continuous and unbroken seed layer, thus resulting in potential undesirable loss of adhesion of polymer and undesirable plating)
6: Selective nickel electrolytic plating over the continuous and unbroken seed layer in exposed regions of the polymer pattern
7: Removal of patterned polymer in an oxygen-containing ambient (thus resulting in undesirable nickel oxidation)
8: Removal of exposed continuous and unbroken seed layer in the region previously coated by the polymer (thus resulting in undesirable undercut due to the need to ensure complete elimination of this electrically conductive seed layer between the nickel patterns)
9: Mechanical release of the suspended structures by removal of the sacrificial layer The immersion and/or electroless plating of the noble metal layer on the top of the electroless nickel prevents the oxidation of the top surface of nickel and enhances the adhesion of the solder to this top nickel surface by allowing proper wetting and soldering to the noble metal layer.

The reaction describing the nickel displacement by gold:

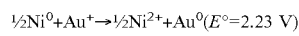

$$½Ni^0 + Au^+ \rightarrow ½Ni^{2+} + Au^0 (E^\circ = 2.23 \text{ V})$$

indicates that two gold atoms are required to displace one nickel atom. Immersion gold displacement of nickel is certainly one of the most popular technique to allow a solderable nickel surface. The state of immersion gold process over electroless nickel, also called "Electroless Nickel Immersion Gold" or ENIG is reviewed by citing the following Prior Art references: U.S. Pat. No. 6,405,592 titled "Hermetically-sealed sensor with a movable microstructure"; U.S. Pat. No. 6,479,320 titled "Vacuum package fabrication of micromechanical system devices with integrated circuit components"; Liz Harriman, "Lead-Free Electronics", NEWMOA Annual Conference, November 2001; Paul Goodman, "Current and future uses of gold in electronics", Gold Bulletin 2002, 35/1, p.21; "Surface Finish Options", The Newsletter of PWB Technologies, May 2002; William J. Kabai, "Product Change Notification—Lead Free Products", 25 Oct. 2002; Electroless Ni/Au U.S. Pat. No. 6,405,592 StMicroelectronics ; Alison Winlow, "Surface Finishing", TWI World Centre for Materials Joining Technology, Feb. 6, 2003.

Unfortunately, this process is not satisfactory gold is not compatible with CMOS, high-voltage CMOS and CCD. It is necessary to find another noble metal than gold.

The reaction describing the nickel displacement by palladium:

$$Ni^0+Pd^{2+} \rightarrow Ni^{2+}+Pd^0 (E°=1.91 \text{ V})$$

indicates that only one palladium atom is required to displace one nickel atom. Palladium can also be electroless plated from various chemical solutions over the electroless nickel. The following references relate to immersion and/or electroless palladium: U.S. Pat. No. 5,292,361 titled 'Electroless palladium plating composition; Peter Bratin, Michael Pavlov and Gene Chalyt, "Evaluating finishes using SERA", PC FAB Magazine, May 1999; Don Baudrand, "Electroplating/Electroless Plating for Electronic Applications", Product Finishing Magazine, December 1999; S. V. Sattiraju, R. W. Johnson, D. Z. Genc and M. J. Bozack, "Wetting performance vs. board finish and flux for several Pb-free solder alloys, 26th IEMT Symposium, PackCon 2000; "Implementing Cleaner Printed Wiring Board Technologies: Surface Finishes—Design for the Environment Printed Wiring Board Project", United States Environmental Protection Agency—Prevention, Pesticides And Toxic Substances, EPA 744-R-00-002, March 2000; Jiro Oi, "How a Component Supplier Is Getting the Lead Out", ROHM Electronics USA, Aug. 1, 2000; Y. S. Cheng, K. L. Yeung, "Effects of electroless plating chemistry on the synthesis of palladium membranes", Journal of Membrane Science 182 (2001) 195-203; "Alternative technologies for surface finishing—Cleaner Technologies for Printed Wiring Board Manufacturers", Office of Pollution Prevention and Toxics, EPA-744-R-01-001, June 2001; Bruce Houghton, "Testing BGAs With Different PWB Finishes: An ITRI Project", November 2001;

Unfortunately, it is known and reported in FIG. 11 that palladium is permeable to hydrogen and is subject to hydrogen-induced embrittlement: S. Tosti, L. Bettinali, C. Rizzello and V. Violante, "Membrane Technologies for Tritium Recovering in the Fusion Fuel Cycle", 15th IAEA TM on Research Using Small Fusion Devices (UUSFD), Vienna, Austria, May 19-21 1999; Jong-San Chang, Hyun-Seog Roh, Min Seok Park, and Sang-Eon Park, "Propane Dehydrogenation over a Hydrogen Permselective Membrane Reactor", Bull. Korean Chem. Soc. 2002, Vol. 23, No. 5; H. D. Tong, F. C. Gielens, H. T. Hoang, J. W. Berenschot, M. J. De Boer, J. G. E. Gardeniers, H. V. Jansen, W. Nijdam, C. J. M. van Rijn, M. C. Elwenspoek, "Micromachined Palladium—Silver Alloy Membranes for Hydrogen Separation", Proceedings of SeSens 2002, November 29, 2002—Veldhoven, the Netherlands; Fernando Roa, Michael J. Block, J. Douglas Way, "The influence of alloy composition on the $H_2$ flux of composite Pd—Cu membranes", Desalination 147 (2002) 411-416; Kaihu Hou and Ronald Hughes, "A comparative simulation analysis of propane dehydrogenation in composite and microporous membrane reactors", Journal of Chemical Technology and Biotechnology, 78:35-41, 2002; Daniel G. Löffler, Kyle Taylor, Dylan Mason, "A light hydrocarbon fuel processor producing high-purity hydrogen", Journal of Power Sources, in press; USA Patent Application 20030170528 titled "Moldable separator plate for electrochemical devices and cells"; REB Research & Consulting, "The permeability of hydrogen in aluminium, copper, iron, gold, kovar, niobium, palladium, platinum, silver, tantalum, titanium, and vanadium", http://www.rebresearch.com/H2perm2.htm.

Since wafer-level packages require to be hermetic, immersion and/or electroless palladium should be avoided as the anti-oxidation layer over electroless nickel in hermetically sealed wafer-level packages because its hydrogen permeation and hydrogen-induced embrittlement properties. It is necessary to find another noble metal than gold or palladium.

When exposed nickel surfaces are electroless plated with platinum, the initial phase of the deposition process is the nickel-platinum displacement reaction:

$$Ni^0+Pt^{2+} \rightarrow Ni^{2+}+Pt^0 (E°=1.99 \text{ V})$$

which indicates that only one platinum atom is required to displace one nickel atom. Unfortunately, this reaction stops when the platinum atoms cannot reach the underlying nickel surface anymore. In order to increase even more the thickness of the platinum anti-oxidation layer, platinum could be further reduced by one chemical of the solution itself as to achieve a sustained electroless platinum plating. Various chemical solutions are capable of this sustained electroless platinum, including alkali-based solutions, hydrazine-based solutions, chlorine-based solutions and others.

The following reference discloses an alkali-based immersion and/or electroless platinum solutions: U.S. Pat. No. 6,479,384 entitled "Process for fabricating a semiconductor device". This patent indicates that platinum can be electroless plated from the platinum sulfate tetrahydrate salt: Platinum sulfate $(Pt(SO_4)_2 \cdot 4H_2O)$.

One possible reducing chemical capable of reducing the platinum cations, $Pt^{+2}$, of the platinum sulfite solution is sodium hypophosphite obtained from the dissolution of sodium hypophosphate salt: Sodium hypophosphate $(NaH_2PO_2 \cdot H_2O)$.

This platinum sulfite and sodium hypophosphite solution could be used as a supplement to the limited platinum displacement reaction since it is capable of a sustained electroless plating of the anti-oxidation layer resulting from the replenishing effect of the dissolved platinum sulfate tetrahydrate salt in the solution, a continuous source of platinum replacing the platinum that has been plated. This autocatalytic platinum plating process is the result of a series of electrochemical reactions involving the sustained catalyzed reduction of the $Pt^{+2}$ cations by the $H_2PO_2^-$ anions produced by the mixed aqueous solution of the two salts.

Platinum cations, $Pt^{+2}$ can be produced from platinum sulfite by the following process, which results in the electroless plating of nickel metal containing a small amount of phosphorus at interfaces with the plating solution which are capable of charge and ion exchanges:

$$4NaH_2PO_2 \rightarrow 4Na^+ + 4H_2PO_2^-$$

$$4H_2PO_2^-\text{(at interface)} \rightarrow 4HPO_2^-\text{(at interface)} + 2H_2\uparrow \text{ (from interface)}$$

$$4H_2O \rightarrow 2H^+\text{(from interface)} + 4OH^-\text{(from interface)}$$

$$4HPO_2^-\text{(at interface)} + 4OH^-\text{(at interface)} \rightarrow 4H_2PO_3^- \text{ (from interface)} + 4e^-$$

$$Pt(SO_4)_2 + 2e^-\text{(at interface)} \rightarrow Pt^{+2}\text{(at interface)} + 2(SO_4)^{-2}\text{(at interface)}$$

$$Pt^{+2}\text{(at interface)} + 2e^-\text{(at interface)} \rightarrow Pt^0\text{(on interface)}$$

$$2H^+\text{(at interface)}+2SO_4^{-2}\text{(at interface)}\rightarrow 2H_2SO_4$$
$$\text{(from interface)}$$

$$4Na^+\text{(at interface)}+4H_2PO_3^-\text{(at interface)}$$
$$\rightarrow 4NaH_2PO_3\text{(from interface)}$$

resulting in the following autocatalytic nickel plating reaction:

$$Pt(SO_4)_2+4NaH_2PO_2+4H_2O\rightarrow Pt^0+2H_2SO_4+$$
$$4NaH_2PO_3+2H_2\uparrow$$

The heterogeneous reactions outlined above are autocatalytic on these interfaces capable of ion and electron exchanges with the plating solution. Hence, electroless plating of platinum occurs only on these specific surfaces.

The sustained reduction of the $Pt^{+2}$ cations by the $H_2PO_2^-$ anions requires the electrolyte to be balanced regarding the content of platinum sulfite (consumed), of sodium hypophosphite (transformed into sodium orthophosphite, $NaH_2PO_3$) and of $OH^-$ ions (the consumption of platinum sulfite induces the formation of sulphuric acid, $H_2SO_4$, accumulating in the bath thus decreasing the pH, thus lowering the formation of the required $OH^-$ ions and slowing-down the plating rate). The addition of an alkaline medium, such as ammonium hydroxide, $NH_4OH$, allows the pH stabilization to its nominal value. In order to maintain the platinum content and the plating rate of the plating bath, it is necessary to continuously add platinum sulfate, $Pt(SO_4)_2.4H_2O$, into the plating solution. The continuous formation of undesirable sodium orthophosphate and the need to add balancing ammonium hydroxide and other similar stabilizers gradually worsens the characteristics of the plated platinum layer. Therefore sulfite-based electroless platinum plating solutions have very limited numbers of "Metal Turn-Overs", MTOs.

The above-referenced patent, and many others involving sodium-based chemicals such as sodium hydroxide as pH adjuster, disodium hydrogen phosphate salt as reducing agent, sodium nitrite as stabilizer, or any other sodium-based chemicals used to enhance and/or stabilize the electroless reaction do generate undesirable sodium mobile cations, $Na^+$, and prevent the use of these sodium-based electroless plating solutions to plate electroless platinum over electroless nickel under-structures for wafer-level packages of advanced MEMS involving CMOS, high-voltage CMOS and/or CCD devices.

In order to ensure compatibility of the electroless plating with CMOS, high-voltage CMOS and CCD, alkali-based immersion and/or electroless platinum cannot be used as the anti-oxidation layer over electroless nickel.

The following patents disclose alkali-free (sodium-free, potassium-free and lithium-free) immersion and/or electroless plating solutions using hydrazine, $N_2H_4$, or hydrazine hydrate, $N_2H_4.H_2O$, as reducing agent in electroless plating of palladium: U.S. Pat. No. 3,562,911 titled "Method and composition for platinum plating and articled plated therewith"; U.S. Pat. No. 4,261,800 titled "Method of selectively depositing a metal on a surface of a substrate"; U.S. Pat. No. 5,288,313 titled "Electroless plating catalyst"; U.S. Pat. No. 6,391,477 titled "Electroless autocatalytic platinum plating"; U.S. Pat. No. 6,534,117 titled "Electroless plating method and electroless plating solution";

Taking as example Koslov's U.S. Pat. No. 6,391,477, platinum can effectively be electroless plated using an acidic solution made of a water-soluble platinum salt such as diamminebis(nitro-N,N)platinum (DNP), $Pt(NH_3)_2(NO_2)_2$, as source of platinum, hydrazine hydrate, $N_2H_4.H_2O$, as reducing agent added just before plating as well as acetic acid, $CH_3COOH$, or nitric acid, $HNO_3$, as pH adjuster. The big advantage of this acidic electroless plating solution over the other alkaline electroless solutions is the elimination of the sodium mobile cations, $Na^+$, which allow the plating of electroless platinum over electroless nickel under-structures for wafer-level packages of advanced MEMS involving CMOS, high-voltage CMOS and/or CCD devices.

Unfortunately, even though these plating solutions do eliminate the alkali ions incompatibility with CMOS, high-voltage CMOS and/or CCD devices, the use of hydrazine again precludes the use of these electroless platinum techniques because of health and safety hazards. The following material safety data sheets (MSDS) for hydrazine hydrate show an IDHL (Immediately Dangerous To Life or Health) concentration of only 50 ppm which indicates that hydrazine and hydrazine hydrate are an extremely toxic chemicals for humans (NIOSH recommends that the "most protective" respirators be worn for hydrazine at concentrations above 0.03 ppm) and should be avoided to in electroless plating baths.

To ensure safe operation of the immersion and/or electroless plating, hydrazine-based immersion and/or electroless platinum should be avoided as the anti-oxidation layer over electroless nickel.

To ensure compatibility of the immersion and/or electroless plating with CMOS, high-voltage CMOS and CCD, and safe operation of the immersion and/or electroless plating baths it is necessary to use alkali-free (sodium-free, potassium-free, lithium-free) and hydrazine-free immersion and/ or electroless plating solutions. Various chlorinated solutions have been described in the prior art to this invention: U.S. Pat. No. 3,961,109 titled "Sensitizers and process for electroless metal deposition"; U.S. Pat. No. 4,214,017 titled "Preparation of platinum-coated substrates"; U.S. Pat. No. 4,420,365 titled "Formation of patterned film over semiconductor structure"; U.S. Pat. No. 5,206,052 titled "Electroless plating process"; U.S. Pat. No. 5,254,156 titled "Aqueous solution for activation accelerating treatment"; U.S. Pat. No. 6,071,554 titled "Process for forming electrode for ceramic sensor element by electroless plating"; U.S. Pat. No. 6,183, 545 titled "Aqueous solutions for obtaining metals by reductive deposition"; U.S. Pat. No. 6,479,384 titled "Process for fabricating a semiconductor device"; and U.S. Pat. No. 6,503,343 titled "Controlled plating on reactive metals";

Unfortunately, a cost-effective and production worthy electroless plating process requires the sequential plating of the underlying nickel (or other under-layer material) and of the anti-oxidation layer of noble metal over the seed layer is an aluminium alloy which is very susceptible to corrosion when exposed to trace levels of chlorine. The chlorine-based immersion and/or electroless platinum plating solutions are then to be avoided to prevent corrosion and reliability issues in the field of advanced MEMS involving CMOS, high-voltage CMOS and/or CCD devices and thus aluminium-based interconnects.

In order to ensure compatibility of the immersion and/or electroless platinum plating baths with CMOS, high-voltage CMOS and CCD; hydrazine-free immersion and/or electroless platinum plating baths; and chlorine-free immersion and/or electroless platinum plating baths for corrosion-free and reliable advanced MEMS devices; it is necessary to use alkali-free (sodium-free, potassium-free, lithium-free), hydrazine-free and chlorine-free immersion and/or electroless platinum plating baths.

The following three patents disclose examples of sodium-free, potassium-free, lithium-free, hydrazine-free and chlorine free sulphur-based electroless platinum plating solutions: U.S. Pat. No. 5,384,284 titled "Method to form a low resistant bond pad interconnect"; U.S. Pat. No. 6,221,763 titled "Method of forming a metal seed layer for subsequent plating"; U.S. Pat. No. 6,489,235 titled "Method of forming a metal seed layer for subsequent plating";

The U.S. Pat. Nos. 6,221,763 & 6,489,235 describe an electroless platinum solution of platinum sulfate, $Pt(SO_4)_2$, and hydrofluoric acid, HF, resulting in the following electroless reactions:

$$4HF \rightarrow 4H^+(\text{at the surface}) + 4F^-(\text{at the surface})$$

$$2Ni + 4F^-(\text{at the surface}) \rightarrow 2NiF_2 + 4e^-(\text{at the surface})$$

$$Pt(SO_4)_2 + 4H^+(\text{at the surface}) \rightarrow Pt^{2+}(\text{at the surface}) + 2H_2SO_4$$

$$2H^+(\text{at the surface}) + 2e^-(\text{at the surface}) \rightarrow H_2\uparrow (\text{from the surface})$$

$$Pt^{2+}(\text{at the surface}) + 2e^-(\text{at the surface}) \rightarrow Pt^0(\text{at the surface})$$

with the net reaction being:

$$2Ni + Pt(SO_4)_2 + 4HF \rightarrow Pt^0 + 2H_2SO_4 + 2NiF_2 + H_2$$

This reaction is not a sustained electroless platinum plating because the platinum thickness is limited by the availability of the nickel surface and by the elimination of the nickel fluoride from the interface. This process is not that interesting compared to the direct displacement process:

$$Ni^0 + Pt^{2+} \rightarrow Ni^{2+} + Pt^0 (E^\circ = 1.99 \text{ V})$$

The U.S. Pat. No. 5,384,284 describes an electroless platinum solution of platinum sulfate, $Pt(SO_4)_2$, and ethylenediaminetetraacetic acid (EDTA, also called ethylenedinitrilotetracetic acid), $C_{10}H_{16}N_2O_8$. This solution is interesting because the following material safety data sheets (MSDS) show that EDTA is much more safe to use than hydrazine: EDTA MSDS from University of Oxford; EDTA MSDS from RPI; EDTA MSDS from J. T. Baker.

The immersion platinum process using an alkali-free, hydrazine-free and chlorine-free plating solution is: Compatible with CMOS, high-voltage CMOS and CCD; Safer to use than hydrazine-based solutions; Aluminium corrosion-proof because it is free from chlorine and probably reliable for advanced MEMS devices incorporating aluminium-based interconnects; and Capable of producing solderable nickel surfaces because over-coated with a thin layer of non-oxidable platinum;

The electroless platinum process using an alkali-free (sodium-free, potassium-free, lithium-free), hydrazine-free and chlorine-free platinum sulfate and EDTA based plating solution also has the same good characteristics and is also capable of thicker platinum deposits over electroless nickel under-layer material (or other under-layer material covered by this patent application).

Since platinum is a precious noble metal, it would be preferred (if possible) to use one of the other two possible noble metals: Rhodium or ruthenium. In that case, it is again required to use an alkali-free, an hydrazine-free and a chlorine-free plating solution of this other noble metal.

When exposed nickel surfaces are electroless plated with rhodium, the initial phase of the deposition process is the nickel-rhodium displacement reaction:

$$Ni^0 + Rh^{2+} \rightarrow Ni^{2+} + Rh^0 (E^\circ = 1.39 \text{ V})$$

which indicates that only one rhodium atom is required to displace one nickel atom of the surface to be plated. Unfortunately, this reaction stops when the rhodium atoms cannot reach the underlying nickel surface anymore. In order to increase even more the thickness of the rhodium anti-oxidation layer, rhodium could be further reduced by one chemical of the solution itself as to achieve a sustained electroless rhodium plating.

The following references describe the various immersion and/or electroless rhodium plating solutions: Germany Patent DE 2,607,988 titled "Verfahren zum stromlosen abscheiden der platinmetalle platin, palladium"; U.S. Pat. No. 4,361,602 titled "Method for production of positive electrode for electrolysis of water"; U.S. Pat. No. 6,455,175 titled "Electroless rhodium plating"; J. Strejcek describes in its German patent DE 2,607,988 his electroless rhodium plating solution.

Unfortunately, this plating solution is undesirable because: Rhodium trichloridtrihydral, $RhCl_3.3H_2O$, is used as source of rhodium, thus producing undesirable chlorine ions; Hydrazine monohydrate, $N_2H_4.H2O$ is used as reducing agent, thus causing an unsafe plating bath for the operators; Disodium hydrogen phosphate, $Na_2HPO_4.12H_2O$, is also used as reducing agent, thus a source of undesirable sodium cations; Sodium nitrite, $NaNO_2$, is used as stabilizer, thus another source of undesirable sodium cations.

A. S. Kozlov describes in his U.S. Pat. No. 6,455,175 his electroless rhodium plating solution. Unfortunately this plating solution is undesirable because: even if the Trinitrotriammin rhodium (III), $Rh(NH_3)_3(NO2)_3$, used as the rhodium-containing soluble compound is free of chlorine ions; even if the ammonium hydroxide, $NH_4OH$, used as buffer to control the pH is free of undesirable sodium cations; the hydrazine monohydrate, $N_2H_4.H2O$, is used as reducing agent and results in an unsafe plating bath for the operators.

E. Torikai describes in his U.S. Pat. No. 4,361,602 two electroless rhodium plating solutions: A DMAB-based plating solution which is undesirable because: even if the rhodium sulfate, $Rh(SO_4)_2.4H_2O$, used as the rhodium-containing soluble compound is free of alkali and chlorine ions; even if the ammonium hydroxide, $NH_4OH$, used as buffer to control the pH is free of undesirable sodium cations; dimethylamine borane (DMAB), $(CH_3)_2NHBH_3$, used as reducing agent is effectively free of alkali and chlorine ions but is as toxic as hydrazine, $N_2H_4$, as shown by the following Material Safety Data Sheets (MSDS): DMAB MSDS from Callery Chemicals; DMAB MSDS from Shipley Company; DMAB MSDS from University of Oxford.

An EDTA-based plating solution which is desirable because: the rhodium sulfate, $Rh(SO_4)_2.4H_2O$, used as the rhodium-containing soluble compound is free of alkali and chlorine ions; the ammonium hydroxide, $NH_4OH$, used as buffer to control the pH is free of undesirable sodium cations; the ethylenediaminetetraacetic acid (EDTA, also called ethylenedinitrilotetracetic acid), $C_{10}H_{16}N_2O_8$, used as the complexing agent is free of alkali and chlorine ions and is safer than hydrazine, $N_2H_4$, and safer than dimethylamine borane (DMAB), $(CH_3)_2NHBH_3$, as shown by the following material safety data sheets (MSDS): EDTA MSDS from University of Oxford; EDTA MSDS from RPI; EDTA MSDS from J. T. Baker;

The immersion rhodium process using an alkali-free, hydrazine-free and chlorine-free plating solution is: Compatible with CMOS, high-voltage CMOS and CCD; Safer to use than hydrazine-based solutions; Aluminium corrosion-proof because it is free from chlorine and probably reliable for advanced MEMS devices incorporating aluminium-based interconnects; Capable of producing solderable nickel surfaces because over-coated with a thin layer of non-oxidable rhodium.

The electroless rhodium process using an alkali-free (sodium-free, potassium-free, lithium-free), hydrazine-free and chlorine-free rhodium sulfate and EDTA based plating solution also has the same good characteristics and is also capable of thicker rhodium deposits over electroless nickel under-layer material (or other under-layer material).

There is another possible noble metal that could be immersion and/or electroless plated using an alkali-free, an hydrazine-free and a chlorine-free plating solution: Ruthenium.

When exposed nickel surfaces are electroless plated with rhodium, the initial phase of the deposition process is the nickel-ruthenium displacement reaction:

$$Ni^0 + Ru^{2+} \rightarrow Ni^{2+} + Ru^0 (E° = 1.59 \text{ V})$$

which indicates that only one ruthenium atom is required to displace one nickel atom of the surface to be plated. Unfortunately, this reaction stops when the ruthenium atoms cannot reach the underlying nickel surface anymore. In order to increase even more the thickness of the ruthenium anti-oxidation layer, ruthenium could be further reduced by one chemical of the solution itself as to achieve a sustained electroless ruthenium plating.

The following references describe the various immersion and/or electroless ruthenium plating solutions: U.S. Pat. No. 4,414,071 titled "Electrode"; U.S. Pat. No. 6,120,639 titled "Method for the manufacture of printed circuit boards".

D. S. Cameron describes in his U.S. Pat. No. 4,414,071 an electroless ruthenium plating solution made from ruthenium trichloride, $RuCl_3$, and hydrochloric acid, HCl, as to achieve ruthenium electroless plating at a pH of 1.8 and a temperature of 80° C. Unfortunately, the required cost-effective and production worthy electroless plating process should sequentially plate the underlying nickel (or other under-layer material covered by this patent application) and the ruthenium layer over a seed layer is an aluminium alloy which is very susceptible to corrosion when exposed to trace levels of chlorine. This chlorine-based electroless ruthenium plating solutions is then to be avoided as to prevent corrosion and reliability issues in the field of advanced MEMS involving CMOS, high-voltage CMOS and/or CCD devices and thus aluminium-based interconnects.

R. Redline describes in his U.S. Pat. No. 6,120,639 electroless ruthenium plating solutions made of ruthenium sulfate, $RuSO_4$, as source of ruthenium and of one of the following reducing agent: Sodium hypophosphite, $NaH_2PO_2$, which is undesirable due to the presence of mobile sodium ions and thus incompatible with CMOS, high-voltage CMOS and CCD; Potassium hypophosphite, $KH_2PO_2$, which is also undesirable due to the presence of mobile sodium ions and thus incompatible with CMOS, high-voltage CMOS and CCD; Sodium borohydride, $BNaH_4$, which is also undesirable due to the presence of mobile sodium ions and thus incompatible with CMOS, high-voltage CMOS and CCD; Dimethylamine borane (DMAB), $(CH_3)_2NHBH_3$, which is also undesirable because as toxic as hydrazine, $N_2H_4$, as shown by the following Material Safety Data Sheets (MSDS): DMAB MSDS from Callery Chemicals; DMAB MSDS from Shipley Company; DMAB MSDS from University of Oxford.

This ruthenium sulfate-based electroless ruthenium plating solutions is then to be avoided as to prevent mobile ions problems in advanced MEMS involving CMOS, high-voltage CMOS and/or CCD devices and thus aluminium-based interconnects. Moreover, it is to be avoided because unsafe for the health and safety of the operators of the electroless ruthenium plating bath.

As discussed in the above, the anti-oxidation layer could be electroless platinum, either limited by the displacement of the underlying metal, Me, (either nickel or another metal of the present invention) using an alkali-free (sodium-free, potassium-free and lithium-free), chlorine-free solution:

$$2Me^0 + nPt^{2+} \rightarrow 2Me^{n+} + nPt^0$$

or by electroless plating of a thicker layer using an alkali-free (sodium-free, potassium-free and lithium-free), chlorine-free, hydrazine-free, dimethylamine borane-free (DMAB-free) electroless plating solution; could be electroless rhodium, either limited by the displacement of the underlying metal, Me, (either nickel or another metal of the present invention) using an alkali-free (sodium-free, potassium-free and lithium-free), chlorine-free solution:

$$2Me^0 + nRh^{2+} \rightarrow 2Me^{n+} + nRh^0$$

or by electroless plating of a thicker layer using an alkali-free (sodium-free, potassium-free and lithium-free), chlorine-free, hydrazine-free, dimethylamine borane-free (DMAB-free) electroless plating solution; could be electroless ruthenium, either limited by the displacement of the underlying metal, Me, (either nickel or another metal of the present invention) using an alkali-free (sodium-free, potassium-free and lithium-free), chlorine-free solution:

$$2Me^0 + nRu^{2+} \rightarrow 2Me^{n+} + nRu^0$$

or by electroless plating of a thicker layer using an alkali-free (sodium-free, potassium-free and lithium-free), chlorine-free, hydrazine-free, dimethylamine borane-free (DMAB-free) electroless plating solution.

The seed layer of "Lid wafer" is typically an electrically conductive layer deposited on the "Lid wafer" and may either be a doped silicon layer or a metal layer.

The structural under-layer in accordance with embodiments if the invention is again deposited using immersion and/or electroless plating technologies.

Nickel sulfite-based electroless nickel processes should be avoided because they result in result undesirable sulfate by-products, unstable plating processes and short MTOs. Nickel chloride-based baths should be avoided because the chloride anion will act deleteriously on these exposed aluminium surfaces and/or aluminium interconnects. Hydrazine-based baths should be avoided to prevent health and safety problems. Alkali-based (sodium-based, potassium-based or lithium-based) baths should be avoided to avoid the undesirable mobile ions problems in advanced MEMS involving CMOS, high-voltage CMOS and/or CCD devices.

Sulfite-free, chlorine-free, hydrazine-free and alkali-free ammonium hydroxide, $NH_4OH$, and nickel hypophosphite, $Ni(H_2PO_2)_2$, baths in which the nickel hypophosphite is used as source of $Ni^0$ metal nickel as well as source of reducing $H_2PO_2^-$ anion is the preferred electroless plating solution:

$$Ni(H_2PO_2)_2 + Ni(H_2PO_2)_2 + 2H_2O \rightarrow Ni^0 + 2H_3PO_2 + Ni(H_2PO_3)_2 + H_2\uparrow$$

particularly if the bath is equipped with a sodium-free bath life extension technique capable of preventing the undesirable accumulation of by-products in the plating bath (such as the nickel orthophosphite, $Ni(H_2PO_3)_2$, and other undesirable by-products) and the associated drift of the mechanical properties of electroless plated nickel under-structures.

The anti-oxidation layer of the lid wafer can be electroless platinum, electroless rhodium or electroless ruthenium, either limited by the displacement of the underlying metal, Me, (either nickel or another metal of the present invention) using an alkali-free (sodium-free, potassium-free and lithium-free), chlorine-free solution:

$$2Me^0 + nPt^{2+} \rightarrow 2Me^{n+} + nPt^0$$

$$2Me^0 + nRh^{2+} \rightarrow 2Me^{n+} + nRh^0$$

$$2Me^0 + nRu^{2+} \rightarrow 2Me^{n+} + nRu^0$$

or by electroless plating of a thicker layer using an alkali-free (sodium-free, potassium-free and lithium-free), chlorine-free, hydrazine-free, dimethylamine borane-free (DMAB-free) electroless plating solution.

The "Lid wafers" are also to be electroless plated with the solder itself which will adhere to the underlying anti-oxidation layer of the "Lid wafer", even above its liquidus temperature, as which will wet the anti-oxidation layer of the "MEMS wafer" upon contact and solder the two wafers when the temperature will be dropped below the liquidus temperature, thus forming the sealed micro-cavities of the wafer-level package.

An example of solder used in a metal-sealed wafer-level package is provided in FIG. 12 taken from the following cited Prior Art reference: U.S. Pat. No. 6,563,106 titled 'Micro-electro-mechanical-system (MEMS) mirror device and methods for fabricating the same'. In this approach, a tin-lead solder is used to ensure the hermetic bonding of the "Lid wafer" to the "MEMS wafer" as to form the micro-cavities of the wafer-level package of a MEMS mirror used in photonics applications. The use of Pb—Sn solders allows the bonding temperature to be reduced to less than 300° C. The Pb—Sn phase diagram of FIG. 13 shows that the very popular 74 wt % Sn-26 wt % Pd solder has an eutectic formation at a temperature of only 183° C. This means that this very popular alloy can bond the "MEMS wafer" and the "Lid wafer" at such a low temperature.

Unfortunately, policies around the world are progressively forcing the industry to eliminate lead from the various surface finishes of printed circuit boards and other semiconductor component fabrication processes: Liz Harriman, "Lead-Free Electronics", NEWMOA Annual Conference, November 2001; In USA, via the IPC Roadmap (version 1.0 released in 1999): A guide for assembly of lead-free electronics. Boeing has qualified Ni/Au and immersion Ag lead-free finishes for PWBs in 2000. ChipPAC has worked with Sanmina and Hewlett Packard to implement lead-free BGAs and lead frame packages in high volume production. Cookson has lead-free solutions for its customers. Coretec has six lead-free surface finish options (HASL, immersion Sn, immersion Au, immersion Ag and two OSP's). Motorola SPS has qualified some components with Ni/Pd lead frames and is investigating technology to provide both lead-free & halogen-free leaded & BGA components to enable its customers to meet the requirements of the WEEB Directive. Shipley Co. LLC Developing lead-free electronic materials through the Shipley Ronal Division, and are currently offering/developing lead-free finishes for components/connectors (Sn, SnCu, SnBi, SnAg) and PWB final finish applications (ENIG, electroless Pd, immersion silver, immersion tin, OSP). Teledyne Halco has a lead-free FIASL process that is compatible with PCB manufacturing and assembly standards since 2001. Texas Instruments introduced a nickel/palladium (Ni/Pd) finish, a lead-free alternative, to the IC market in 1989, and there are currently, more than 30 billion TI lead-free Ni/Pd components in the field. Visteon is evaluating Sn3.5Ag, Sn4Ag0.5Cu and quaternary lead-free solders. In Japan, via the Japan Electronics and Information Technology industries Association (JEITA) Roadmap (version 1.3 released in August 2000): Challenged and efforts towards commercialisation of lead-free solder which targets the elimination of lead solders by year 2005. NEC Corporation eliminated lead from their PC motherboards in 1999 by replacing the tin-lead solders by tin-zinc-based solders. Matsushita eliminated lead-free soldering in its semiconductor products in April 2000. Pioneer Corporation eliminated lead-based soldering in 2002; In Europe, via the Waste of Electrical and Electronic Equipment (WEEE) Directive proposal (European Commission) and via the Restriction of Hazardous Materials (RHS) Directive proposal (European Commission). In Denmark, the Danish Environment Agency has signed a statutory order on prohibition of import, marketing and manufacture of lead and products containing lead. This Order affects the import, marketing and manufacture of lead and certain products containing lead according to the listing in the full text of the document. In this case lead has been defined as products in which lead represents more than 100 ppm (0.1 mg/kg) of their homogeneous components.

It is clear that the lead-based solders will have to be replaced by other lead-free low-temperature solders capable of similar low-temperature waver bonding as to avoid future environmental issues. The techniques involving lead-containing solders and materials are to be avoided for the production of wafer-level packages for advanced MEMS devices.

The need for lead-free solders gave birth to the "Lead-Free Assembly & Rework Project" of the "Environmentally conscious electronics" program within the National Electronics Manufacturing Initiative (NEMI). Accordingly to the following references: F. Jan, F. Kazimierz, K. Ryszard, "US Research Institution Roadmap for the Migration to Lead-free Electronics", 1st European Union/United States Lead-free Solder Interface Meeting, CALCE Electronic Products and Systems Center, University of Maryland, Mar. 27, 2002.

The following lead-free solders have been identified as leading replacement candidates of lead-based solders: $Sn_{99.3}/Cu_{0.7}$ (M.P.=227° C.) at Nortel ($N_2$ wave and reflow); $Sn_{96.5}/Ag_{3.5}$ (M.P.=221° C.) at NCMS, Ford, Motorola and TI Japan; $Sn_{90.5}/Ag_{3.5}/Bi_3$ (M.P.=220° C.) at Matsushita/Panasonic; $Sn_{95.5}/Ag_{3.8}/Cu_{0.7}$ (M.P.=217-219° C.) at Motorola and Nokia; $Sn_{97.25}/Ag_2/Cu_{0.75}$ (M.P.=217-219° C.) at NEC; SnAgCu (M.P.=217° C.) at GEC Marconi; Sn/Ag/Cu/Sb (M.P.=217° C.) at Texas Instruments; $Sn_{93.4}/Ag_2/Bi_4/Cu_{0.5}/Ge_{0.1}$ (M.P.=216° C.) at Sony; $Sn_{91.75}/Ag_{3.5}/Bi_5/Cu_{0.7}$ (M.P.=210-215° C.) at Hitachi; $Sn_{94.25}/Ag_2/Bi_3/Cu_{0.75}$ (M.P.=210-215° C.) at NEC; $Sn_{91.8}/Ag_{3.4}/Bi_{4.8}$ (M.P.=205-210° C.) at NCMS and Sandia Laboratories; $Sn_{89}/Zn_8/Bi_3$ (M.P.=191-192° C.) at Matsushita, Senju, NEC; $Sn_{42.9}/Bi_{57}/Ag_{0.1}$ (M.P.=138-140° C.) at Fujitsu.

The "Lead-Free Assembly & Rework Project" has clearly shown that, unlike lead-based solders, lead-free tin-based solders are prone to the formation of whiskers at room temperature and over time.

FIG. 14 shows the kind of whiskers which can grow at room temperature over time in lead-free tin-based solders, as recently disclosed in a few recent reports covering the reliability of lead-free tin-based solders: I. Boguslavsky, "Whiskers: Truth and Whiskers: Truth and Mystery", IPC/

NEMI Symposium on Lead-Free Electronics, Sep. 19, 2002, Montreal, Canada; Chen Xu, Yun Zhang*, C. Fan and J. Abys, "Understanding Whisker Phenomenon: Driving Force for Whisker Formation", Cookson Electronics, 2002; "Tin Whisker Info Brief", ON Semiconductor Application Note, TND311/D, May, 2003, Rev. 0.

The above reliability reports and particularly the Cookson Electronics reference clearly show that lead-free tin-based solders grow whiskers as the result of the relaxation of the compressive stress resulting from improper solder deposition conditions and from their interaction with the surrounding materials.

These reports indicate that these whiskers can be prevented if, either: The lead-free tin-based solders are fabricated as to achieve a tensile mechanical stress; A nickel layer is positioned under and over the lead-free solders prone to whiskers as to prevent their interaction with the underlying and overlying metals.

It is clear that, unless these two precautions and others are integrated in the proposed process for the wafer-level package, the use of lead-free tin-based solders to bond the "Lid wafer" to the "MEMS wafer" to form a wafer-level package constitutes a reliability issue for the MEMS devices which would not survive a whisker debris falling in the MEMS mechanics. The techniques involving lead-free tin-based solders without ways to achieve tensile stress solders and without a nickel barrier layer preventing the interaction of the lead-free solder and the material underlying the nickel are to be avoided for the production of wafer-level packages for advanced MEMS devices.

Since the electroless plating of ternary or quaternary alloys, such as most of the upper-listed tin-based solders, is almost impossible to maintain in a production environment, it is necessary to focus on pure metals or binary alloys as candidates for electroless solders.

Possible choices of pure metals and binary metallic alloys which could be electroless plated on the "Lid wafer" using CMOS, high-voltage CMOS and CCD compatible electroless plating solutions as to achieve soldering at temperatures ranging from 25 to 300° C.

The most simple solders are still the ones made of pure metals. Out of the metals of the periodic table of the elements, only a few metal elements have melting point between 25° C. and 300° C.: Gallium: 29.8° C.; Sulfur: 115.2° C.; Indium: 156.8° C.; Lithium: 180.7° C.; Selenium: 221.0° C.; Tin: 232.1° C.; Polonium: 254.0° C.; and Bismuth: 271.0° C.

Sulfur burns in air and should be discarded as potential solder for this invention. Lithium is not compatible with CMOS and should also be discarded. Selenium also burns in air and should also be discarded. All isotopes of polonium are radioactive so this metal should also be discarded. Bismuth is very brittle and should not be considered as a potential hermetic solder capable of reliable hermetic seal of a wafer-level package subject to thermal and mechanical shocks. All three remaining pure metals (gallium, indium & tin) can de deposited by electroless plating. The following reviews the state of the art of electroless plating of these three remaining pure metals: gallium, indium & tin.

Gallium has a low melting point of only 29.8° C. and will be treated in this invention as a "cold" solder. There are no prior art documents describing electroless gallium plating solutions.

Indium has also a relatively low melting point of only 156.8° C. and will be treated in this invention as a "warm" solder. The following Prior Art references describe the various electroless indium plating solutions: U.S. Pat. No. 4,935,312 titled "Film carrier having tin and indium plated layers"; U.S. Pat. No. 4,959,278 titled "Tin whisker-free tin or tin alloy plated article and coating technique thereof"; U.S. Pat. No. 5,160,373 titled "Electroless plating bath"; U.S. Pat. No. 6,221,530 titled "Mercury-free zinc anode for electromechanical cell and method for making same".

H. Nakayama describes in his U.S. Pat. No. 4,935,312 an electroless indium plating solution made of indium sulfate, $In_2(SO_4)_3$, sodium nitrilotriacetate (NTA), $N(CH_2COONa)_3$ and potassium citrate, $C_6H_5K_3O_7$. Obviously, this electroless plating solution is not CMOS compatible. H. Shimauchi describes in his U.S. Pat. No. 4,959,278 three electroless indium plating solutions: a sodium-based indium electroless plating bath containing a sodium borohydride, $NaBH_3$, as a reducing agent, which is not CMOS compatible; a chlorine-based indium electroless plating bath containing a hydrochloric acid, HCl, thiourea, $(NH_2)_2CS$, and indium chloride, $InCl_3.2H_2O$. This chlorinated solution is undesirable because the aluminium alloys composing the advanced MEMS devices are very susceptible to corrosion when exposed to trace levels of chlorine and then, chlorine-free plating chemistries are desirable.

A CMOS compatible, chlorine-free and operator safe electroless indium plating bath containing: a chlorine-free and alkali-free source of indium: Indium sulfate, $In_2(SO_4)_3$ or indium nitride, $In(NO_3)_3$, or indium methanesulfonate, $In(CH_3SO_3)_2$: Indium sulfate MSDS from CSST; a chlorine-free and alkali-free acid, such as: Sulfuric acid, $H_2SO_4$, ethylenediaminetetraacetic acid (EDTA), $C_{10}H_{16}N_2O_8$, nitrilotriacetic acid (NTA), $N(CH_2COOH)_3$, Tartaric acid, $HOOC(CH_2O)_2COOH$, or citric acid, $C_6H_8O_7$; sulfuric acid MSDS from Teck Cominco Metals; a chlorine-free, an alkali-free and an operator-safe complexing agent, such as: thiourea, $(NH_2)_2CS$: Thiourea MSDS from J. T. Baker.

Senda describes in his U.S. Pat. No. 5,160,373 an electroless indium plating solution made of: Indium trichloride salt, $InCl_3.4H_2O$, citric acid, titanium trichloride, $TiCl_3$, and sodium nitrilotriacetate (NTA), $N(CH_2COONa)_3$. Again, this chlorinated solution is undesirable because the aluminium alloys composing the advanced MEMS devices are very susceptible to corrosion when exposed to trace levels of chlorine and then, chlorine-free plating chemistries are desirable. More, the presence of sodium in the sodium nitrilotriacetate causes this electroless indium plating bath NOT to be CMOS compatible.

C. A. Turner describes in his U.S. Pat. No. 6,221,530 an electroless indium plating solution made of: Indium sulfamate, $In(NH_2SO_3)_3$, sodium chloride, sulfamic acid, $NH_2SO_3H$, sodium sulfamate, $H_2NSO_3Na$. The presence of sodium in the sodium chloride and the sodium sulfamate causes this electroless indium plating bath is NOT to be CMOS compatible.

Tin has a melting point of 232.1° C. and is considered in this specification as a "hot" solder. The following Prior Art references describe the various electroless tin plating solutions: U.S. Pat. No. 3,637,386 titled "Metallizing solution for intensifying layers of metallic, imaged nuclei"; U.S. Pat. No. 4,093,466 titled "Electroless tin and tin-lead alloy plating baths"; U.S. Pat. No. 4,194,913 titled "Electroless tin and tin-lead alloy plating baths"; U.S. Pat. No. 4,234,631 titled "Method for immersion deposition of tin and tin-lead alloys"; U.S. Pat. No. 4,269,625 titled "Bath for electroless depositing tin on substrates"; U.S. Pat. No. 4,550,037 titled "Tin plating immersion process"; U.S. Pat. No. 4,618,513 titled "Tin plating immersion process"; U.S. Pat. No. 4,935, 312, titled "Film carrier having tin and indium plated layers"; U.S. Pat. No. 5,248,527 titled "Process for electroless plating tin, lead or tin-lead alloy"; U.S. Pat. No. 5,360,471 titled "Electroless solder plating bath"; U.S. Pat. No. 5,534,048 titled "Tin coating composition and method"; U.S. Pat. No. 5,562,950 titled "Tin coating composition and method"; U.S. Pat. No. 5,576,053 titled "Method for forming an electrode on an electronic part".

T. F. Davis describes in his U.S. Pat. Nos. 4,093,466, 4,194,913 & 4,234,631 an electroless tin plating solution made of: Stannous chloride, $SnCl_2.2H_2O$, sodium hypophosphite, $NaH_2PO_2.2H_2O$, thiourea, $(NH_2)_2CS$, and hydrochloric acid, HCl. Again, this chlorinated solution is undesirable due to potential corrosion issues with the aluminum alloys of advanced MEMS devices involving aluminum-based interconnects and the sodium of the hypophosphite is again NOT CMOS compatible.

A. Molenaar describes in his U.S. Pat. Nos. 3,637,386 & 4,269,625 electroless tin plating solutions made of: Stannous chloride, $SnCl_2.2H_2O$ or $SnCl_4.4H_2O$, hydrochloric acid, HCl, and potassium chloride, KOH, or sodium hydroxide, NaOH. Again, this chlorinated solution is undesirable due to potential corrosion issues with the aluminum alloys of advanced MEMS devices involving aluminum-based interconnects and the sodium or the potassium of the hydroxides is again not CMOS compatible.

E. W. Kindelaar describes in his U.S. Pat. Nos. 4,550,037 & 4,618,513 an electroless tin plating solution made of: Stannous sulfate, $SnSO_4$, sulphuric acid, $H_2SO_4$. This electroless plating bath is chlorine- and alkali-free and then compatible with CMOS processing. More, the following material safety data sheet shows that stannous sulphate is safe for the operators of the electroless plating bath: Stannous sulfate MSDS from Chem-Supply Pty Ltd.

H. Nakayama describes in his U.S. Pat. No. 4,935,312 two electroless tin plating solutions made of either: Stannous chloride, $SnCl_2$, tartaric acid, $C_4H_6O_6$, and thiourea, $(NH_2)_2CS$. This first chlorinated electroless plating solution is again undesirable due to potential corrosion issues with the aluminum alloys of advanced MEMS devices involving aluminum-based interconnects; Stannous chloride, $SnCl_2$, sodium hydroxide, NaOH, and sodium cyanide, NaCN. This second chlorinated electroless plating solution is again undesirable due to potential corrosion issues with the aluminum alloys of advanced MEMS devices involving aluminum-based interconnects. More, the sodium of the sodium hydroxide and sodium cyanide is again not CMOS compatible. Finally, the following material data sheet shows that sodium cyanide is extremely toxic for the operators of the plating bath: Sodium cyanide MSDS from University of Oxford.

H. Uchida describes in his U.S. Pat. No. 5,248,527 various electroless tin plating solutions made of the following three chemicals: a water-soluble tin salt supplying the stannous ions, such as: stannous chloride, $SnCl_2$ and stannous sulfate, $SnSO_4$. The stannous chloride-based electroless plating solution is undesirable due to potential corrosion issues with the aluminum alloys of advanced MEMS devices involving, aluminum-based interconnects but the stannous sulfate is chlorine-free, CMOS compatible and safe for the operators of the electroless tin plating bath; an acid capable of dissolving the tin salt, such as: Hydrochloric acid, HCl, perchloric acid, $HClO_4$, fluoroboric acid, BF4H, phosphoric acid, $H_3PO_4$, and organic sulfonic acids, such as: Methane sulfonic acid, $CH_3SO_3H$. The hydrochloric acid and perchloric acid-based electroless plating solution are undesirable due to potential corrosion issues with the aluminum alloys of advanced MEMS devices involving aluminum-based interconnects but the fluoroboric acid and organic sulfonic acids are chlorine-free, CMOS compatible and relatively safe for the operators of the electroless tin plating bath: Fluoroboric acid MSDS from J. T. Baker; Methane sulfonic acid MSDS from J. T. Baker; and a complexing agent, such as: Oxalic acid, HOOCCOOH, tartaric acid, $HOOC(CH_2O)_2COOH$, citric acid, $C_6H_8O_7$, ethylenediaminetetraacetic acid (EDTA), $C_{10}H_{16}N_2O_8$, thiourea, $(NH_2)_2CS$, or triethanol amine, $(HOCH_2CH_2)_3N$.

The following material safety data sheets show that oxalic acid is poison while tartaric acid, citric acid, EDTA, thiourea and triethanol amine are relatively safer complexing agents for the operators of the electroless tin baths: Oxalic acid MSDS from J. T. Baker; Citric acid MSDS from Syndel International; Tartaric acid MSDS from J. T. Baker; EDTA MSDS from J. T. Baker; Thiourea MSDS from J. T. Baker; Triethanol amine MSDS from National Toxicology Program.

Y. Takano describes in his U.S. Pat. No. 5,360,471 various electroless tin plating solutions made of: Stannous chloride, $SnCl_2$, stannous sulfate, $SnSO_4$, or stannous acetate, $Sn(CH_3COO)_2$, as source of tin and disodium ethylenediamine-tetraacetic acid $Na_2(EDTA)$, $Na_2C_{10}H_{14}O_8N_2$, as complexing agent and titanium trichloride, $TiCl_3$, as source of reductant trivalent titanium ions capable of reducing the tin ions when exposed to an acid such as nitrilotriacetic acid, $N(CH_2COOH)_3$. The reduction mechanism of these electroless plating bath by the trivalent titanium cations:

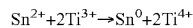
$$Sn^{2+}+2Ti^{3+}\rightarrow Sn^0+2Ti^{4+}$$

implies the formation of the trivalent titanium cations. This electroless tin solution is undesirable because: The sodium of disodium ethylenediamine-tetraacetic acid is incompatible with CMOS devices, the chlorine ions of the titanium trichloride are a potential source of corrosion issues with the aluminum alloys of advanced MEMS devices involving aluminum-based interconnects and the nitrilotriacetic acid is a probable carcinogen, as shown by the following material safety data sheet: Nitrilotriacetic acid MSDS from University of Oxford.

Y. Takano describes in his U.S. Pat. Nos. 5,534,048 & 5,562,950 various electroless tin plating solutions made of: sodium stannate, $Na_2SnO_3$, or potassium stannate, $K_2SnO_3$, an organic chelating agent and an organic polyhydroxy material. Again, this electroless tin plating solution is undesirable because the sodium of sodium stannate or the potassium of the potassium stannate is incompatible with CMOS devices.

A. Senda describes in his U.S. Pat. No. 5,576,053 three electroless tin plating solutions: Stannous chloride, $SnCl_2$, disodium ethylenediamine-tetraacetic acid $Na_2(EDTA)$, $Na_2C_{10}H_{14}O_8N_2$, nitrilotriacetic acid, $N(CH_2COOH)_3$, trisodium citrate, $Na_3C_6H_5O_7$, calcium chloride, $CaCl_2$, and titanium trichloride, $TiCl_3$. Again, this electroless tin plating solution is undesirable because the sodium of trisodium citrate and of disodium ethylenediamine-tetraacetic acid is incompatible with CMOS devices and the chlorine of stannous chloride, calcium chloride and titanium trichloride is a potential source of corrosion issues with the aluminum alloys of advanced MEMS devices involving aluminum-based interconnects; Stannous chloride, $SnCl_2$, disodium ethylenediamine-tetraacetic acid $Na_2(EDTA)$, $Na_2C_{10}H_{14}O_8N_2$, nitrilotriacetic acid, $N(CH_2COOH)_3$, trisodium citrate, $Na_3C_6H_5O_7$, lead chloride, $PbCl_2$, magnesium citrate, $C_6H_6MgO_7$, and titanium trichloride, $TiCl_3$. Again, this electroless tin plating solution is undesirable because the sodium of trisodium citrate and of disodium ethylenediamine-tetraacetic acid is incompatible with CMOS devices and the chlorine of stannous chloride, lead chloride and titanium trichloride is a potential source of corrosion issues with the aluminum alloys of advanced MEMS devices involving aluminum-based interconnects; and Stannous chloride, $SnCl_2$, disodium ethylenediamine-tetraacetic acid $Na_2(EDTA)$, $Na_2C_{10}H_{14}O_8N_2$, nitrilotriacetic acid, $N(CH_2COOH)_3$, trisodium citrate, $Na_3C_6H_5O_7$, nickel chloride, $NiCl_2$, and titanium trichloride, $TiCl_3$. Again, this electroless tin plating solution is undesirable because the sodium of trisodium citrate and of disodium ethylenediamine-tetraacetic acid is incompatible with CMOS devices and the chlorine of stannous chloride, nickel chloride and titanium trichloride is a potential source of corrosion issues with the aluminum alloys of advanced MEMS devices involving aluminum-based interconnects.

The state of the art has been discussed of chlorine-free, and alkali-free (sodium-free, potassium-free and lithium-free) CMOS, high-voltage CMOS and CCD compatible electroless plating solutions using safe chemicals for the electroless plating of one of the three preferred pure metals capable of a solder temperature between 25 and 300° C. (gallium at 29.8° C., indium at 156.8° C. and tin at 232.1° C.) over the electroless platinum, electroless rhodium or electroless ruthenium anti-oxidation layer protecting the electroless structural under-layer of nickel or of any other structural MEMS under-layer.

These three distinct solder temperatures of 29.8° C., 156.8° C. and 232.1° C. are not very convenient for many wafer-level packages which could benefit from alternate temperatures between these values or even slightly higher temperatures up to the desirable upper limit of about 300° C.

To accommodate these needs, it is interesting to consider the electroless plating of a binary metal alloy which results in either an intermediate solder temperature or a slightly higher solder temperature up to about 300° C. More, the formation of a binary metal alloy will also result in improved mechanical properties, such as improved ductility, reducing the risk of a leaky wafer-level package resulting from thermal or mechanical shocks applied to the wafer-level package, and/or to reduced whiskers.

The main element of these electroless deposited binary metal solders is still either gallium, indium or tin. The alloying element is to be selected from the elements of the periodic table having a relatively low temperature melting point between 25° C. and about 1000° C. as to prevent forming binary phase diagrams with excessive sensitivity of the metal alloy solder temperature to the metal alloy relative proportion of the two forming elements and as to ensure a more repeatable solder temperature of the alloy over the life of the electroless plating bath.

The following elements are then to be considered as to form a binary alloy with gallium, indium or tin as to form binary alloys with a liquidus temperature below the desirable upper limit of about 300° C.: Gallium: 29.8° C.; Indium: 156.8° C.; Tin: 232.1° C.; Bismuth: 271.4° C.; Astatine: 302° C.; Thallium: 304.0° C.; Cadmium: 321.2° C.; Lead: 327.6° C.; Zinc: 419.7° C.; Tellurium: 449.7° C.; Antimony: 630.8° C.; Neptunium: 637.0° C.; Plutonium: 639.5° C.; Magnesium: 650.0° C.; Aluminium: 660.5° C.; Radium: 700.0° C.; Barium: 727.0° C.; Strontium: 777.0° C.; Cerium: 795.0° C.; Arsenic: 817.0° C.; Ytterbium: 824.0° C.; Europium: 826.0° C.; Mendelevium: 827.0° C.; Nobelium: 827.0° C.; Einsteinium: 860.0° C.; Californium: 900.0° C.; Lanthanum: 920.0° C.; Praseodymium: 935.0° C.; Germanium: 938.4° C.; Silver: 961.9° C.; Copper 1064° C.

Since astatine, neptunium, plutonium, radium, mendelevium, nobelium, einsteinium and californium are radioactive, since cadmium, lead, thallium, tellurium, antimony, barium, cerium, arsenic and lanthanum are toxic, highly toxic and/or can cause cancer, since aluminium is readily oxidized and cannot be plated reliably and since strontium, ytterbium, europium and praseodymium are rare elements, they should not be considered as safe and cost effective alloying element to form a binary solder with either gallium, indium or tin. The remaining elements to consider forming such a binary alloy solder with gallium, indium or tin are then:

| Alloying element | Gallium (Ga) base element | Indium (In) base element | Tin (Sn) base element |
| --- | --- | --- | --- |
| Gallium (Ga) | Pure gallium metal | Indium-rich side of the In—Ga phase diagram | Tin-rich side of the Sn—Ga phase diagram |
| Indium (In) | Gallium-rich side of the Ga—In phase diagram | Pure indium metal | Tin-rich side of the Sn—In phase diagram |
| Tin (Sn) | Gallium-rich side of the Ga—Sn phase diagram | Indium-rich side of the In—Sn phase diagram | Pure tin metal |
| Bismuth (Bi) | Gallium-rich side of the Ga—Bi phase diagram | Indium-rich side of the In—Bi phase diagram | Tin-rich side of the Sn—Bi phase diagram |
| Zinc (Zn) | Gallium-rich side of the Ga—Zn phase diagram | Indium-rich side of the In—Zn phase diagram | Tin-rich side of the Sn—Zn phase diagram |
| Magnesium (Mg) | Gallium-rich side of the Ga—Mg phase diagram | Indium-rich side of the In—Mg phase diagram | Tin-rich side of the Sn—Mg phase diagram |
| Germanium (Ge) | Gallium-rich side of the Ga—Ge phase diagram | Indium-rich side of the In—Ge phase diagram | Tin-rich side of the Sn—Ge phase diagram |
| Silver (Ag) | Gallium-rich side of the Ga—Ag phase diagram | Indium-rich side of the In—Ag phase diagram | Tin-rich side of the Sn—Ag phase diagram |
| Copper (Cu) | Gallium-rich side of the Ga—Cu phase diagram | Indium-rich side of the In—Cu phase diagram | Tin-rich side of the Sn—Cu phase diagram |

The electroless plating of the upper-listed binary alloy requires the oxidation (loss of electron), into the electroless plating bath, of the two elements composing the alloy requires their sustained reduction, into the electroless plating bath and onto these catalytic surfaces capable of electrons and ions exchanged, of these metal cations by the reducing chemicals of the bath. The periodic table of the elements provides the oxidation potential, E°, of the nine alloying elements (i.e. the energy required to extract the proper number of electrons, typically 1, 2, 3 or 4, of the metal element to an infinite distance as to form the metal cation ready to be reduced by the reducing chemicals onto the catalytic surfaces):

$$Ga^0 \rightarrow 3e^- + Ga^{3+} (E°=0.53 \text{ V})$$

$$In^0 \rightarrow 3e^- + In^{3+} (E°=0.34 \text{ V})$$

$$Sn^0 \rightarrow 2e^- + Sn^{2+} (E°=0.14 \text{ V})$$

$$Bi^0 \rightarrow 3e^- + Bi^{3+} (E°=0.32 \text{ V})$$

$$Zn^0 \rightarrow 2e^- + Zn^{2+} (E°=0.76 \text{ V})$$

$$Mg^0 \rightarrow 2e^- + Mg^{2+} (E°=2.36 \text{ V})$$

$$Ge^0 \rightarrow 4e^- + Ge^{4+} (E°=0.12 \text{ V})$$

$$Ag^0 \rightarrow e^- + Ag^+ (E°=0.80 \text{ V})$$

$$Cu^0 \rightarrow 2e^- + Cu^{2+} (E°=0.34 \text{ V})$$

As shown in the following reference covering the electroless plating of cobalt-phosphorus binary alloys: N. Petrov, Y. Sverdlov & Y. Shacham-Diamand, "Electrochemical study of the electroless deposition of Co(P) and Co(W,P) alloys", Journal of the electrochemical society, 149 (4), C187-C194, (2002); the Pourbaix diagram (potential-pH diagram) of each metal of the binary alloy to be electroless plated in a water-based system can be used to predict which pH of the water-based electroless plating solution is best suitable to form both metal cations and allow their reduction, on the catalytic surfaces, by the reducing chemicals of the water-based electroless plating solution.

Many Pourbaix diagrams are available in the following reference: M. Pourbaix, "Atlas d'équilibres électrochimiques", Ed. Gauthier-Villars, 1963;

FIG. 15 shows examples of such Pourbaix diagrams using aluminum and zinc as alloying metals to be electroless plated. The diagrams are taken from the following reference:

R. A. Cottis, S. Turgoose, "Electrochemical kinetics and thermodynamics", Corrosion engineering course of the Corrosion and Protection Centre of the University of Manchester Institute of Science and Technology (UMIST), 1998

The metal element which is the most noble (the harder to oxidize) will be in a larger proportion in the electroless plating bath than the element which is less noble. The relative proportion of each element in the electroless plating bath is then dictated by their relative oxidation potential and can be estimated by the Nernst equation:

$$E = E° + \frac{RT}{nF} \ln[Me^{n+}]$$

Where "E" is indicative of the required amount of metal chemical into the electroless plating solution, "E°" is the oxidation potential of the element, "R" is the gas constant, "F" is the Faraday constant, "Me" is the metal of interest, "n" is the number of electrons implied in the oxidation reaction (either 1, 2 or 3) and "T" is the electroless plating temperature.

The electroless plating of the gallium-based, indium-based and tin-based binary alloy solders will now be discussed.

Gallium has a low melting point of only 29.8° C. and its binary metal alloy solders will be treated in this invention as a "cold" binary metal alloy solders. The previous section presented the discussed the desirable gallium-based solders:

| Alloying element | Gallium (Ga) base element |
|---|---|
| Gallium (Ga) | Pure gallium metal |
| Indium (In) | Gallium-rich side of the Ga—In phase diagram |
| Tin (Sn) | Gallium-rich side of the Ga—Sn phase diagram |
| Bismuth (Bi) | Gallium-rich side of the Ga—Bi phase diagram |
| Zinc (Zn) | Gallium-rich side of the Ga—Zn phase diagram |
| Magnesium (Mg) | Gallium-rich side of the Ga—Mg phase diagram |
| Germanium (Ge) | Gallium-rich side of the Ga—Ge phase diagram |
| Silver (Ag) | Gallium-rich side of the Ga—Ag phase diagram |
| Copper (Cu) | Gallium-rich side of the Ga—Cu phase diagram |

The electroless plating of pure gallium was covered in the previous section related to the electroless plating of pure metals. Pure gallium metal has a fusion temperature of only 29.8° C.

FIG. 16 shows the Ga—In phase diagram obtained from the following reference: ASM Handbook Volume 3, "Alloy Phase Diagrams", ASM International, ISBN: 0-87170-381-5(v.3), 1992.

This phase diagram shows that the electroless plating of a gallium metal alloyed with a small proportion of indium could provide "cold" binary metal alloy solders with liquidus temperatures ranging from 15.3° C. to about 70° C. if the indium content is limited to 50 atomic percent. This interesting characteristics can provide ways to achieve very low temperature metal-based hermetic bonding of the MEMS wafer and the LID wafer in wafer-level packaging in critical applications where low-temperature hermetic seals are required and where the operation in the field allows such low liquidus temperatures. The following two oxidation reactions:

$$Ga^0 \rightarrow 3e^- + Ga^{3+} (E°=0.53 \text{ V})$$

$$In^0 \rightarrow 3e^- + In^{3+} (E°=0.34 \text{ V})$$

show the oxidation potentials of these two elements as to assess the relative proportion of these two elements to be incorporated into the electroless plating bath as to achieve the desired alloy composition and the desired liquidus temperature shown on the phase diagram. The Pourbaix diagrams of these two elements in water-based solutions can be used to predict at which pH the solution should operate to achieve electroless plating.

FIG. 17 shows the Ga—Sn phase diagram again obtained from the ASM Handbook, Volume 3: "Alloy Phase Diagrams". This phase diagram shows that the electroless plating of a gallium metal alloyed with a small proportion of tin could provide "cold" binary metal alloy solders with slightly higher liquidus temperatures ranging from 20.5° C. to about 125° C. if the tin content is limited to 50 atomic percent. This interesting characteristics can provide another way to achieve very low temperature metal-based hermetic bonding of the MEMS wafer and the LID wafer in wafer-level packaging in critical applications where low-temperature hermetic seals are required and where slightly higher operation temperatures prevent the use of the Ga—In alloys with lower liquidus temperatures. The following two oxidation reactions $$Ga^0 \rightarrow 3e^- + Ga^{3+} (E°=0.53 \text{ V})$$

$$Sn^0 \rightarrow 2e^- + Sn^{2+} (E°=0.14 \text{ V})$$

show the oxidation potentials of these two elements as to assess the relative proportion of these two elements to be incorporated into the electroless plating bath as to achieve the desired alloy composition and the desired liquidus temperature shown on the phase diagram. The Pourbaix diagrams of these two elements in water-based solutions can be used to predict at which pH the solution should operate to achieve electroless plating.

FIG. 18 shows the Ga—Bi phase diagram obtained from the following reference: P. Huber, O. G. Shpyrko, P. S. Pershan, H. Tostmann, E. DiMasi, B. M. Ocko & M. Deutsch, "Wetting behavior at the free surface of a liquid gallium-bismuth alloy: an X-ray reflectivity study close to the bulk monotectic point", Colloids and Surfaces, A: Physicochemical and Engineering Aspects 206 (2002) 515-520;

This phase diagram shows that the electroless plating of a gallium metal alloyed with a small proportion of bismuth could provide "cold" binary metal alloy solders with slightly higher liquidus temperatures ranging from 29.8° C. to about 262° C. if the bismuth content is limited to 50 atomic percent. The following two oxidation reactions

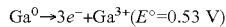

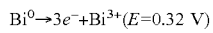

show the oxidation potentials of these two elements as to assess the relative proportion of these two elements to be incorporated into the electroless plating bath as to achieve the desired alloy composition and the desired liquidus temperature shown on the phase diagram. Again, the Pourbaix diagrams of these two elements in water-based solutions can be used to predict at which pH the solution should operate to achieve electroless plating.

FIG. 19 shows the Ga—Zn phase diagram again obtained from the ASM Handbook, Volume 3: "Alloy Phase Diagrams". This phase diagram shows that the electroless plating of a gallium metal alloyed with a small proportion of zinc could provide "cold" binary metal alloy solders with higher liquidus temperatures ranging from 29.8° C. to about 250° C. if the zinc content is limited to 50 atomic percent. This characteristics can provide another way to achieve low temperature metal-based hermetic bonding of the MEMS wafer and the LID wafer in wafer-level packaging in applications where low-temperature hermetic seals are required. The following two oxidation reactions

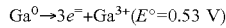

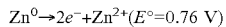

show the oxidation potentials of these two elements as to assess the relative proportion of these two elements to be incorporated into the electroless plating bath as to achieve the desired alloy composition and the desired liquidus temperature shown on the phase diagram. Again, the Pourbaix diagrams of these two elements in water-based solutions can be used to predict at which pH the solution should operate to achieve electroless plating.

FIG. 20 shows the Ga—Mg phase diagram again obtained from the ASM Handbook, Volume 3: "Alloy Phase Diagrams". This phase diagram shows that the electroless plating of a gallium metal alloyed with a small proportion of magnesium could provide "cold" binary metal alloy solders with much higher liquidus temperatures ranging from 29.8° C. to the desirable upper limit of about 300° C. achieved at a magnesium content of about 35 atomic percent. This characteristics can provide another way to adjust the temperature of metal-based hermetic bonding of the MEMS wafer and the LID wafer in wafer-level packaging in applications requiring hermetic metal seals formed at such temperatures. The following two oxidation reactions

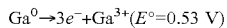

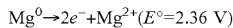

show the oxidation potentials of these two elements as to assess the relative proportion of these two elements to be incorporated into the electroless plating bath as to achieve the desired alloy composition and the desired liquidus temperature shown on the phase diagram. Again, the Pourbaix diagrams of these two elements in water-based solutions can be used to predict at which pH the solution should operate to achieve electroless plating.

FIG. 21 shows the Ga—Ge phase diagram obtained from the following reference: D. Nattland, H. Chadli, C. A. Zell, S. C. Muller, B. v. Blanckenhagen & W. Freyland, "Interfacial Properties of Liquid Alloys: An Experimental Study on Ga—Bi and Ga—Ge", Ber. Bunsenges. Phys. Chem. 102, 1151-1155 (1998) No. 9.

This phase diagram shows that the electroless plating of a gallium metal alloyed with a small proportion of germanium could provide "cold" binary metal alloy solders with very high liquidus temperatures ranging from 29.8° C. to the desirable upper limit of about 300° C. achieved at a germanium content of only about 5 atomic percent. This very steep increase of the binary alloy liquidus temperature as function of the exact germanium content makes gallium-germanium binary alloys undesirable because a repeatable liquidus temperature at temperatures below the desirable upper limit of about 300° C. will be difficult to maintain in production.

FIG. 22 shows the Ga—Ag phase diagram obtained from the following reference: M. R. Baren, "The Ag—Ga (Silver-Gallium) System", Bull. Alloy Phase Diag., 18, No. 4, 1990; pp. 334-339.

This phase diagram shows that the electroless plating of a gallium metal alloyed with a small proportion of silver could provide "cold" binary metal alloy solders with very liquidus temperatures ranging from 29.8° C. to the desirable upper limit of about 300° C. achieved at a silver content of about 13 atomic percent. As for the Ga—Ge alloys, the very steep increase of the Ga—Ag binary alloys liquidus temperature as function of the exact silver content makes gallium-silver binary alloys undesirable because a repeatable liquidus temperature at temperatures below the desirable upper limit of about 300° C. will be difficult to maintain in production.

FIG. 23 shows the Ga—Cu phase diagram obtained again obtained from the ASM Handbook, Volume 3: "Alloy Phase Diagrams". This phase diagram shows that the electroless plating of a gallium metal alloyed with a small proportion of copper could provide "cold" binary metal alloy solders with much higher liquidus temperatures ranging from 29.8° C. to the desirable upper limit of about 300° C. achieved at a copper content of about 5.1 atomic percent. As for the Ga—Ge and for the Ga—Ag alloys, the very steep increase of the Ga—Cu binary alloys liquidus temperature as function of the exact copper content makes gallium-copper binary alloys undesirable because a repeatable liquidus temperature at temperatures below the desirable upper limit of about 300° C. will be difficult to maintain in production.

Of the gallium-based binary metal alloy solders, the most interesting "cold" binary metal alloy solders are: Ga—In (for liquidus temperatures ranging from 15.3° C. to about 70° C.), Ga—Sn (for liquidus temperatures ranging from 20.5° C. to about 125° C.), Ga—Bi (for liquidus temperatures ranging from 29.8° C. to about 262° C.) and Ga—Zn (for liquidus temperatures ranging from 29.8° C. to about 250° C.) since their liquidus temperature is gradually increasing as function of the indium, tin, bismuth or zinc alloying element. An indium-based "warm" binary metal alloy solders will be preferred to the Ga—Mg binary metal alloy. The Ga—Ge, Ga—Ag and Ga—Cu binary metal alloys are undesirable because their liquidus temperatures vary too much as function of the germanium, silver or copper alloying metal content.

Indium has a "warm" melting point of 156.8° C. and its binary metal alloy solders will be treated in this invention as a "warm" binary metal alloy solders. The desirable indium-based binary metal solders are again the following:

| Alloying element | Indium (In) base element |
|---|---|
| Gallium (Ga) | Indium-rich side of the In—Ga phase diagram |
| Indium (In) | Pure indium metal |
| Tin (Sn) | Indium-rich side of the In—Sn phase diagram |
| Bismuth (Bi) | Indium-rich side of the In—Bi phase diagram |
| Zinc (Zn) | Indium-rich side of the In—Zn phase diagram |
| Magnesium (Mg) | Indium-rich side of the In—Mg phase diagram |
| Germanium (Ge) | Indium-rich side of the In—Ge phase diagram |
| Silver (Ag) | Indium-rich side of the In—Ag phase diagram |
| Copper (Cu) | Indium-rich side of the In—Cu phase diagram |

The electroless plating of pure indium was covered in the previous discussion relating to the electroless plating of pure metals.

FIG. 16 shows the In—Ga phase diagram obtained from the following reference: "Visualization of convective solidification in a vertical layer of eutectic Ga—In melt", Applied Physics A 64, 45-54 (1997).

This phase diagram shows that the electroless plating of a indium metal alloyed with a small proportion of gallium could reduce the fusion temperature from 1 56.8° C. and could provide "warm" binary metal alloy solders with liquidus temperatures ranging from 156.8° C. to about 70° C. if the gallium content is limited to 50 atomic percent. The gradual decrease of the liquidus temperature of the binary alloy resulting from an increased indium content allows a good control of the liquidus temperature and allow some variation of the alloy content without too much variation of the liquidus temperature. This interesting characteristics can provide ways to achieve very low temperature and tightly controlled metal-based hermetic bonding of the MEMS wafer and the LID wafer in wafer-level packaging in applications where low-temperature hermetic seals are required. The following two oxidation reactions

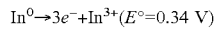

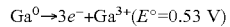

again show the oxidation potentials of these two elements as to assess the relative proportion of these two elements to be incorporated into the electroless plating bath as to achieve the desired alloy composition and the desired liquidus temperature shown on the phase diagram. The Pourbaix diagrams of these two elements in water-based solutions can be used to predict at which pH the solution should operate to achieve electroless plating.

FIG. 24 shows the In—Sn phase diagram again obtained from the ASM Handbook, Volume 3: "Alloy Phase Diagrams". This phase diagram shows that the electroless plating of a indium metal alloyed with a small proportion of tin could provide "warm" binary metal alloy solders with liquidus temperatures ranging from 156.8° C. to about 120° C. if the tin content is limited to 48.0 atomic percent. A very interesting characteristic of this In—Sn metal system is the capability to precisely control the liquidus temperature at 122.5+/−2.5° C. within a relatively large alloy composition of 42.5+/−7.5 atomic percent of tin in indium. Similarly, this In—Sn metal system is also capable of a precise control of the liquidus temperature at 125.0+/−5.0° C. within a very large alloy composition of 39.0±13.0 atomic percent of tin in indium. This In—Sn metal system provides one of the most forgiving technique for a precise temperature control of a liquidus temperature around 125° C. and allows a very predictable and very forgiving low temperature metal-based hermetic bonding of the MEMS wafer and the LID wafer of wafer-level packages in these critical applications where hermetic seals are required at about 125° C.

The following two oxidation reactions

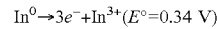

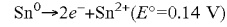

show the oxidation potentials of these two elements as to assess the relative proportion of these two elements to be incorporated into the electroless plating bath as to achieve the desired alloy composition and the desired liquidus temperature shown on the phase diagram. Again, the Pourbaix diagrams of these two elements in water-based solutions can be used to predict at which pH the solution should operate to achieve electroless plating.

FIG. 25 shows the In—Bi phase diagram.

This phase diagram shows that the electroless plating of a indium metal alloyed with a small proportion of bismuth could provide "warm" binary metal alloy solders with liquidus temperatures ranging from 156.8° C. to about 70° C. if the gallium content is limited to 50 weight percent. A very interesting characteristic of this In—Bi metal system is the capability to precisely control the liquidus temperature at 75.0+/−5.0° C. within a relatively large alloy composition of 34.5±3.5 weight percent of bismuth in indium. Similarly, this In—Bi metal system is also capable of a good control of the liquidus temperature at 80.0+/−10.0° C. within a very large alloy composition of 39.0+/−11.0 weight percent of bismuth in indium. This In—Bi metal system provides another relatively forgiving technique to control the liquidus temperature around 80° C. and to allow a very predictable and very forgiving low temperature metal-based hermetic bonding of the MEMS wafer and the LID wafer of wafer-level packages in these critical applications where hermetic seals are required at about 80° C. The following two oxidation reactions

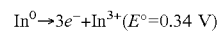

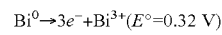

show the oxidation potentials of these two elements as to assess the relative proportion of these two elements to be incorporated into the electroless plating bath as to achieve the desired alloy composition and the desired liquidus temperature shown on the phase diagram. Again, the Pourbaix diagrams of these two elements in water-based solutions can be used to predict at which pH the solution should operate to achieve electroless plating.

FIG. 26 shows the In—Zn phase diagram again obtained from the ASM Handbook, Volume 3: "Alloy Phase Diagrams". This phase diagram shows that the electroless plating of a indium metal alloyed with a small proportion of zinc could provide "warm" binary metal alloy solders with liquidus temperatures ranging from 156.8° C. to about 300° C. if the zinc content is limited to 23.0 atomic percent. An interesting characteristic of this In—Zn metal system is the capability to precisely control the liquidus temperature at 1 49.6+/−6.0° C. within a relatively large alloy composition of 2.5+/−2.5 atomic percent of zinc in indium. This In—Zn metal system then provides a relatively forgiving technique for a precise temperature control of a liquidus temperature around 1 50° C. and allows a very predictable and very forgiving low temperature metal-based hermetic bonding of the MEMS wafer and the LID wafer of wafer-level packages in these critical applications where hermetic seals are required at about 150° C.

The following two oxidation reactions $In^0 \rightarrow 3e^- + In^{3+} (E°=0.34 \text{ V})$ $Zn^0 \rightarrow 2e^- + Zn^{2+} (E°=0.76 \text{ V})$ show the oxidation potentials of these two elements as to assess the relative proportion of these two elements to be incorporated into the electroless plating bath as to achieve the desired alloy composition and the desired liquidus temperature shown on the phase diagram. Again, the Pourbaix diagrams of these two elements in water-based solutions can be used to predict at which pH the solution should operate to achieve electroless plating.

FIG. 27 shows the In—Mg phase diagram again obtained from the ASM Handbook, Volume 3: "Alloy Phase Diagrams". This phase diagram shows that the electroless plating of a indium metal alloyed with a small proportion of magnesium could provide "warm" binary metal alloy solders with liquidus temperatures ranging from 156.8° C. to about 300° C. if the magnesium content is limited to 15.0 atomic percent. This gradual and relatively steep increase of the binary alloy liquidus temperature as function of the magnesium content probably makes indium-magnesium binary alloys difficult ones to control to achieve repeatable liquidus temperatures below the desirable upper limit of about 300° C. The following two oxidation reactions $In^0 \rightarrow 3e^- + In^{3+} (E°=0.34 \text{ V})$ $Mg^0 \rightarrow 2e^- + Mg^{2+} (E°=2.36 \text{ V})$ show the oxidation potentials of these two elements as to assess the relative proportion of these two elements to be incorporated into the electroless plating bath as to achieve the desired alloy composition and the desired liquidus temperature shown on the phase diagram. Again, the Pourbaix diagrams of these two elements in water-based solutions can be used to predict at which pH the solution should operate to achieve electroless plating.

FIG. 28 shows the In-Ge phase diagram phase diagram again obtained from the ASM Handbook, Volume 3: "Alloy Phase Diagrams". This phase diagram shows that the electroless plating of a indium metal alloyed with a small proportion of germanium could provide "warm" binary metal alloy solders with liquidus temperatures ranging from 156.8° C. to the desirable upper limit of about 300° C. achieved at a germanium content of only about 1 atomic percent. As for the Ga—Ge, the Ga—Ag, and the Ga—Cu alloys, the very steep increase of the In—Ge binary alloys liquidus temperature as function of the exact germanium content makes indium-germanium binary alloys undesirable because a repeatable liquidus temperature at temperatures below the desirable upper limit of about 300° C. will be difficult to maintain in production.

FIG. 29 shows the In—Ag phase diagram phase diagram again obtained from the ASM Handbook, Volume 3: "Alloy Phase Diagrams". This phase diagram shows that the electroless plating of a indium metal alloyed with a small proportion of silver could provide "warm" binary metal alloy solders with liquidus temperatures ranging from 156.6° C. to the desirable upper limit of about 300° C. achieved at a silver content of about 16 atomic percent. An interesting characteristic of this In—Ag metal system is the capability to precisely control the liquidus temperature at 150.3+/−6.3° C. within a relatively large alloy composition of 2.0+/−2.0 atomic percent of silver in indium. This In—Ag metal system then provides a relatively forgiving technique for a precise temperature control of a liquidus temperature around 150° C. and allows a very predictable and very forgiving low temperature metal-based hermetic bonding of the MEMS wafer and the LID wafer of wafer-level packages in these critical applications where hermetic seals are required at about 150° C. The following two oxidation reactions $In^0 \rightarrow 3e^- + In^{3+} (E°=0.34 \text{ V})$ $Ag^0 \rightarrow e^- + Ag^+ (E°=0.80 \text{ V})$ show the oxidation potentials of these two elements as to assess the relative proportion of these two elements to be incorporated into the electroless plating bath as to achieve the desired alloy composition and the desired liquidus temperature shown on the phase diagram. Again, the Pourbaix diagrams of these two elements in water-based solutions can be used to predict at which pH the solution should operate to achieve electroless plating.

FIG. 30 shows the In—Cu phase diagram obtained from the ASM Handbook, Volume 3: "Alloy Phase Diagrams". This phase diagram shows that the electroless plating of a indium metal alloyed with a small proportion of copper could provide "warm" binary metal alloy solders with liquidus temperatures ranging from 156.6° C. to the desirable upper limit of about 300° C. achieved at a copper content of only about 7.0 atomic percent. This phase diagram shows that the electroless plating of an indium metal alloyed with a small proportion of copper could provide "warm" binary metal alloy solders with much higher liquidus temperatures ranging from 156.6° C. to the desirable upper limit of about 300° C. achieved at a copper content of about 7.0 atomic percent. As for the Ga—Ge, the Ga—Ag, the Ga—Cu and the In—Ge alloys, the very steep increase of the In—Cu binary alloys liquidus temperature as function of the exact copper content makes indium-copper binary alloys undesirable because a repeatable liquidus temperature at temperatures below the desirable upper limit of about 300° C. will be difficult to maintain in production.

Of the indium-based binary metal alloy solders, the most interesting "warm" binary metal alloy solders are: In—Ga (for liquidus temperatures as low as 70° C.), In—Sn (for liquidus temperatures of about 120-1 25° C.), In—Bi (for liquidus temperatures of about 75-80° C.), In—Zn (for liquidus temperatures of about 150° C.) and In—Ag (for liquidus temperatures of about 150° C.) since their liquidus temperature is gradually increasing as function of the gallium, tin, bismuth, zinc or silver alloying. The In—Mg, In—Ge and In—Cu binary metal alloys are undesirable because their liquidus temperatures vary too much as function of the magnesium, germanium or copper alloying metal content.

Tin has a "hot" melting point of 232.1° C. and its binary metal alloy solders will be treated in this invention as a "hot" binary metal alloy solders. The desirable tin-based binary metal solders are again the following:

| Alloying element | Tin (Sn) base element |
|---|---|
| Gallium (Ga) | Tin-rich side of the Sn—Ga phase diagram |
| Indium (In) | Tin-rich side of the Sn—In phase diagram |
| Tin (Sn) | Pure tin Metal |
| Bismuth (Bi) | Tin-rich side of the Sn—Bi phase diagram |
| Zinc (Zn) | Tin-rich side of the Sn—Zn phase diagram |
| Magnesium (Mg) | Tin-rich side of the Sn—Mg phase diagram |
| Germanium (Ge) | Tin-rich side of the Sn—Ge phase diagram |
| Silver (Ag) | Tin-rich side of the Sn—Ag phase diagram |
| Copper (Cu) | Tin-rich side of the Sn—Cu phase diagram |

The electroless plating of pure tin was discussed above in relation to the electroless plating of pure metals. Pure indium metal has a "warm" fusion temperature of 156.8° C.

FIG. 17 shows the Sn—Ga phase diagram.

This phase diagram shows that the electroless plating of a tin metal alloyed with a small proportion of gallium could provide "hot" binary metal alloy solders with liquidus temperatures ranging from 232.1° C. to about 125° C. if the gallium content is limited to 50 atomic percent. The linear relationship between the gallium content (from 0 atomic percent to 50 atomic percent) and the associated liquidus temperature (from 232.1° C. to about 125° C.) provides a control of the liquidus temperature within about +/−10° C. for a variation of about +/−5.0 atomic percent of gallium in tin. This relatively forgiving characteristics allows a predictable low temperature metal-based hermetic bonding of the MEMS wafer and the LID wafer of wafer-level packages in these critical applications where low-temperature hermetic seals are required at a given temperature between 125° C. and 232° C.

The following two oxidation reactions:

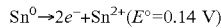

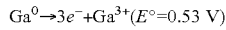

show the oxidation potentials of these two elements as to assess the relative proportion of these two elements to be incorporated into the electroless plating bath as to achieve the desired alloy composition and the desired liquidus temperature shown on the phase diagram. The Pourbaix diagrams of these two elements in water-based solutions can be used to predict at which pH the solution should operate to achieve electroless plating.

FIG. 24 shows the Sn—In phase diagram.

This phase diagram shows that the electroless plating of a tin metal alloyed with a small proportion of indium could provide "hot" binary metal alloy solders with liquidus temperatures ranging from 232.1° C. to about 120° C. if the indium content is limited to 50 atomic percent. As for Sn—Ga, the Sn—In system shows a very linear relationship between the indium content (from 0 atomic percent to 50 atomic percent) and the associated liquidus temperature (from 232.1° C. to about 120° C.) provides a control of the liquidus temperature within about +/−11° C. for a variation of about +/−5.0 atomic percent of indium in tin in this range of Sn—In alloy composition. This relatively forgiving characteristics allows a predictable low temperature metal-based hermetic bonding of the MEMS wafer and the LID wafer of wafer-level packages in these critical applications where low-temperature hermetic seals are required at a given temperature between 120° C. and 232° C. The following two oxidation reactions:

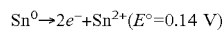

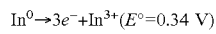

show the oxidation potentials of these two elements as to assess the relative proportion of these two elements to be incorporated into the electroless plating bath as to achieve the desired alloy composition and the desired liquidus temperature shown on the phase diagram. The Pourbaix diagrams of these two elements in water-based solutions can be used to predict at which pH the solution should operate to achieve electroless plating.

FIG. 31 shows the Sn—Bi phase diagram.

This phase diagram shows that the electroless plating of a tin metal alloyed with a small proportion of bismuth could provide "hot" binary metal alloy solders with liquidus temperatures ranging from 232.1° C. to about 141° C. if the bismuth content is limited to 58 weight percent. A very interesting characteristic of this Sn—Bi metal system is the capability to precisely control the liquidus temperature at 146.0+/−5.0° C. within a relatively large alloy composition of 55.5+/−4.5 weight percent of bismuth in tin. Similarly, this Sn—Bi metal system is also capable of a control of the liquidus temperature at 151.0+/−10.0° C. within a very large alloy composition of 54.7+/−8.7 weight percent of bismuth in tin. This Sn—Bi metal system provides a forgiving technique for a precise temperature control of a liquidus temperature around 150° C. and allows a predictable and forgiving low temperature metal-based hermetic bonding of the MEMS wafer and the LID wafer of wafer-level packages in these critical applications where hermetic seals are required at about 150° C.

The following two oxidation reactions:

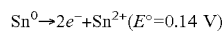

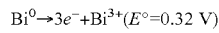

show the oxidation potentials of these two elements as to assess the relative proportion of these two elements to be incorporated into the electroless plating bath as to achieve the desired alloy composition and the desired liquidus temperature shown on the phase diagram. The Pourbaix diagrams of these two elements in water-based solutions can be used to predict at which pH the solution should operate to achieve electroless plating.

FIG. 32 shows the Sn—Zn phase diagram obtained from the ASM Handbook, Volume 3: "Alloy Phase Diagrams". This phase diagram shows that the electroless plating of a tin metal alloyed with a small proportion of zinc could provide "hot" binary metal alloy solders with liquidus temperatures ranging from 232.1° C. to about 300° C. if the zinc content is limited to 38 atomic percent. A very interesting characteristic of this Sn—Zn metal system is the capability to precisely control the liquidus temperature at 203.5+/−5.0° C. within a relatively large alloy composition of 12+/−4.0 atomic percent of zinc in tin and to control the liquidus temperature at 208.5+/−0.0° C. within a very large alloy composition of 11.5+/−5.0 atomic percent of zinc in tin. Another very interesting characteristics of this Sn—Zn metal system is its capability to control the liquidus temperature at 285.0+/−15.0° C. within a relatively large alloy composition of 36+/−2.5 atomic percent of zinc in tin. This Sn—Zn metal system provides one of the most forgiving technique for a precise temperature control of a liquidus temperature around 200° C. and provides one way to allow a controllable liquidus temperature around 285° C. for higher temperatures metal-based hermetic bonding of the MEMS wafer and the LID wafer of wafer-level packages in these critical applications where hermetic seals are required at about 200° C. or at about 285° C. The following two oxidation reactions

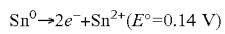
$$Sn^0 \rightarrow 2e^- + Sn^{2+} (E°=0.14\ V)$$

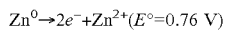
$$Zn^0 \rightarrow 2e^- + Zn^{2+} (E°=0.76\ V)$$

show the oxidation potentials of these two elements as to assess the relative proportion of these two elements to be incorporated into the electroless plating bath as to achieve the desired alloy composition and the desired liquidus temperature shown on the phase diagram. The Pourbaix diagrams of these two elements in water-based solutions can be used to predict at which pH the solution should operate to achieve electroless plating.

FIG. 33 shows the Sn—Mg phase diagram obtained from the ASM Handbook, Volume 3: "Alloy Phase Diagrams". This phase diagram shows that the electroless plating of a tin metal alloyed with a small proportion of magnesium could provide "hot" binary metal alloy solders with liquidus temperatures ranging from 232.1° C. to about 300° C. if the magnesium content is limited to 18 atomic percent. As for the Sn—Zn system, a very interesting characteristic of this Sn—Mg metal system is the capability to precisely control the liquidus temperature at 208.5+/−5.0° C. within a controllable alloy composition of 8.5+/−2.0 atomic percent of magnesium in tin. Similarly, this Sn—Mg metal system is also capable of a control of the liquidus temperature at 213.5+/−10.0° C. within a relatively large alloy composition of 7.5+/−3.8 atomic percent of magnesium in tin. This Sn—Mg metal system provides a relatively forgiving technique for a precise temperature control of a liquidus temperature around 210° C. and allows a predictable and relatively forgiving low temperature metal-based hermetic bonding of the MEMS wafer and the LID wafer of wafer-level packages in these critical applications where hermetic seals are required at about 210° C.

The following two oxidation reactions

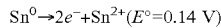
$$Sn^0 \rightarrow 2e^- + Sn^{2+} (E°=0.14\ V)$$

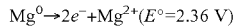
$$Mg^0 \rightarrow 2e^- + Mg^{2+} (E°=2.36\ V)$$

show the oxidation potentials of these two elements as to assess the relative proportion of these two elements to be incorporated into the electroless plating bath as to achieve the desired alloy composition and the desired liquidus temperature shown on the phase diagram. The Pourbaix diagrams of these two elements in water-based solutions can be used to predict at which pH the solution should operate to achieve electroless plating.

FIG. 34 shows the Sn—Ge phase diagram obtained from the ASM Handbook, Volume 3: "Alloy Phase Diagrams". This phase diagram shows that the electroless plating of a tin metal alloyed with a small proportion of germanium could provide "hot" binary metal alloy solders with liquidus temperatures ranging from 232.1° C. to the desirable upper limit of about 300° C. achieved at a germanium content of only about 1.5 atomic percent. This very steep increase of the binary alloy liquidus temperature as function of the exact germanium content makes tin-germanium binary alloys undesirable because a repeatable liquidus temperature at temperatures below the desirable upper limit of about 300° C. will be extremely difficult to maintain in production.

FIG. 35 shows the Sn—Ag phase diagram.

This phase diagram shows that the electroless plating of a tin metal alloyed with a small proportion of silver could provide "hot" binary metal alloy solders with liquidus temperatures ranging from 232.1° C. to the desirable upper limit of about 300° C. achieved at a silver content of about 10.5 atomic percent. A characteristic of this Sn—Ag metal system is the capability to control the liquidus temperature at 226.5+/−5.0° C. within an alloy composition of 2.5+/−2.5 atomic percent of silver in tin. Another interesting characteristics of this Sn—Ag metal system is its capability to control the liquidus temperature at 285.0+/−15.0° C. within an alloy composition of 8.0+/−1.5 atomic percent of silver in tin. This Sn—Ag metal system provides a technique for a precise temperature control of a liquidus temperature around 225° C. and provides another way to allow a controllable liquidus temperature around 285° C. for higher temperatures metal-based hermetic bonding of the MEMS wafer and the LID wafer of wafer-level packages in these critical applications where hermetic seals are required at about 225° C. or at about 285° C.

The following two oxidation reactions

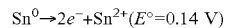
$$Sn^0 \rightarrow 2e^- + Sn^{2+} (E°=0.14\ V)$$

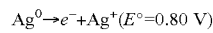
$$Ag^0 \rightarrow e^- + Ag^+ (E°=0.80\ V)$$

show the oxidation potentials of these two elements as to assess the relative proportion of these two elements to be incorporated into the electroless plating bath as to achieve the desired alloy composition and the desired liquidus temperature shown on the phase diagram. The Pourbaix diagrams of these two elements in water-based solutions can be used to predict at which pH the solution should operate to achieve electroless plating.

FIG. 36 shows the Sn—Cu phase obtained from the ASM Handbook, Volume 3: "Alloy Phase Diagrams". This phase diagram shows that the electroless plating of a tin metal alloyed with a small proportion of copper could provide "hot" binary metal alloy solders with liquidus temperatures ranging from 232.1° C. to the desirable upper limit of about 300° C. achieved at a silver content of about 5.0 atomic percent. A characteristic of this Sn—Cu metal system is the capability to control the liquidus temperature at 226.5+/−5.0° C. within an alloy composition of 0.85+/−0.85 atomic percent of copper in tin. Another characteristics of this Sn—Cu metal system is its capability to control the liquidus temperature at 285.0+/−15.0° C. within an alloy composition of 4.25+/−0.75 atomic percent of copper in tin. When compared to the Sn—Ag metal system, this Sn—Cu metal system requires a much tighter control of the alloy composition to provide a liquidus temperature around 225° C. or a liquidus temperature around 285° C. This Sn—Cu metal system is then less desirable than the Sn—Ag metal system for higher temperatures metal-based hermetic bonding of the MEMS wafer and the LID wafer of wafer-level packages in these critical applications where hermetic seals are required at about 225° C. or at about 285° C.

Of the tin-based binary metal alloy solders, the, most interesting "hot" binary metal alloy solders are: Sn—Ga (for a control of the liquidus temperatures within ±10° C. within 125° C. and 232° C. associated with a composition for a variation of within ±5.0 at % Ga), Sn—In (for a control of the liquidus temperatures within ±11° C. within 120° C. and 232° C. associated with a composition for a variation of within ±5.0 at % In), Sn—Bi (for a good control of the liquidus temperature at around 146-151° C.), Sn—Zn (for a good control of the liquidus temperature within 209±11° C. or 285±15° C.), Sn—Mg (for a good control of the liquidus temperature within 209±5° C. or 214±10° C.), Sn—Ag (for a good control of the liquidus temperature within 227±5° C. or 285±15° C.) and Sn—Cu (for a good control of the liquidus temperature within 227±5° C. or 285±15° C.) since their liquidus temperature is gradually increasing as function of the gallium, indium, bismuth, zinc, magnesium, silver or copper alloying. The In—Ge binary metal alloys are undesirable because their liquidus temperatures vary too much as function of the germanium alloying metal content.

The lead-free solders are preferred as to follow the emerging environmentally conscious electronics trend in USA, Europe and Asia. To these lead-free solders are potentially associated undesirable whiskers which can grow at room temperature over time. These whiskers can be prevented if the lead-free tin-based solders are fabricated as to achieve a tensile mechanical stress and/or if a nickel layer is positioned under and over the lead-free solders prone to whiskers as to prevent their interaction with the underlying and overlying metals.

The possible choices lead-free solders which could be electroless plated on the "Lid wafer" using CMOS, high-voltage CMOS and CCD compatible electroless plating solutions as to achieve soldering at temperatures ranging from 25 to 300° C. are the following pure metals or binary metallic alloys:

The simplest solders are still the ones made of pure metals. Out of the metals of the periodic table of the elements, only a few metal elements have a melting point between 25° C. and 300° C.: Gallium has a melting point of only 29.8° C. and treated in this invention as a "cold" solder for which there are no electroless plating solutions available; Indium (melting point of 156.8° C. and treated in this invention as a "warm" solder) for which there are no reports of any CMOS compatible (sodium-free, potassium-free and lithium-free) electroless indium plating solutions.

H. Shimauchi's U.S. Pat. No. 4,959,278 describes an electroless indium plating solution made of the following three chemicals: a chlorine-free and alkali-free source of indium: Indium sulfate, $In_2(SO_4)_3$ or indium nitride, $In(NO_3)_3$, or indium methanesulfonate, $In(CH_3SO_3)_2$; a chlorine-free and alkali-free acid, such as: Sulfuric acid, $H_2SO_4$, ethylenediaminetetraacetic acid (EDTA), $C_{10}H_{16}N_2O_8$, nitrilotriacetic acid (NTA), $N(CH_2COOH)_3$, Tartaric acid, $HOOC(CH_2O)_2COOH$, or citric acid, $C_6H_8O_7$; and a chlorine-free, an alkali-free and an operator-safe complexing agent, such as: thiourea, $(NH_2)_2CS$.

Tin has a melting point of 232.1° C. and is treated as a "hot" solder for which there are only a few reports of chlorine-free and CMOS compatible (sodium-free, potassium-free and lithium-free) electroless indium plating solutions made of operator-safe chemicals: E. W. Kindelaar's U.S. Pat. Nos. 4,550,037 & 4,618,513 describing an electroless tin plating solution made of: a chlorine-free and and alkali-free source of tin: Stannous sulfate, $SnSO_4$; a chlorine-free and alkali-free acid: Sulphuric acid, $H_2SO_4$;.

H. Uchida's U.S. Pat. No. 5,248,527 describes various electroless tin plating solutions made of the following three chemicals: a chlorine-free and alkali-free source of tin: Stannous sulfate, $SnSO_4$; a chlorine-free and alkali-free acid, such as: Fluoroboric acid, $BF_4H$, phosphoric acid, $H_3PO_4$, or an organic sulfonic acid, such as: Methane sulfonic acid, $CH_3SO_3H$. The fluoroboric acid and organic sulfonic acids are chlorine-free, CMOS compatible and relatively safe for the operators of the electroless tin plating bath; a chlorine-free, an alkali-free and an operator-safe complexing agent, such as: Tartaric acid, $HOOC(CH_2O)_2COOH$, citric acid, $C_6H_8O_7$, ethylenediaminetetraacetic acid (EDTA), $C_{10}H_{16}N_2O_8$, thiourea, $(NH_2)_2CS$, or triethanol amine, $(HOCH_2CH_2)_3N$.

The three distinct solder temperatures of 29.8° C., 156.8° C. and 232.1° C. of the upper-mentioned pure metal solders are not very convenient for many wafer-level packages which could benefit from alternate temperatures between these values or even slightly higher temperatures up to the desirable upper limit of about 300° C. The electroless plating of a binary metal alloy results in either an intermediate solder temperature or a slightly higher solder temperature up to about 300° C. More, the formation of a binary metal alloy will also result in improved mechanical properties, such as improved ductility, reducing the risk of a leaky wafer-level package resulting from thermal or mechanical shocks applied to the wafer-level package, and/or to reduced whiskers.

The main element of these electroless deposited binary metal solders is still either gallium, indium or tin. The alloying elements having a melting temperature below 1000° C. were selected as to avoid the binary alloy solder (alloyed to either gallium, indium or tin) to have excessive sensitivity of the reflow temperature to the relative proportion of the two forming elements of the binary alloy and as to ensure a more repeatable solder temperature of the binary alloy over the life of the electroless plating bath. The radioactive alloying elements (astatine, neptunium, plutonium, radium, mendelevium, nobelium, einsteinium and californium) were excluded, the toxic elements (cadmium, lead, thallium, tellurium, antimony, barium, cerium, arsenic and lanthanum) were excluded, aluminium (too readily oxidized and then hard to electroless plate) was excluded and the rare elements (strontium, ytterbium, europium and praseodymium) were also excluded. The remaining elements to consider forming such a binary alloy solder with either gallium, indium or tin are then:

| Alloying element | Gallium (Ga) base element | Indium (In) base element | Tin (Sn) base element |
| --- | --- | --- | --- |
| Gallium (Ga) | Pure gallium metal | Indium-rich side of the In—Ga phase diagram | Tin-rich side of the Sn—Ga phase diagram |
| Indium (In) | Gallium-rich side of the Ga—Sn phase diagram | Pure indium metal | Tin-rich side of the Sn—In phase diagram |
| Tin (Sn) | Gallium-rich side of the Ga—Sn phase diagram | Indium-rich side of the In—Sn phase diagram | Pure tin metal |

-continued

| Alloying element | Gallium (Ga) base element | Indium (In) base element | Tin (Sn) base element |
|---|---|---|---|
| Bismuth (Bi) | Gallium-rich side of the Ga—Bi phase diagram | Indium-rich side of the In—Bi phase diagram | Tin-rich side of the Sn—Bi phase diagram |
| Zinc (Zn) | Gallium-rich side of the Ga—Zn phase diagram | Indium-rich side of the In—Zn phase diagram | Tin-rich side of the Sn—Zn phase diagram |
| Magnesium (Mg) | Gallium-rich side of the Ga—Mg phase diagram | Indium-rich side of the In—Mg phase diagram | Tin-rich side of the Sn—Mg phase diagram |
| Germanium (Ge) | Gallium-rich side of the Ga—Ge phase diagram | Indium-rich side of the In—Ge phase diagram | Tin-rich side of the Sn—Ge phase diagram |
| Silver (Ag) | Gallium-rich side of the Ga—Ag phase diagram | Indium-rich side of the In—Ag phase diagram | Tin-rich side of the Sn—Ag phase diagram |
| Copper (Cu) | Gallium-rich side of the Ga—Cu phase diagram | Indium-rich side of the In—Cu phase diagram | Tin-rich side of the Sn—Cu phase diagram |

The binary alloy solders with either gallium, indium or tin, which could be electroless plated on the "Lid wafer" using CMOS, high-voltage CMOS and CCD compatible electroless plating solutions as to achieve soldering at temperatures ranging from 25 to 300° C. are described below.

Of the gallium-based binary metal alloy solders, the most interesting "cold" binary metal alloy solders are: Ga—In (for liquidus temperatures ranging from 15.3° C. to about 70° C.), Ga—Sn (for liquidus temperatures ranging from 20.5° C. to about 125° C.), Ga—Bi (for liquidus temperatures ranging from 29.8° C. to about 262° C.) and Ga—Zn (for liquidus temperatures ranging from 29.8° C. to about 250° C.) since their liquidus temperature is gradually increasing as function of the indium, tin, bismuth or zinc alloying element. These gallium-based "cold" binary metal alloys are to be electroless plated from chlorine-free, alkali-free (sodium-free, potassium-free and lithium-free) and operator-safe plating solutions.

Of the indium-based binary metal alloy solders, the most interesting "warm" binary metal alloy solders are: In—Ga (for liquidus temperatures as low as 70° C.), In—Sn (for liquidus temperatures of about 120-125° C.), In—Bi (for liquidus temperatures of about 75-80° C.), In—Zn (for liquidus temperatures of about 150° C.) and In—Ag (for liquidus temperatures of about 150° C.) since their liquidus temperature is gradually increasing as function of the gallium, tin, bismuth, zinc or silver alloying. These indium-based "warm" binary metal alloys are to be electroless plated from chlorine-free, alkali-free (sodium-free, potassium-free and lithium-free) and operator-safe plating solutions.

Of the tin-based binary metal alloy solders, the most interesting "hot" binary metal alloy solders are: Sn—Ga (for a control of the liquidus temperatures within ±10° C. within 125° C. and 232° C. associated with a composition for a variation of within ±5.0 at % Ga), Sn—In (for a control of the liquidus temperatures within ±11° C. within 120° C. and 232° C. associated with a composition for a variation of within ±5.0 at % In), Sn—Bi (for a good control of the liquidus temperature at around 146-151° C.), Sn—Zn (for a good control of the liquidus temperature within 209±11° C. or 285±15° C.), Sn—Mg (for a good control of the liquidus temperature within 209±5° C. or 214±10° C.), Sn—Ag (for a good control of the liquidus temperature within 227±5° C. or 285±15° C.) and Sn—Cu (for a good control of the liquidus temperature within 227±5° C. or 285±15° C.) since their liquidus temperature is gradually increasing as function of the gallium, indium, bismuth, zinc, magnesium, silver or copper alloying. These tin-based "hot" binary metal alloys are to be electroless plated from chlorine-free, alkali-free (sodium-free, potassium-free and lithium-free) and operator-safe plating solutions.

The basic structure of a MEMS wafers in accordance with one embodiment of the invention is composed of three layers as shown in FIGS. 37a to 37c.

As shown in FIG. 37a, the lid wafer generally designated 100 comprises a substrate 10, a seed layer 12, a structural under-layer 14, an anti-oxidation layer 16, and a solder layer 18.

As shown in FIG. 37b, the MEMS wafer generally designated 200 comprises a substrate 20, a layer of structural material 22 patterned to form the MEMS cavity, a seed layer 24, a structural under-layer 26, and an anti-oxidation layer 28, capable of being soldered to the solder of the "Lid wafer". The layers are suitably patterned so that the lid wafer 100 and the MEMS wafer 200 can be soldered together by the solder layer 18 as the opposing parts come into contact.

The seed layer 24 of "MEMS wafers" is typically either: a doped silicon layer or substrate with a bulk resistivity lower than 100 ohm.cm, and preferably lower than 100 mohm.cm. This silicon can be the silicon substrate itself or a deposited silicon; or a metal layer with a bulk resistivity lower than 100 mohm.cm, and preferably lower than 100 µohm.cm. This metal layer could be titanium or its compounds, tungsten or its compounds, copper or preferably aluminum or an aluminum alloy;

The structural under-layer 26 is deposited using electroless (autocatalytic) plating technologies. This material can be any metal that can be electrolessly deposited and which can sustain the temperature required by the solder to seal the "Lid wafer" and the "MEMS wafer". A preferred material is nickel.

Electroless nickel is deposited using alkali-free (sodium-free, potassium-free and lithium-free) and chlorine-free electroless chemistries as to allow the production of wafer-level packages for advanced MEMS integrating MEMS, CMOS, high-voltage CMOS and/or CCD components. A total alkali concentration and a chlorine concentration lower one part per million (1 ppm) in the plating solution will be considered alkali-free and chlorine-free.

A first alkali-free and chlorine-free electroless nickel process could be the nickel sulphate—nickel hypophosphite process:

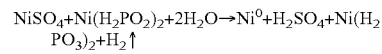

Unfortunately, the transformation of nickel sulfite into sulphuric acid, $H_2SO_4$, and other sulfates accumulating in the bath as contaminants decreases the pH, lowers the formation of the required OH⁻ ions and slows-down the plating rate. The resulting accumulation of contaminants and the undesirable drift of the composition of the plating bath and of the mechanical properties of the electroless nickel imposes a short bath life and a higher operation cost.

Since the produced sulfite ions do not contribute anything to the plating of metal nickel:

$$NiSO_4 \rightarrow Ni^{+2} + SO_4^{-2}$$

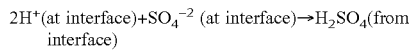
$$2H^+ \text{(at interface)} + SO_4^{-2} \text{(at interface)} \rightarrow H_2SO_4 \text{(from interface)}$$

and since the sulfite ions cause an instability of the electroless plating solution and a reduction of the bath life. It is then to use a sulfite-free electroless plating solution.

An alkali-free and chlorine-free electroless nickel process using the nickel hypophosphite process without nickel sulphite is preferred since it prevents the formation and acculululation of undesirable nickel sulfates and sulphuric acid contaminants in the plating bath:

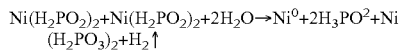
$$Ni(H_2PO_2)_2 + Ni(H_2PO_2)_2 + 2H_2O \rightarrow Ni^0 + 2H_3PO^2 + Ni(H_2PO_3)_2 + H_2 \uparrow$$

The oxidation of nickel hypophosphite, $Ni(H_2PO_2)_2$, results in the formation of nickel orthophosphite, $Ni(H_2PO_3)_2$, a white slurry-like by-product precipitating into the plating solution and an alkali-free and CMOS-friendly purification system capable of eliminating the nickel orthophosphite by-product from the plating solution is desired as to ensure more stable processing and a longer bath life.

Since electroless nickel (and other electroless metals covered by the present patent application) is prone to oxidation upon exposure to air and forms a thin layer of a very stable oxide which prevents proper soldering to the solder of the lid wafer 100, an alkali-free and CMOS friendly noble metal layer is to be electroless plated onto the electroless nickel layer (or any other electroless metals covered by the present patent application). The preferred alkali-free and CMOS friendly electroless noble are: platinum, rhodium and ruthenium.

An alkali-free (sodium-free, potassium-free, lithium-free), hydrazine-free, dimethylamine borane-free and chlorine-free immersion and/or electroless platinum plating solution ensures: compatibility with CMOS, high-voltage CMOS and CCD; safe operation for the operators and environmental-friendly plating solution; and corrosion-free advanced MEMS devices integrating sensitive metals.

An example of alkali-free (sodium-free, potassium-free, lithium-free), hydrazine-free, dimethylamine borane-free and chlorine-free sulphur-based immersion and/or electroless platinum plating solution may use: platinum sulfate, $Pt(SO_4)_2$, as source of platinum; ethylenediaminetetraacetic acid (EDTA), $C_{10}H_{16}N_2O_8$, which is a much safer acid than hydrazine, $N_2H_4$, or dimethylamine borane (DMAB), $(CH_3)_2 NHBH_3$; ammonium hydroxide, $NH_4OH$, as buffer to control the pH.

Since rhodium is less precious than platinum it will provide a lower cost solution. An example of alkali-free (sodium-free, potassium-free, lithium-free), hydrazine-free, dimethylamine borane-free and chlorine-free sulphur-based immersion and/or electroless rhodium plating solution may use: rhodium sulfate, $Rh(SO_4)_2$, as source of rhodium; ethylenediaminetetraacetic acid (EDTA), $C_{10}H_{16}N_2O_8$, which is a much safer acid than hydrazine, $N_2H_4$, or dimethylamine borane (DMAB), $(CH_3)_2NHBH_3$; and ammonium hydroxide, $NH_4OH$, as buffer to control the pH.

Since ruthenium is also less precious than platinum it will also provide a lower cost solution. An example of alkali-free (sodium-free, potassium-free, lithium-free), hydrazine-free, dimethylamine borane-free and chlorine-free sulphur-based immersion and/or electroless ruthenium plating solution may use: Ruthenium sulfate, $RuSO_4$, as source of ruthenium; Ethylenediaminetetraacetic acid (EDTA), $C_{10}H_{16}N_2O_8$, which is a much safer acid than hydrazine, $N_2H_4$, or dimethylamine borane (DMAB), $(CH_3)_2NHBH_3$; Ammonium hydroxide, $NH_4OH$, as buffer to control the pH.

As noted above, the basic structure of the "LID wafers" in accordance with embodiments of the invention is composed of four layers, namely the seed layer 12, the structural under-layer 14; the anti-oxidation layer 16; and the solder layer 18 capable of soldering to the anti-oxydation layer 28 of the "MEMS wafers".

The seed layer 12 of the lid wafers 100 is typically either: a doped silicon layer or substrate with a bulk resistivity lower than 100 ohm.cm, and preferably lower than 100 mohm.cm. This silicon can be the silicon substrate itself or a deposited silicon; or metal layer with a bulk resistivity lower than 100 mohm.cm, and preferably lower than 100 µohm.cm. This metal layer could be titanium or its compounds, tungsten or its compounds, copper or preferably aluminum or an aluminum alloy;

The structural under-layers 14, 26 are deposited using electroless (autocatalytic) plating technologies. This material can be any metal that can be electroless deposited and which can sustain the temperature required by the solder to seal the "Lid wafer" and the "MEMS wafer". A preferred material is nickel.

Electroless nickel is deposited using alkali-free (sodium-free, potassium-free and lithium-free) and chlorine-free electroless chemistries to allow the production of wafer-level packages for advanced MEMS integrating MEMS, CMOS, high-voltage CMOS and/or CCD components. A total alkali concentration and a chlorine concentration lower one part per million (1 ppm) in the plating solution will be considered alkali-free and chlorine-free.

A first alkali-free and chlorine-free electroless nickel process forming the nickel structural under-layer could be the nickel sulphate—nickel hypophosphite process:

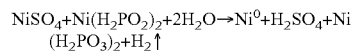
$$NiSO_4 + Ni(H_2PO_2)_2 + 2H_2O \rightarrow Ni^0 + H_2SO_4 + Ni(H_2PO_3)_2 + H_2 \uparrow$$

Unfortunately, the transformation of nickel sulfite into sulphuric acid, $H_2SO_4$, and other sulfates accumulating in the bath as contaminants decreases the pH, lowers the formation of the required OH⁻ ions and slows-down the plating rate. The resulting accumulation of contaminants and the undesirable drift of the composition of the plating bath and of the mechanical properties of the electroless nickel imposes a short bath life and a higher operation cost.

Since the produced sulfite ions do not contribute anything to the plating of metal nickel:

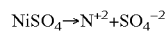
$$NiSO_4 \rightarrow N^{+2} + SO_4^{-2}$$

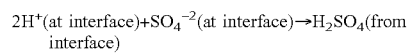
$$2H^+ \text{(at interface)} + SO_4^{-2} \text{(at interface)} \rightarrow H_2SO_4 \text{(from interface)}$$

and since the sulfite ions cause an instability of the electroless plating solution and a reduction of the bath life. It is preferred to use a sulfite-free electroless plating solution.

Electroless Nickel Under-layer Structures Obtained from the Sulfate-free and Sodium-free Nickel Hypophosphite Electroless Process An alkali-free and chlorine-free electroless nickel process using the nickel hypophosphite process without nickel sulphite is preferred for the nickel under layers since it prevents the formation and accululation of undesirable nickel sulfates and sulphuric acid contaminants in the plating bath:

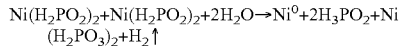
$Ni(H_2PO_2)_2 + Ni(H_2PO_2)_2 + 2H_2O \rightarrow Ni^0 + 2H_3PO_2 + Ni(H_2PO_3)_2 + H_2\uparrow$ The oxidation of nickel hypophosphite, $Ni(H_2PO_2)_2$, results in the formation of nickel orthophosphite, $Ni(H_2PO_3)_2$, a white slurry-like by-product precipitating into the plating solution and an alkali-free and CMOS-friendly purification system capable of eliminating the nickel orthophosphite by-product from the plating solution is desired as to ensure more stable processing and a longer bath life.

The Anti-oxidation Layer Used to Bond to the Solder of the Lid Wafer

Since electroless nickel (and other electroless metals covered by the present patent application) is prone to oxidation upon exposure to air and forms a thin layer of a very stable oxide which prevents proper soldering to the solder of the "Lid wafer", an alkali-free and CMOS friendly noble metal layer is to be electroless plated onto the electroless nickel layer (or any other electroless metals covered by the present patent application) to form the anti-oxidation layer. The preferred alkali-free and CMOS friendly electroless noble are: platinum, rhodium and ruthenium.

An alkali-free (sodium-free, potassium-free, lithium-free), hydrazine-free, dimethylamine borane-free and chlorine-free immersion and/or electroless platinum plating solution for the formation of the anti-oxidation protective layer ensures: compatibility with CMOS, high-voltage CMOS and CCD; safe operation for the operators and environmental-friendly plating solution; and corrosion-free advanced MEMS devices integrating sensitive metals.

An example of alkali-free (sodium-free, potassium-free, lithium-free), hydrazine-free, dimethylamine borane-free and chlorine-free sulphur-based immersion and/or electroless platinum plating solution may use: platinum sulfate, $Pt(SO_4)_2$, as source of platinum; ethylenediaminetetraacetic acid (EDTA), $C_{10}H_{16}N_2O_8$, which is a much safer acid than hydrazine, $N_2H_4$, or dimethylamine borane (DMAB), $(CH_3)_2NHBH_3$; ammonium hydroxide, $NH_4OH$, as buffer to control the pH.

Since rhodium is less precious than platinum it will provide a lower cost solution. An example of alkali-free (sodium-free, potassium-free, lithium-free), hydrazine-free, dimethylamine borane-free and chlorine-free sulphur-based immersion and/or electroless rhodium plating solution for formation of the anti-oxidation protective layer:may use: rodium sulfate, $Rh(SO_4)_2$, as source of rhodium; ehylenediaminetetraacetic acid (EDTA), $C_{10}H_{16}N_2O_8$, which is a much safer acid than hydrazine, $N_2H_4$, or dimethylamine borane (DMAB), $(CH_3)_2NHBH_3$; ammonium hydroxide, $NH_4OH$, as buffer to control the pH.

Since ruthenium is also less precious than platinum it will also provide a lower cost solution for the formation of the anti-oxidation layer. An example of alkali-free (sodium-free, potassium-free, lithium-free), hydrazine-free, dimethylamine borane-free and chlorine-free sulphur-based immersion and/or electroless ruthenium plating solution may use: ruthenium sulfate, $RuSO_4$, as source of ruthenium; ethylenediaminetetraacetic acid (EDTA), $C_{10}H_{16}N_2O_8$, which is a much safer acid than hydrazine, $N_2H_4$, or dimethylamine borane (DMAB), $(CH_3)_2NHBH_3$; ammonium hydroxide, $NH_4OH$, as buffer to control the pH;

The lid wafers 100 are also to be electroless plated with the solder itself in alkali-free, hydrazine-free, dimethylamine borane-free and chlorine-free CMOS, high-voltage CMOS and CCD compatible electroless plating solutions.

This solder will allow the soldering to the anti-oxidation layer of the "MEMS wafer" upon contact and temperature drop below the liquidus temperature of the solder thus forming the sealed micro-cavities of the wafer-level package as to achieve soldering at temperatures ranging from 25 to 300° C.

Various solutions can be employed:

Gallium has a low melting point of only 29.8° C. and is considered as a "cold" solder.

Indium has also a relatively low melting point of only 156.8° C. and is considered a "warm" solder.

An example of alkali-free (sodium-free, potassium-free, lithium-free), hydrazine-free, dimethylamine borane-free and chlorine-free electroless indium may use: Indium sulfate, $In_2(SO_4)_3$ or indium nitride, $In(NO_3)_3$, or indium methanesulfonate, $In(CH_3SO_3)_2$ as sources of indium; Sulfuric acid, $H_2SO_4$, ethylenediaminetetraacetic acid (EDTA), $C_{10}H_{16}N_2O_8$, nitrilotriacetic acid (NTA), $N(CH_2COOH)_3$, Tartaric acid, $HOOC(CH_2O)_2COOH$, or citric acid, $C_6H_8O_7$, as acid stabilizing the pH; an operator-safe complexing agent, such as: thiourea, $(NH_2)_2CS$.

Tin has a melting point of 232.1° C. and will be treated in this invention as a "hot" solder.

An example of alkali-free (sodium-free, potassium-free, lithium-free), hydrazine-free, dimethylamine borane-free and chlorine-free electroless indium may use: Stannous sulfate, $SnSO_4$ as sources of indium; Sulfuric acid, $H_2SO_4$, fluoroboric acid, BF4H, phosphoric acid, $H_3PO_4$, or an organic sulfonic acid, such as methane sulfonic acid, $CH_3SO_3H$, as acid stabilizing the pH; An operator-safe complexing agent, such as: tartaric acid, $HOOC(CH_2)_2COOH$, citric acid, $C_6H_8O_7$, ethylenediaminetetraacetic acid (EDTA), $C_{10}H_{16}N_2O_8$, thiourea, $(NH_2)_2CS$, or triethanol amine, $(HOCH_2CH_2)_3$.

The most interesting alkali-free (sodium-free, potassium-free, lithium-free), hydrazine-free, dimethylamine borane-free and chlorine-free electroless "cold" gallium-based binary metal alloy solders are: Ga—In, which phase diagram is shown in FIG. 16. This electroless binary metal solder is to be used for soldering at temperatures ranging from 15.3° C. to about 70° C.; Ga—Sn, which phase diagram is shown in FIG. 17. This electroless binary metal solder is to be used for soldering at temperatures ranging from 20.5° C. to about 125° C.; Ga—Bi, which phase diagram is shown in FIG. 18. This electroless binary metal solder is to be used for soldering at temperatures ranging from 29.8° C. to about 262° C.; Ga—Zn, which phase diagram is shown in FIG. 19. This electroless binary metal solder is to be used for soldering at temperatures ranging from 29.8° C. to about 250° C.

The most interesting alkali-free (sodium-free, potassium-free, lithium-free), hydrazine-free, dimethylamine borane-free and chlorine-free electroless "warm" indium-based binary metal alloy solders are:

In—Ga, which phase diagram is shown in FIG. 16. This electroless binary metal solder is to be used for soldering at temperatures ranging from 70° C. to about 157° C.;

In—Sn, which phase diagram is shown in FIG. 24. This electroless binary metal solder is to be used for soldering at temperatures ranging from 120° C. to about 157° C., for a tightly controlled soldering at a temperature of 122.5+/−2.5° C. within a relatively large alloy composition of 42.5+/−7.5 atomic percent of tin in indium and for a soldering temperature of 125.0+/−5.0° C. within a very large alloy composition of 39.0+/−13.0 atomic percent of tin in indium;

In—Bi, which phase diagram is shown in FIG. 25. This electroless binary metal solder is to be used for soldering at temperatures ranging from 70° C. to about 157° C., for a tightly controlled soldering at a temperature of 75.0+/−5.0° C. within a relatively large alloy composition of 34.5+/−3.5 weight percent of bismuth in indium, and for a soldering temperature of 80.0+/−10.0° C. within a very large alloy composition of.39.0+/−11.0 weight percent of bismuth in indium;

In—Zn, which phase diagram is shown in FIG. 26. This electroless binary metal solder is to be used for soldering at temperatures ranging from 157° C. to about 300° C. if the zinc content is limited to 23.0 atomic percent. This In—Zn binary alloy is to be used for a tightly controlled soldering at a temperature of 149.6+/−6.0° C. within a relatively large alloy composition of 2.5+/−2.5 atomic percent of zinc in indium;

In—Ag, whose phase diagram is shown in FIG. 29. This electroless binary metal solder is to be used for soldering at temperatures ranging from 157° C. to about 300° C. if the silver content is limited to 16.0 atomic percent. This In—Zn binary alloy is to be used for a tightly controlled soldering at a temperature of 150.3+/−6.3° C. within a relatively large alloy composition of 2.0+/−2.0 atomic percent of silver in indium;

The most interesting alkali-free (sodium-free, potassium-free, lithium-free), hydrazine-free, dimethylamine borane-free and chlorine-free electroless "hot" tin-based binary metal alloy solders are:

Sn—Ga, which phase diagram is shown in FIG. 17. This electroless binary metal solder is to be used for soldering at temperatures ranging from 125° C. to about 232° C. with a control of the liquidus temperature within about +/−10° C. for a variation of about +/−5.0 atomic percent of gallium in tin;

Sn—In, which phase diagram is shown in FIG. 24. This electroless binary metal solder is to be used for soldering at temperatures ranging from 120° C. to about 232° C. with a control of the liquidus temperature within about +/−11° C. for a variation of about +/−5.0 atomic percent of indium in tin;

Sn—Bi, which phase diagram is shown in FIG. 31. This electroless binary metal solder is to be used for soldering at temperatures ranging from 141° C. to about 232° C., for a tightly controlled soldering at a temperature of 146.0+/−5.0° C. within a relatively large alloy composition of 55.5+/−4.5 weight percent of bismuth in tin, and for a soldering temperature of 151.0+/−10.0° C. within a very large alloy composition of 54.7+/−8.7 weight percent of bismuth in tin;

Sn—Zn, which phase diagram is shown in FIG. 32. This electroless binary metal solder is to be used for soldering at temperatures ranging from 232° C. to about 300° C. if the zinc content is limited to 38 atomic percent. This Sn—Zn binary alloy is to be used for a tightly controlled soldering at a temperature of 203.5+/−5.0° C. within a relatively large alloy composition of 12+/−4.0 atomic percent of zinc in tin and for a controlled soldering at a temperature of 285.0+/−15.0° C. within a relatively large alloy composition of 36+/−2.5 atomic percent of zinc in tin;

Sn—Mg, which phase diagram is shown in FIG. 33. This electroless binary metal solder is to be used for soldering at temperatures ranging from 232° C. to about 300° C. if the magnesium content is limited to 18 atomic percent. This Sn—Mg binary alloy is to be used for a tightly controlled soldering at a temperature of 208.5+/−5.0° C. within a relatively large alloy composition of 8.5+/−2.0 atomic percent of magnesium in tin and for a controlled soldering at a temperature of 213.5+/−10.0° C. within a relatively large alloy composition of 7.5+/−3.8 atomic percent of magnesium in tin;

Sn—Ag, which phase diagram is shown in FIG. 35. This electroless binary metal solder is to be used for soldering at temperatures ranging from. 232° C. to about 300° C. if the silver content is limited to 10.5 atomic percent. This Sn—Ag binary alloy is to be used for a tightly controlled soldering at a temperature of 226.5+/−5.0° C. within a relatively large alloy composition of 2.5+/−2.5 atomic percent of silver in tin and for a controlled soldering at a temperature of 285.0+/−15.0° C. within a relatively large alloy composition of 8.0+/−1.5 atomic percent of silver in tin;

Sn—Cu, which phase diagram is shown in FIG. 35. This electroless binary metal solder is to be used for soldering at temperatures ranging from 232° C. to about 300° C. if the copper content is limited to, 5.0 atomic percent. This Sn—Ag binary alloy is to be used for a tightly controlled soldering at a temperature of 226.5+/−5.0° C. within a relatively large alloy composition of 0.85+/−0.85 atomic percent of copper in tin and for a controlled soldering at a temperature of 285.0+/−15.0° C. within a relatively large alloy composition of 4.25+/−0.75 atomic percent of copper in tin;

The MEMS wafer 200 is hermetically bonded using one of the solders discussed above to the Lid wafer 100 as shown in FIG. 37*c* to create the hermetically sealed cavity around the mechanical part of the MEMS device.

Embodiments of the present invention thus offer a new technique for producing hermetically sealed micro-cavities between the "Lid wafer" and the "MEMS wafer" to control the micro-environment around the MEMS devices. This new technique and new metallurgy are compatible with the low-temperature requirements of all known wafer-level packages for MEMS devices and the recent lead-free requirements of the electronics industry. This new technique and new metallurgy also prevent the whiskers problem typically associated with lead-free tin-based solders. Additionally, this new technique and the new metallurgy are CMOS and CCD compatible so they allow advanced MEMS to be fabricated over integrated circuits in a single manufacturing line, without the contamination problems associated with gold or with the sodium atoms typically used in alternate wafer-level packaging techniques.

We claim:

1. A method of making a wafer-level package for a plurality of MEMS devices, wherein a sealed and hermetic micro-cavity is formed over each MEMS device, comprising:

preparing a MEMS wafer with a first bonding structure;
preparing a lid wafer with a second bonding structure; and
bonding said lid wafer to said MEMS wafer through said first and second bonding structures to create said wafer level package, and
wherein said lid wafer and said MEMS wafer are substantially free of at least one component selected from the group consisting of alkali metals and chlorine;
wherein said first and second bonding structures comprise respective anti-oxidation layers that are bonded together by an intervening solder layer between said respective anti-oxidation layers;

wherein said anti-oxidation layers comprise a noble metal selected from the group consisting of platinum, rhodium and ruthenium;

wherein said first bonding structure comprises a first seed layer on a MEMS device, a first structural underlayer over said first seed layer, and a first said anti-oxidation layer over said first structural underlayer; and wherein said second bonding structure comprises a second seed layer, a second structural underlayer over said second seed layer, a second said anti-oxidation over said second structural underlayer, and wherein said solder layer is provided on one of said anti-oxidation layers.

2. A method as claimed in claim 1, wherein each said seed layer is selected from the group consisting of: a doped silicon layer and a metal layer with a bulk resistivity lower than 100 mohm.cm.

3. A method as claimed in claim 1, wherein each said seed layer is a metal layer selected from the group consisting of: titanium and compounds thereof, tungsten and compounds thereof copper, aluminum and an aluminum alloy.

4. A method as claimed in claim 1, wherein wherein each said structural under-layer is deposited using a substantially alkali-free and chlorine-free electroless plating chemistry employing electroless nickel, and wherein said electroless nickel is obtained according to the equation:

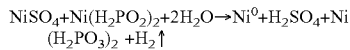

5. A method as claimed in claim 1, wherein each said structural under-layer is deposited using a substantially alkali-free and chlorine-free electroless plating chemistry employing electroless nickel, and;

wherein said electroless nickel is obtained according to the equation:

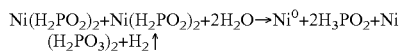

6. A method of making a wafer-level package for a plurality of MEMS devices, wherein a sealed and hermetic micro-cavity is formed over each MEMS device, comprising:

preparing a MEMS wafer with a first bonding structure;
preparing a lid wafer with a second bonding structure; and
bonding said lid wafer to said MEMS wafer through said first and second bonding structures to create said wafer level package, and wherein said lid wafer and said MEMS wafer are substantially free of at least one component selected from the group consisting of alkali metals and chlorine;

wherein said first and second bonding structures comprise respective anti-oxidation layers that are bonded together by an intervening solder layer;

wherein said anti-oxidation layers comprise a noble metal selected from the group consisting of platinum, rhodium and ruthenium; and wherein the noble metal layer is deposited using a process selected from the group consisting of: immersion and electroless plating.

7. A method as claimed in claim 6, wherein a sulfate of the noble metal is used as a source thereof.

8. A method as claimed in claim 6, wherein a plating solution is employed that contains a component selected from the group consisting of: ethylenediaminetetraacetic acid (LDTA) and dimethylamine borane.

9. A method as claimed in claim 6, wherein a plating solution is employed that contains ammonium hydroxide as a buffer to control the pH of the solution.

10. A method as claimed in claim 1, wherein said solder layer is a lead-free metal solder deposited by electroless plating in an alkali-free, hydrazine-free, dimethylamine borane-free, and chlorine-free electroless plating solution.

11. A method as claimed in claim 10, wherein the lead-free metal solder is gallium.

12. A method as claimed in claim 10, wherein the lead-free solder is indium.

13. A method as claimed in claim 12, wherein said indium is electroless plated using a source of indium selected from the group consisting of: indium sulfate, indium nitride, and indium methanesulfonate.

14. A method as claimed in claim 12, wherein said indium is electroless plated using an agent selected from the group consisting of: sulfuric acid, ethylenediaminetetraacetic acid, nitrilotriacetic acid, tartaric acid, and citric acid to stabilize.

15. A method as claimed in claim 12, wherein said indium is electroless plated using thiourea.

16. A method as claimed in claim 10, wherein the lead-free metal solder is tin.

17. A method as claimed in claim 16, wherein said tin is electroless plated using stannous sulfate as a source of the tin.

18. A method as claimed in claim 16, wherein said tin is electroless plated using an agent selected from the group consisting of: sulfUric acid, fluoroboric acid, phosphoric acid, an organic sulfonic acid, methane sulfonic acid, to stabilize the pH.

19. A method as claimed in claim 16, wherein said tin is electroless plated using an operator-safe complexing agent selected from the group consisting of: tartaric acid, citric acid, ethylenediaminetetraacetic acid, thiourea, and triethanol amine.

20. A method as claimed in claim 10, wherein the lead-free metal solder is selected from the group consisting of: gallium-indium binary metal solder, a gallium-tin binary metal solder, gallium-bismuth binary metal solder, gallium-zinc binary metal solder, an indium-gallium binary metal solder, an indium-tin binary metal solder, an indium-bismuth binary metal solder, an indium-zinc binary metal solder, an indium-silver binary metal solder, a tin-gallium binary metal solder, a tin-indium binary metal solder, a tin-bismuth binary metal solder, a tin-zinc binary metal solder, a tin-magnesium binary metal solder, a tin-silver binary metal solder, and a tin-copper binary metal solder.

21. A method as claimed in claim 20, wherein said lead-free metal solder is electroless plated.

22. A method of making a wafer-level package for a plurality of MEMS devices, wherein a sealed and hermetic micro-cavity is formed over each MEMS device, comprising:

preparing a MEMS wafer with a first bonding structure;
preparing a lid wafer with a second bonding structure; and
bonding said lid wafer to said MEMS wafer through said first and second bonding structures to create said wafer level package, and wherein said lid wafer and said MEMS wafer are substantially free of at least one component selected from the group consisting of alkali metals and chlorine;

wherein each of said first and second bonding structures includes a structural under-layer; and wherein each said structural under-layer is deposited using a substantially alkali-free and chlorine-free electroless plating chemistry employing electroless nickel, and wherein said electroless nickel is obtained according to an equation selected from the group consisting of:

$$NiSO_4 + Ni(H_2PO_2)_2 + 2H_2O \rightarrow Ni^0 + H_2SO_4 + Ni(H_2PO_3)_2 + H_2\uparrow;$$

and $$Ni(H_2PO_2)_2 + Ni(H_2PO_2)_2 + 2H_2O \rightarrow Ni^0 + 2H_3PO_2 + Ni(H_2PO_3)_2 + H_2\uparrow$$

* * * * *